(12) United States Patent
Matsuzaki et al.

(10) Patent No.: US 8,674,419 B2
(45) Date of Patent: *Mar. 18, 2014

(54) METHOD OF FORMING A CMOS STRUCTURE HAVING GATE INSULATION FILMS OF DIFFERENT THICKNESSES

(75) Inventors: Nozomu Matsuzaki, Kokubunji (JP);
Hiroyuki Mizuno, Kokubunji (JP);
Masashi Horiguchi, Kawasaki (JP)

(73) Assignee: Renesas Electronics Corporation, Kanagawa (JP)

( * ) Notice: Subject to any disclaimer, the term of this patent is extended or adjusted under 35 U.S.C. 154(b) by 540 days.

This patent is subject to a terminal disclaimer.

(21) Appl. No.: 12/838,598

(22) Filed: Jul. 19, 2010

(65) Prior Publication Data
US 2011/0012180 A1 Jan. 20, 2011

Related U.S. Application Data

(60) Continuation of application No. 12/153,385, filed on May 19, 2008, now Pat. No. 7,781,814, which is a continuation of application No. 11/118,951, filed on May 2, 2005, now Pat. No. 7,427,791, which is a continuation of application No. 10/263,705, filed on Oct. 4, 2002, now abandoned, which is a continuation of application No. 09/852,793, filed on May 11, 2001, now Pat. No. 6,500,715, which is a division of application No. 09/155,801, filed as application No. PCT/JP97/01191 on Apr. 8, 1997, now Pat. No. 6,307,236.

(30) Foreign Application Priority Data

Apr. 8, 1996 (JP) ........................................ 8-085124

(51) Int. Cl.
*H01L 29/72* (2006.01)

(52) U.S. Cl.
USPC ........... 257/295; 257/392; 257/402; 257/406; 257/410

(58) Field of Classification Search
USPC .......................... 257/295, 392, 402, 406, 410
See application file for complete search history.

(56) References Cited

U.S. PATENT DOCUMENTS

| 4,952,825 | A | 8/1990 | Yoshida |
| 5,164,803 | A | 11/1992 | Ozaki et al. |

(Continued)

FOREIGN PATENT DOCUMENTS

| JP | 61-168954 | 7/1986 |
| JP | 2-140971 | 5/1990 |

(Continued)

OTHER PUBLICATIONS

M. Ono et al., "Sub-50 nm Gate Length N-MOSFETS with 10 nm Phosphorus Source and Drain Junctions", IEEE Electron Device Meeting Technical Digest, 1993.

(Continued)

*Primary Examiner* — Edward Wojciechowicz
(74) *Attorney, Agent, or Firm* — Mattingly & Malur, PC

(57) ABSTRACT

The semiconductor integrated circuit device employs on the same silicon substrate a plurality of kinds of MOS transistors with different magnitudes of tunnel current flowing either between the source and gate or between the drain and gate thereof. These MOS transistors include tunnel-current increased MOS transistors at least one of which is for use in constituting a main circuit of the device. The plurality of kinds of MOS transistors also include tunnel-current reduced or depleted MOS transistors at least one of which is for use with a control circuit. This control circuit is inserted between the main circuit and at least one of the two power supply units.

20 Claims, 44 Drawing Sheets

(56) References Cited

U.S. PATENT DOCUMENTS

| | | |
|---|---|---|
| 5,254,489 A | 10/1993 | Nakata |
| 5,270,944 A | 12/1993 | Kuroda et al. |
| 5,274,601 A | 12/1993 | Kawahara et al. |
| 5,408,144 A | 4/1995 | Sakata et al. |
| 5,430,313 A | 7/1995 | Kumagai et al. |
| 5,480,828 A | 1/1996 | Hsu et al. |
| 5,502,009 A | 3/1996 | Lin |
| 5,538,923 A | 7/1996 | Gardner et al. |
| 5,583,457 A | 12/1996 | Horiguchi et al. |
| 5,614,847 A | 3/1997 | Kawahara et al. |
| 5,827,747 A | 10/1998 | Wang et al. |
| 5,856,221 A | 1/1999 | Clementi et al. |
| 6,033,943 A | 3/2000 | Gardner |
| 6,207,509 B1 | 3/2001 | Inoue |
| 6,248,630 B1 | 6/2001 | Clementi et al. |
| 6,307,236 B1 * | 10/2001 | Matsuzaki et al. ............ 257/392 |
| 7,427,791 B2 | 9/2008 | Matsuzaki et al. |

FOREIGN PATENT DOCUMENTS

| | | |
|---|---|---|
| JP | 2-156675 | 6/1990 |
| JP | 2-271659 | 11/1990 |
| JP | 3-94464 | 4/1991 |
| JP | 3-153079 | 7/1991 |
| JP | 4-260364 | 9/1991 |
| JP | 4-85868 | 3/1992 |
| JP | 5-29551 A | 2/1993 |
| JP | 5-108562 | 4/1993 |
| JP | 6-196495 | 7/1994 |
| JP | 6-237164 A | 8/1994 |
| JP | 6-326593 A | 11/1994 |
| JP | 7-38417 | 2/1995 |

OTHER PUBLICATIONS

S. Sun et al., "Limitation of CMOS Supply-Voltage Scaling by MOSFET Threshold-Voltage Variation", IEEE 1994 Custom Integrated Circuits Conference, 1994, pp. 12.2.1-12.2.4.

Semiconductor World, Jul. 1995, pp. 80-94.

Wright, P.J. et al., "Thickness Limitations of SiO2 Gate Dielectrics for MOS ULSI", IEEE Transactions on Electron Devices, vol. 37, No. 8, Aug. 1990, pp. 1884-1892.

* cited by examiner

THIN GATE INSULATION FILM MOS TRANSISTOR AREA

THICK GATE INSULATION FILM MOS TRANSISTOR AREA

THIN AND THICK GATE INSULATION FILM TRANSISTORS AREA

METHOD OF FORMING A CMOS STRUCTURE HAVING GATE INSULATION FILMS OF DIFFERENT THICKNESSES

This is a continuation application of U.S. patent application Ser. No. 12/153,385, filed May 19, 2008 now U.S. Pat. No. 7,781,814, which is a continuation application of U.S. patent application Ser. No. 11/118,951, filed on May 2, 2005 (now U.S. Pat. No. 7,427,791); which is a continuation application of U.S. patent application Ser. No. 10/263,705, filed Oct. 4, 2002 (now abandoned); which is a continuation application of U.S. patent application Ser. No. 09/852,793, filed May 11, 2001 (now U.S. Pat. No. 6,500,715); which is a divisional application of U.S. patent application Ser. No. 09/155,801, filed Oct. 6, 1998 (now U.S. Pat. No. 6,307,236); which is a national stage entry of PCT/JP97/01191, filed Apr. 8, 1997, which claims priority from Japanese Application No. 8-085124, filed Apr. 8, 1996, the entire disclosures of which are incorporated herein by reference.

TECHNICAL FIELD

The present invention relates generally to semiconductor integrated circuit (IC) devices configured using metal oxide semiconductor (MOS) transistors, and more particularly to a semiconductor IC device which employs specific MOS transistors with a gate insulation film thin enough to permit flow of tunnel current therein and which is adaptable for use with low-power circuitry operable with low voltages of 2 volts or less.

BACKGROUND ART

One prior known semiconductor integrated circuit device employing highly miniaturized MOS transistors fabricated by microelectronics fabrication technology is disclosed, for example, in a paper entitled "Limitation of CMOS Supply-Voltage Scaling by MOSFET Threshold-Voltage Variation," 1994 Custom Integrated Circuit Conference (CICC), pp. 267-270. This paper also teaches the correlation of the transistor threshold value versus flow of leakage current during standby periods.

DISCLOSURE OF THE INVENTION

Currently available standard MOS transistors are typically designed to operate with a gate voltage of from 1.8 to 2.5 volts (so-called the "gate-to-source" voltage which is normally equivalent to the power supply voltage) while making use of a gate insulation film ranging from 5 to 6 nanometers (nm) in thickness. Generally, as the integration density of MOS transistors increases, the transistor size decreases, and the thickness of the gate insulation film decreases accordingly. The present inventors presently predict that MOS-IC devices of the next generation will require use of further miniaturized MOS transistors operable with a gate voltage of 2 volts or less while reducing the thickness of gate insulation film down at 4 nm or less.

Principally, it may be considered that the operation speed of MOS transistors remains inversely proportional to the gate insulation film thickness decreases—that is, as this thickness decreases, the MOS transistor speed increases. However, this does not come without accompanying a "trade-off" penalty: When the MOS gate insulation film becomes too thinner, a tunnel current begins flowing therethrough. This can result in an increase in leakage current (tunnel leakage current), such as a source-to-gate current or drain-to-gate current, which inherently does never take place in standard MOS transistors. Such increase in tunnel leakage current in turn leads to an increase in power dissipation of MOS transistors during standby periods thereof. In the description such dielectric films permitting tunnel current leakage will be referred to as the "thin" gate insulation film; likewise, certain MOS transistors employing such dielectric film will be called the "thin-film" MOS transistors hereinafter. On the contrary, standard MOS transistors in which such tunnel leakage current does not flow will be referred to as the "thick-film" MOS transistors. The "tunnel current leakage" problem has been also discussed in the monthly journal titled "Semiconductor World," July 1995 at pp. 80-94; unfortunately, this is completely silent about any ideas for solving this problem.

A mechanism of an increase in power dissipation during standby due to tunnel current will be discussed more precisely in conjunction with the graphs shown in FIG. 10.

See FIG. 10(a). This is a graphical representation showing experimental results concerning the drain voltage versus drain current characteristics of one thick-film MOS transistor. Plotting experimental data in this graph assumes that its gate oxide film measures approximately 6 nm in thickness. Since the oxide film employed herein is thick enough to render negligible the tunnel leakage current which can flow between the gate and source or between the gate and drain.

See FIG. 10(b), which presents the drain-voltage/drain-current characteristics of a thin-film MOS transistor. This assumes that a gate oxide film used is 3.5 nm in thickness. Since the oxide film is thin, leakage current can flow between the gate and source and also between the gate and drain thereof. Accordingly, even where the drain voltage is at zero volts, a non-negligible amount of current flows between the gate and drain when its gate voltage is not zero volts. In the graph of FIG. 10(b), a drain current of 0.5 milliamperes (mA) or more or less was derived when the gate voltage is 2.0 volts.

In complementary MOS (CMOS) circuitry configured using thick-film MOS transistors, since gate leakage current remains negligible in amount, any constant current (DC current) will by no means flow insofar as leakage current is absent between the source and drain. On the contrary, with CMOS circuitry employing thin-film MOS transistors, gate leakage current does flow so that constant current (DC current) flows accordingly. This means that some power dissipation arises even where the circuitry is inoperative.

See FIG. 11, which shows the relation of the thickness of gate insulation film versus gate leakage current. Even when the gate voltage is at 2 to 3 volts or around it, if the gate insulation film is 6 nm or greater in thickness, then any resultant tunnel current remains harmless in practical applications. On the other hand, it may be seen by those skilled in the art that even if the gate voltage is potentially decreased to range from 2 to 1.5 volts which may be lower than ever, the leakage current will no longer remain negligible in magnitude once after the thickness of gate insulation film is reduced at approximately 3 nm. Presumably, if the gate voltage is 2 volts or more or less, then the boundary exists at a 4-nm range of gate insulation film thickness or around it. According to the teachings of the Semiconductor World document, it has been pointed out that the tunnel effect in quantum theory takes place with a 5 nm gate insulation film point being as the criticality. This document also teaches that a remarkable tunnel current can occur not only when the gate insulation film is as thin as 1.5 nm but also when it falls within a range of from 3 to 3.5 nm. As can be seen from the graph of FIG. 11, while the gate voltage tends to be lowered for reduction in power dissipation; even in this situation, when the gate insulation film becomes thinner to decrease from 2.9 to 2.0 nm in thickness, large leakage current begins flowing even upon application of a gate voltage of 1 volt or below. Additionally, it is currently presumed that a minimal thickness of gate insulation films capable of retaining the nature of silicon oxide is about 10 angstroms.

Another approach is known which suppresses a subthreshold source-to-drain leakage current by potentially raising the threshold value of MOS transistors. However, even with use of such approach, it stays impossible in principle to reduce standby power dissipation due to the flow of source-to-gate tunnel current.

While the gate leakage current (tunnel current) might be under control by increasing the thickness of gate insulation films to reduce standby power dissipation involved, this does not come without accompanying a penalty: As discussed supra, if such MOS transistors are employed for circuitry then operation speed decreases making it impossible or at least greatly difficult to attain any desired performance.

It is therefore an object of the present invention to provide a semiconductor integrated circuit device capable of reducing standby power dissipation without having to degrading circuit operation speed.

In order to attain the foregoing object, the invention provides a low-power/high-performance semiconductor integrated circuit device by selective use of different kinds of MOS transistors including thick-film MOS transistors and thin-film MOS transistors, wherein the former is negligible in flow of tunnel leakage current whereas the latter is capable of operating at high speeds, while accompanying the tunnel current leakage problem.

In accordance with the principles of the invention, there is provided a semiconductor integrated circuit device including on the same substrate a plurality of kinds of MOS transistors different in magnitude of a leakage current flowing either between the source and gate or between the drain and gate. The semiconductor integrated circuit device is configured to have main circuitry constituted from at least one MOS transistor of the plurality of kinds of MOS transistors being greater in leakage current, and control circuitry inserted between the main circuitry and at least one of two power supplies and comprised of at least one MOS transistor less in leakage current.

It should be noted that intended high-speed characteristics may be successfully accomplished by designing the MOS transistors such that the gate insulation film measures 3.5 nm or less in thickness: Also, rendering it thinner at 3.0 nm and further thinner at 2.0 rim or less may enable the operation speed to further increase. However, as the operation speed increases, tunnel leakage current will likewise increase in magnitude. In view of this, it may be desirable that the MOS transistors of reduced leakage current be specifically employed for interruption or interception of a standby voltage(s) as applied to the thin-film MOS transistors; Intended advantages may be sufficiently attained whenever the power-supply intercept MOS transistors measure 5.0 nm or greater in thickness; if extra high speed requirements are not required when reduction to practice, it may be permissible for them to measure 10.0 nm or greater.

These MOS transistors may be structured to offer any desired characteristics by suitably designing the thickness of gate insulation film or changing either carrier density or distribution at the gate electrode, drain and/or source electrode. Generally, increasing the gate insulation film thickness requires that the gate length increase in value accordingly.

In regard to the microelectronics fabrication process, the characteristic control or adjustment may become accurate when the two kinds of—namely, thin-film and thick-film—MOS transistors are manufactured such that the gate insulation films and gate electrodes thereof are formed at separate process steps. Especially, it will be recommendable that thick gate insulation films be formed prior to formation of thin gate insulation films because of the fact that the latter is difficult than the former in control of process parameters during fabrication. In addition, in cases where such two kinds of MOS transistors are formed separately, forming a protective dielectric film on resultant gate electrode layer may enable suppression or elimination of occurrence of gate-electrode degradation otherwise occurring due to execution of succeeding processes.

It should be noted here that in the semiconductor integrated circuit device in accordance with the instant invention, the thin-film MOS transistors are preferably selected for use with specific circuitry parts under strict requirements of high-speed characteristics, including, but not limited to, information signal processor circuits, such as logic function units (logic circuits such as NAND gates, NOR gates and the like) as built in central-processing units (CPUs), latch circuits, high-speed memory cell arrays, and others.

In contrast, switch elements for interruption-of power supply during standby periods of these thin-film MOS transistors maybe configured using thick-film MOS transistors, which function as the power-supply intersect transistors. Also, any circuitry parts without high-speed requirements as well as circuits under strict requirements of high voltage withstand characteristics may be configured by such thick-film MOS transistors. Memory cells with no high-speed requirements such as static random access memory (SRAM), dynamic RAM (DRAM), mask read-only memory (mask ROM) are one example. Protective circuitry as inserted for prevention of gate-insulation film-dielectric breakdown is another example. Preferably, those of the thick-film MOS transistors which are to be applied with high voltages come with a specifically designed source/drain structure—that is, electric field relaxation structure including, but not limited to, a lightly-doped drain (LDD) structure.

It should be also noted that in cases where the semiconductor integrated circuit device of the invention is arranged as an IC chip, it will be recommendable that a level converter circuit for potential level conversion of electrical signals be built therein in order to "absorb" any possible differences in potential level between incoming signals to the chip and outgoing ones from it. When this is done, it is desirable in view of reliability that thick-film MOS transistors be employed in certain circuit part for receiving high potential external signals whereas thin-film MOS transistors be in remaining circuit part for handling relatively low potential internal or "in-chip" signals.

The memory cells configured using thick-film MOS transistors may functionally include at least one of register files, cash memories, translation look-aside buffers (TLBs), and DRAM cells; if this is the case, it is preferable that the memory cells are arranged to store therein data during standby periods. The invention however should not be limited exclusively thereto and may alternatively be modified such that these include first kinds of memory cells of high access rate and second kind of ones lower in access rate than the former, wherein the MOS transistors constituting the first memory cells are greater in leakage current than those forming the second memory cells.

It should further be noted that upon interruption of the power supply of the thin-film MOS transistors by the power supply intercept transistor(s), it is possible by providing a level hold circuit—this may be configured using thin-film MOS transistors for retaining or holding the last potential level of an output Of logic circuit operatively associated therewith—to eliminate any adverse influence or affection by power supply intercept of the thin-film MOS transistors. Preferably, such level hold circuit may be formed of one or more thick-film MOS transistors less in leakage current magnitude.

The thin-film MOS transistors as employed in accordance with the principles of the invention may advantageously serve to reduce power dissipation significantly by interrupting or "intercepting" power feed during standby periods in light of the fact that leakage current can increase in magnitude even where these thin-film MOS transistors are designed to operate with extra low gate voltage below 2 volts, such as 0.8 volts or 1.2 volts or therearound, by way of example.

Preferably, that the leakage current-increased MOS transistors and leakage current-decreased ones are potentially driven by use of different gate voltages therefor. Practically, the leakage current-increased MOS transistors are to be driven upon application of certain voltage between the gate and source of each one, which voltage is lower than that being applied to the leakage current decreased MOS transistors.

In accordance with one aspect of the invention, a semiconductor integrated circuit device is provided which includes first and second MOS transistors as formed on the same silicon chip substrate. A respective one of the first MOS transistors has an insulative film of 4-nm thick or less as laid between the source and drain thereof or between its drain and gate; a corresponding insulative film of each second MOS transistor measures more than 4 nm in thickness.

In accordance with another aspect of the invention, a semiconductor integrated circuit device includes first and second MOS transistors as formed on the same silicon chip substrate. A respective one of the first MOS transistors has an insulative film of 4-nm thick or less as laid between the source and drain thereof or between its drain and gate; each second MOS transistor has an insulative film between the source and gate or between the drain and gate thereof, which film is greater in thickness than the first MOS transistors. The second MOS transistors are specifically adaptable for use in controlling flow of source-to-gate current or drain-to-gate current of the first MOS transistors.

In accordance with still another aspect of the invention, a semiconductor integrated circuit device includes first and second MOS transistors as formed on the same silicon chip substrate. A respective one of the first MOS transistors has an insulative film of 4-nm thick or less as laid between the source and drain or between the drain and gate thereof. The second MOS transistors are adaptable for use in interrupting transfer of associated power supply voltages toward the first MOS transistors. The semiconductor integrated circuit device further includes a level hold circuit for holding the last potential level of an output signal of each first MOS transistor during interruption of power supply.

In accordance with yet another aspect of the invention, a semiconductor integrated circuit device includes first and second MOS transistors as formed on the same silicon chip substrate. The first MOS transistors are inherently greater in magnitude of leakage current flowing between the source and gate or between the drain and gate thereof whereas the second MOS transistors remain less in leakage current than the first ones. The integrated circuit device is specifically arranged so that the second MOS transistors are driven by a predefined high voltage which is higher than that being applied to the first MOS transistors.

In accordance with a further aspect of the invention, a semiconductor integrated circuit device responsive to receipt of an input signal having a specified amplitude voltage Vcc2 is arranged to include a level converter circuit for generating and issuing an in-chip signal by potentially reducing the amplitude voltage of an input signal, wherein leakage current occurrable between the gate and source or between the gate and drain of a MOS transistor accepting the in-chip signal is greater than that in another MOS transistor receiving the input signal.

When practicing the invention by applying it to integrated circuit devices such as those for use with microcomputers, the semiconductor integrated circuit device comes with an arithmetic processor unit and a data storage unit as configured using MOS transistors, which circuit may include at least one of the mask ROM, SRAM, and DRAM. The MOS transistors constituting one or more logic circuits in the arithmetic processor has a gate insulation film which is less in thickness than those forming memory cells of the storage unit.

In accordance with a still further aspect of the invention, a semiconductor integrated circuit device includes on the same silicon substrate a—plurality of kinds of MOS transistors including first MOS transistors and second MOS transistors different from each other in magnitude of tunnel current flowing' between the source and gate or between the drain and gate. The semiconductor integrated circuit device also includes a main circuit configured using at least one tunnel current increased MOS transistor. The device further includes a controller circuit as operatively coupled to the main circuit and also to at least one of two power supply units. This controller employs at least one of tunnel current decreased (or absent) MOS-transistor. The controller is responsive to a control signal fed thereto for providing control so as to selectively permit and inhibit the flow of a current between the source and gate or between the drain and gate of the tunnel current increased MOS transistor for use in constituting the main circuit.

One characterizing feature of the semiconductor integrated circuit device lies in that the plurality of kinds of MOS transistors include MOS transistors different in gate insulation film thickness, or alternatively MOS transistors of the same conductivity type having gate electrodes doped with the same kind of impurity to different degrees of dopant concentration.

Another feature is that where MOS transistors different in gate insulation film thickness are employed, those MOS transistors each having a thick gate insulation film is provided with a side wall spacer which is adhered coating the side wall of its gate electrode. The spacer may be made of a chosen insulative material chemically insensitive to hydrofluoric acid. This side wall spacer may be for use as a mask for fabrication of the LDD structure, supra.

BEST MODE EMBODYING THE INVENTION

Figure 1A:
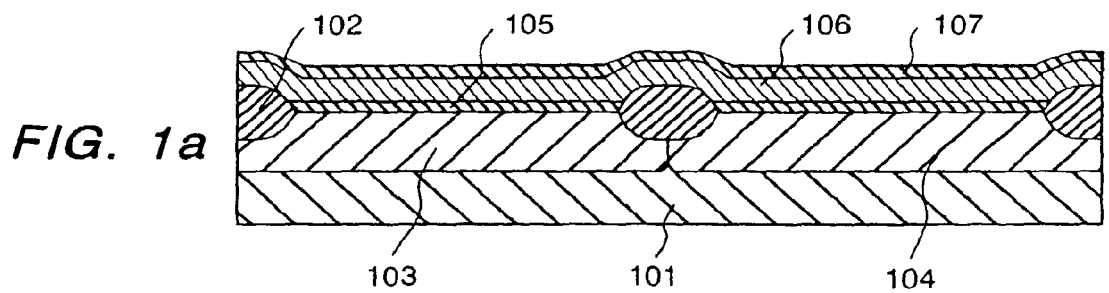
FIG. 1 is a diagram showing, in cross-section, some of major steps of the manufacture of a semiconductor integrated circuit device in accordance with one preferred embodiment of the present invention.
Figure 1B:
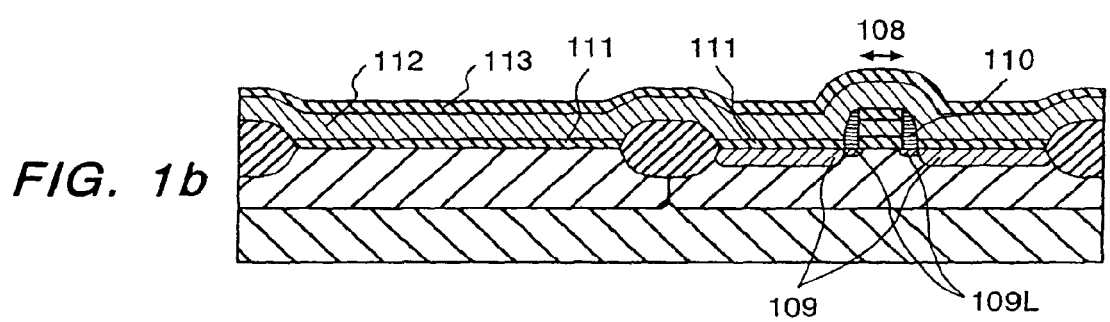
Figure 1C:
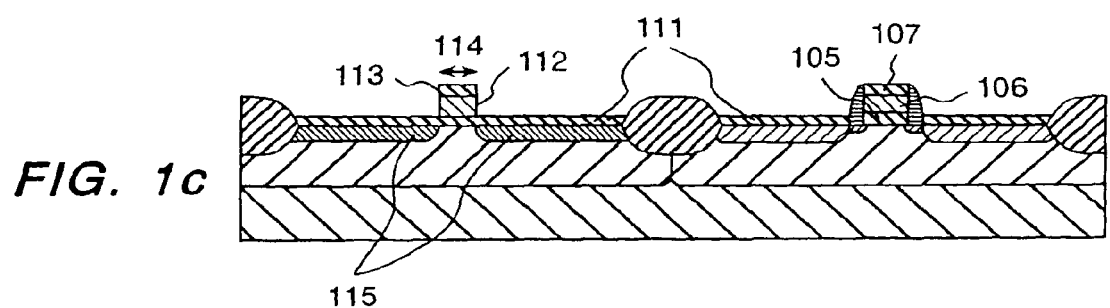
Figure 1D:
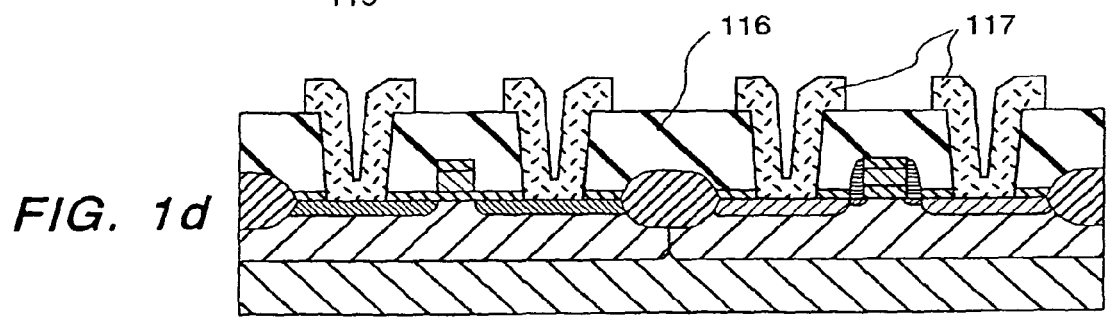
Figure 2A:
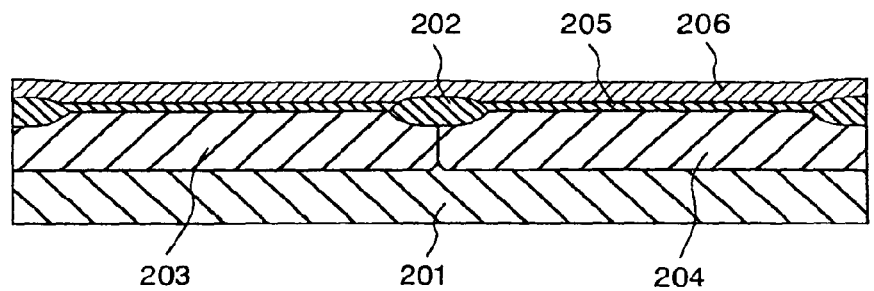
FIG. 2 illustrates in cross-section some of the major steps of the manufacture of a semiconductor integrated circuit device in accordance with another embodiment of the invention.
Figure 2B:
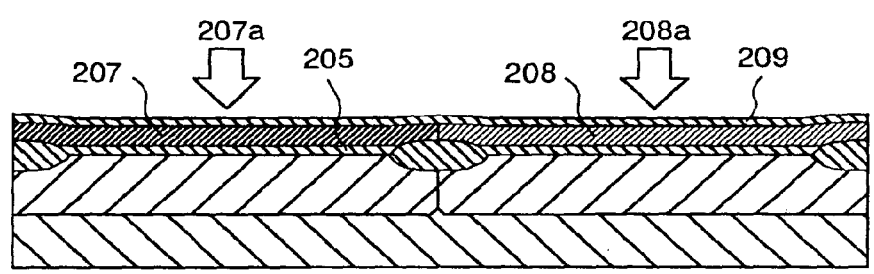
Figure 2C:
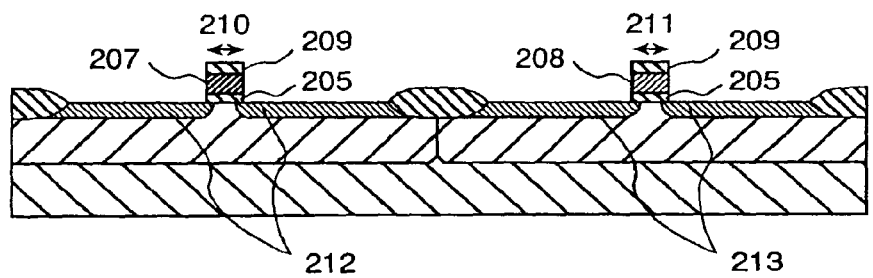
Figure 2D:
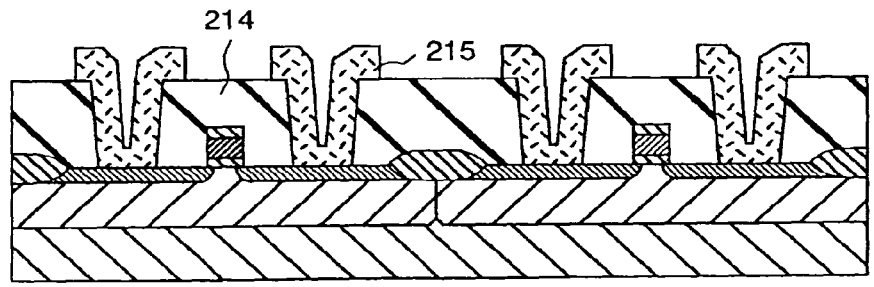

Several embodiments practicing the invention as will be described hereafter are principally featured in that tunnel current occurrable MOS transistors permitting the flow of a tunnel current either between the drain and gate of each transistor or between the drain and gate thereof are provided on a single chip substrate along with tunnel current absent (or much decreased) MOS transistors Substantially preventing such tunnel current flow between them, and that the tunnel current available MOS transistors are adaptable for use in constituting a main circuit with logic gates whereas the tunnel current depleted (or much reduced) MOS transistors are in forming a controller circuit which controls selection of operation modes between transferring power supply voltages toward the main circuit and interrupting or "intercepting" the power supply thereto. With such an arrangement, it is possible to reduce power dissipation during standby periods of the MOS transistors constituting the main circuit without having to affecting the circuit operation speed thereof.

Several semiconductor integrated circuit devices embodying the principles of the instant invention will be described with reference to the accompanying figures of the drawing.

FIGS. 1 and 2 are each a pictorial representation for explanation of a manufacturing procedure of a semiconductor integrated circuit device that satisfies the 0.18-micrometer rules in highly advanced microelectronics fabrication technology, which device has both tunnel current available MOS transistors and tunnel current depleted (or much reduced) MOS transistors on the same silicon substrate. FIG. 1 shows a first embodiment of the invention employing thickness different insulative films whereas FIG. 2 illustrates a second embodiment utilizing the impurity concentration differing scheme. Note that the minimal fabrication dimension as used herein is normally definable by the resulting gate length of MOS transistors; it is hardly affected by overlaps of a gate electrode with its associated source and drain. On the other hand, another manufacturing method is known for intentionally shortening a gate length resulting from evaluation of electrical properties rather than the physical fabrication dimension regarding the gate length. If this is the case, the gate length based on such electrical properties—say, the "effective gate length"—becomes a key parameter. In FIGS. 1 and 2, one form is shown which has no essential differences between the physical gate length reflecting fabrication dimensions and the effective gate length; however, it should be noted that the present invention may also remain applicable to the manufacturing method for intentionally shortening the effective gate length so that it is less than the physical gate length.

The first embodiment will now be explained in conjunction with FIG. 1. This embodiment is drawn to the manufacture of an exemplary IC device attaining copresence of a tunnel current available MOS transistor and a tunnel current depleted MOS transistor without any substantive flow of tunnel current therein on the same chip substrate by differing the thickness of gate insulation film between them. While this embodiment is intended to fabricate such two different kinds of gate insulation films by use of both p-type MOS transistors and n-type MOS transistors, cross-sections presented in FIG. 1 assume use of p-type MOS transistors only for purposes of reducing complexity of illustration. An n-type silicon substrate 101 is prepared having a top surface on which an element isolation dielectric region 102 made of a thermal oxide film of 300 nm thick is formed. In the substrate surface, n-type impurity-doped layers 103 and 104 are formed. These impurity layers 103, 104 are $1\times10^{17}$ atoms $cm^{-3}$ in average concentration and are inherently necessary for element isolation from n-type MOS transistors (both thin-film and thick-film ones) copresent within a single chip. Any one of currently available impurity doping techniques may be employed to form n-type layers 103, 104.

After an impurity is doped by ion implantation techniques causing each MOS transistor to exhibit a predefined threshold value, a silicon thermal oxide film 105 is formed to a predetermined thickness, for example, 10 nm, on the entire surface of the substrate structure; subsequently, a polycrystalline silicon or "polysilicon" layer 106 is deposited overlying the thermal oxide film 105. Layer 106 is then entirely doped with an impurity of a chosen material such as phosphorus causing resultant polysilicon layer 106 to be adjusted at $1\times10^{20}$ cm$^{-3}$ in average concentration of phosphorus impurity. The phosphorus ion introduction may be performed by ion implantation to $2\times10^{15}$ atoms cm$^{-2}$ at acceleration energy of 40 kiloelectronvolts (KeV); alternatively, the same may be attained by use of a boron-doped polysilicon or using predeposition techniques. Subsequently, a silicon oxide film is deposited as a gate electrode protective film 107 to a thickness of 50 rim on the entire surface of resultant structure at step (a) of FIG. 1. The function of this layer 107 will be described later.

The thermal oxide film 105, polysilicon layer 206 and gate electrode protective layer 107 are then subject to patterning using photolithography and dry etching techniques forming an insulated "island" 108 on substrate 101. This island 108 measures 0.18 micrometers (μm) or greater in gate length fabricated. Island 108 will constitute the gate electrode of a thick-film MOS transistor. Then, boron fluoride is introduced into the substrate structure, with the gate electrode being as a mask therefor, to a concentration of $2\times10^{14}$ cm$^{-2}$ at acceleration voltage of 20 KeV, forming spaced-apart p-type layers 109L in impurity region 104 of substrate 101. These layers 109L may act as the source and drain regions of the lightly-doped drain (LDD) type. This is done because a voltage being applied to such thick-film MOS transistor is not potentially low enough to ensure that it remains free from any possible adverse influence of hot carriers which in turn serves to degrade the characteristics thereof. To retain reliability, it is recommendable to employ electric field relaxation structures including the LDD structure. Introduction of p-type impurity makes use of ion implantation techniques with average concentration being set at $5\times10^{18}$ cm$^{-3}$ although this value is adjustable in conformity with the characteristics of MOS transistors required.

Dielectric films 110 are formed on the opposite side walls of the gate electrode 108. These side wall spacers 110 may be made of silicon nitride of 100 nm thick. Spacers 110 will act as protectors which protect the silicon oxide film beneath gate electrode 108 (this oxide film functions as the gate insulation film of gate 108) against unwanted erosion due to physical and/or chemical reaction of hydrofluoric acid solution as employed during a later washing process of the overall surface of resultant substrate structure. Then, boron fluoride is introduced to a. concentration of approximately $2\times10^{15}$ cm$^{-2}$ at acceleration voltage of 20 KeV, thereby forming spaced-apart p-type layers 109 in region 104 of substrate 101, which layers will act as the source and drain regions with respect to the gate electrode 108 of the LDD MOS transistor. The doping of a p-type impurity is done by ion implantation techniques to an average concentration of $5\times10^{19}$ cm$^{-3}$ or more or less.

The resulting gate insulation film of the MOS transistor with gate electrode 108 thus formed may measure 10 nm in thickness by way of example. In cases where MOS transistors are designed satisfying the 0.18-μm gate length criteria shown herein, the power supply voltage falls within a range of from 1.8 to 1.5 volts. An electric field as created within the gate oxide film will be 1.8 megavolts per square centimeter (MVcm$^{-2}$) or less. In this situation a tunnel current is very limited in magnitude to be as low as $10^{-20}$ amperes per square centimeter (Acm$^{-2}$), which will by no means affect or disturb execution of normal MOS transistor operations. Any increase in power dissipation will no longer occur due to gate leakage current. This p-type MOS transistor hardly permits flow of a tunnel current since its gate insulation film is thick (10 nm in this embodiment). This p-type MOS transistor is for use in transferring (during ON periods) a packet of charge carriers from the power supply to a main circuit and in interrupting (during OFF periods) the same.

Next, after formation of the side wall spacers 110, resultant substrate structure is washed using hydrofluoric acid solution. The structure is then subject to anodization selectively forming a thermal oxide film 111 to a thickness of 3.5 nm on the entire exposed top surface of the silicon substrate 101 other than certain surface areas in which element-separation films 102 and gate electrode 108 are formed. Then, a polysilicon layer 112 is deposited on the entire surface of resultant structure to a thickness of 180 nm, which layer 112 overlies element-separators 102 and gate 108 at step (b) of FIG. 1. Polysilicon layer 112 is entirely doped with a phosphorus ions to a concentration of $5\times10^{15}$ cm$^{-2}$ at acceleration voltage of 25 KeV allowing layer 112 to be of n-type conductivity with the average impurity concentration of $1\times10^{20}$ cm$^{-3}$. Thereafter a silicon oxide film 113 is formed thereon to a thickness of 100 nm, by way of example, at step (b). Film 112 is as a protective film of gate 108.

Then, the thermal oxide film 111, polysilicon 112 and silicon oxide 113 are subject to patterning by photolithography and dry etching techniques thus providing another insulated gate electrode 114 of the 0.18 μm gate length. This gate electrode 114 constitutes the gate of a thin-film MOS transistor. Note here that unless otherwise the protective film 107 is formed at the previous step were absent, the gate electrode 106 of the thick-film MOS transistor would have result in being removed away during formation of oxide 113. In this sense the layer 107 is inevitable. Just after the gate formation step, boron fluoride is introduced by ion implantation into layer 103 to a concentration of $2\times10^{15}$ cm$^{-2}$ at 20 KeV providing p-type source and drain regions 115 at step (c) of FIG. 1. Since a voltage applicable to thin-film MOS transistors will be extremely lower in potential, the aforementioned "hot-carrier influence" problem encountered with thick-film MOS transistors is not so serious avoiding the need of employing any electric field relaxation structure, such as the LDD structure discussed supra.

Subsequently, further ion implantation is done for suppression of the short-channel effect although this step is not depicted in the drawing for elimination of complexity of illustration only. After formation of an interlayer dielectric film 116 overlying the entire surface of resultant structure, a patterned first metal chip-lead layer 117 is formed on film 116 at a first level over the surface of substrate 101, providing electrical interconnection with respective terminal pads of MOS transistors at step (d). When necessary, second and third pattered chip-lead layers may be additionally formed at second and third levels over substrate 101. A resultant MOS transistor with gate 114 will be called the "thin-film" MOS transistor because of the fact that this comes with a reduced-thickness or "thin" gate insulation film beneath gate 114. This thin-film MOS transistor is such that even upon application of low power supply voltage of 1.8 volts, an electric field created within its gate insulation film will be 5. $MVcm^{-2}$ or greater while simultaneously causing it to measure $1\times10^{-6}$ $Acm^{-2}$ in magnitude of gate leakage current. As can be readily seen by those skilled in the art, this thin-film MOS transistor was manufactured satisfying the currently available submicron-scaling rules in the semiconductor microfabrication technology; in this regard, this MOS transistor remains adaptable for use with the on-chip main circuitry. Additionally, it is desirable that the thick-film MOS transistors be greater than thin-film MOS transistors in gate length—i.e. a minimal gate length of those transistors on substrate 101. The threshold value of thick-film MOS transistors is required to be greater than that of thin-film ones; on the contrary, it has been well known that if the gate oxide film thickness alone is simply increased then resultant threshold value will decrease accordingly. The lower the threshold value, the easier the MOS transistors fail to completely turn off; in such situation a current might attempt to flow in thin-film transistors disenabling accomplishment of intended advantages of the present invention. This phenomenon may be avoided by increasing the source-to-drain distance—namely, by enlarging the gate length. This method well matches the MOS transistor design scheme which has been generally called the "scaling rule." More specifically, employing those MOS transistors without the scaling treatment will be sufficient; however, this does not come without certain "pain" in that resultant chip surface area increases.

Another approach is available to increase the impurity concentration of the channel section of thick-film MOS transistors. One advantage of this approach is that on-chip MOS transistors are capable of decreasing in occupation area on the substrate due to the capability of shortening the gate length as compared with other approaches; a disadvantage is that the MOS transistor withstand voltage rating and reliability are reduced due to an increase of the internal electric field within each MOS transistor beyond an expected level as defined by the scaling rules.

FIG. 50 is one modification employing n-type MOS transistors only. This assumes that these transistors are fabricated on the same substrate along with those transistors discussed previously in connection with FIG. 1 in a way as will be set forth below.

An n-type silicon substrate 5101 is prepared with an element isolation dielectric region 5102 made of a thermal oxide film of 300 rim thick being formed thereon, and n-type impurity-doped layers 5103, 5104 as formed in the surface thereof. These layers 5103, 5104 are doped with an impurity to an average concentration of approximately $1\times10^{17}$ $cm^{-3}$, and are inherently necessary for element isolation with respect to "associate" p-type MOS transistors on the same chip substrate (including both thin-film and thick-film ones). The impurity introduction may be performed using any one of currently available techniques.

After ion implantation is done causing respective MOS transistors to exhibit desired threshold values, a silicon anodization (thermal oxide) film 5105 is formed on resultant substrate structure to a predetermined thickness of 10 am, for example. Then, a polysilicon layer 5106 is deposited thereon to a thickness of 120 nm. The resulting structure is next doped with boron ions at its entire exposed surface causing the boron's average concentration to be adjusted to $1\times10^{20}$ $cm^{-3}$ or above within a polysilicon layer 5106 overlying thermal oxide 5105. The boron ions may be doped by ion implantation to a concentration of $2\times10^{15}$ $cm^{-2}$ at acceleration voltage of 40 KeV; alternatively, the same may be attained by use of previously boron-doped polysilicon. Subsequently, a silicon oxide film 5107 is formed as a gate electrode protection film on the entire top surface of the structure to a thickness of 50 nm at step (a).

The thermal oxide film 5105, polysilicon layer 5106 and gate electrode protection layer 5107 are patterned by photolithography and dry-etching techniques forming on substrate 5101a patterned gate electrode "island" 5108, which has its fabrication gate length of 0.18 μm in view of the short-channel effect. This island 5108 will constitute the gate electrode of a thick-film MOS transistor. With this gate electrode as a mask, arsenic is introduced to a concentration of $2\times10^{14}$ $cm^{-2}$ at 35 KeV to thereby provide spaced-apart n-type impurity-doped layers 5109L in one n-type layer 5104 of substrate 5101.

These layers 5109L act as the source and drain regions of the LDD type with respect to gate electrode 5108. The reason for this is as has been discussed in conjunction with FIG. 1. Introduction of n-type impurity herein may be done by ion implantation techniques with the average concentration being set at $5\times10^{18}$ $cm^{-3}$ although such value remain freely adjustable in conformity with exact MOS transistor characteristics required.

Then, dielectric spacer layers 5110 are formed on the opposite side walls of the gate electrode 5108. These side-wall spacers 5110 may be made of silicon nitride of 100-nm thick. Each side-wall spacer 5110 will function as a protective film that protects the silicon oxide film beneath the gate electrode 108—namely, a silicon oxide film underlying gate 108 and serving as the gate insulation film of gate 5108—against any possible erosion due to physical and/or chemical reaction of washing solvent employed, such as hydrofluoric acid, during washing of the entire surface of resultant structure. The structure is doped with phosphorus impurity to a concentration of $2\times10^{15}$ $cm^{-2}$ at 40 KeV forming a pair of n-type regions 5109 in layer 5104 in such a manner that each is in contact with a corresponding one of region 5109L. These act as the source and drain with respect to gate electrode 5108. The n-type impurity may be done by ion implantation techniques to average concentration of $5\times10^{19}$ $cm^{-3}$ In this embodiment the gate insulation film of resultant MOS transistor having the gate electrode 5108 measures 10, by way of example.

After formation of the side-wall spacers 5110, the overall top Surface of the structure is washed using hydrofluoric acid. A thermal oxide film 5111 is formed to a thickness of 3.5 nm on selected area of the exposed surface of the silicon substrate 5101 excluding certain areas of formation of the element separation dielectric region 5102 and gate electrode 5108. Next, a polysilicon 5112 of 180-nm thick is entirely deposited thereon. The resulting structure is doped with boron ions to $5\times10^{15}$ cm$^{-2}$ at acceleration voltage of 40 KeV, thereby providing an n-type polysilicon of $1\times10^{20}$ cm$^{-3}$ in average impurity concentration. A silicon oxide 5113 is then formed directly overlying n-type polysilicon 5112 at step (b)

The thermal oxide film 5111, polysilicon 5112 and silicon oxide 5113 are then patterned using photolithography and dry-etching techniques, defining another island 5114 of 0.18-μm gate length. Island 5114 constitutes the gate electrode of a thin-film MOS transistor on substrate 5101. Resultant structure is next doped by ion implantation with an impurity of arsenic to $2\times10^{15}$ cm$^{-2}$ at 40 KeV providing in layer 5103 spaced-apart n-type regions as the source and drain of the thin-film MOS transistor at step (c).

Subsequently, further ion implantation is carried out for suppression of the short-channel effect although such step is not shown in the drawing for purposes of illustration only. After an interlayer dielectric film 5116 is formed on the entire surface of resultant structure, a first patterned metal chip-lead layer 5117 is formed thereon for electrical interconnection with respective transistor terminal pads at step (d). If necessary second and third chip-lead layers may be formed insulatively overlaying chip-lead metal pattern 5117.

A second embodiment is shown in FIG. 2, which is directed to one exemplary manufacturing method of an IC chip having on the same substrate different kinds of MOS transistors: tunnel-current available MOS transistors permitting flow of a tunnel current therein resulting from a change of impurity concentration at gate and source portions, and tunnel-current absent MOS transistors permitting no substantive tunnel current flow therein. In this embodiment the cross-sections of p-type MOS transistors alone are illustrated in FIG. 2 in the same manner as that in the previous embodiment (FIG. 1). An n-type silicon substrate 201 is prepared on which an element isolation dielectric region 202, an n-type impurity layer 203 and an n-type impurity layer 204 are formed as shown. Here, the n-type layer 203 is devoted to provision of a well region of transistors for use in constituting a main circuit whereas n-type layer 204 is for a well of power-supply intercept MOS transistors which selectively permit power feed to the main circuit during first periods and to interrupt it during second periods. Layers 203, 204 are $1\times10^{17}$ cm$^{-3}$ or more or less in average impurity concentration. Impurity doping into layers 203, 204 may be attained by any presently available techniques. After certain impurity is doped by ion implantation into selected surface regions of transistor formation for adjustment of threshold values thereof, a thermal oxide film 205 is formed on the entire exposed top surface of substrate 210 to a thickness of 3.5 nm. Then, a polysilicon layer 206 of 180 nm thick is entirely deposited thereon at step (a).

A dose of phosphorus ions 207a is introduced into certain substrate surface areas assigned to formation of standard transistors exhibiting normal circuit operations, to a concentration of $2\times10^{15}$ cm$^{-2}$ at acceleration voltage of 25 KeV providing an n-type polysilicon 207 above layer 203 of substrate 201.

Likewise, a dose of phosphorus ions 208a is doped into different substrate surface areas exclusively assigned to formation of power-supply intercept transistors exhibiting normal circuit operations, to a concentration of $2\times10^{15}$ cm$^{-2}$ at 35 KeV forming an n-type polysilicon 208 at step (b).

Due to a difference between process parameter settings at the phosphorus ion introduction steps, resultant gate electrode of a power-supply intercept transistor is "variable" in impurity concentration depending upon locations in such a manner that the impurity concentration increases (up to approx. $1\times10^{20}$ cm$^{-3}$) only at its upper sections while causing its lower section near the underlying gate insulation film to locally decrease in impurity concentration (approx. $1\times10^{17}$ cm$^{-3}$). Accordingly, the gate-electrode lower section decreases in carrier density allowing the transistor to resemble in electrical characteristic those MOS transistors with a thick gate insulation film. This may in turn minimize flow of a tunnel current via the gate insulation film.

After implantation of phosphorus ions 207a, 208a, a silicon oxide film 209 of 100-nm thick is deposited on the entire surface of resultant substrate structure. Then, the thermal oxide film 205, n-type polysilicon 208 and silicon oxide film 209 are subject to patterning process by photolithography and dry-etching techniques forming gate electrode islands 210, 211 at step (c). Gate electrode 210 is 0.18 μm in gate length. Since gate electrode 211 is seen to have a thick gate insulation film, its gate length is set at 0.18 μm or greater in view of the short-channel effect. After formation of gates 210, 211, a pair of spaced-apart p-type regions 212 are formed in layer 203 in such a way that these are essentially self-aligned with the overlying gate 210 thus providing the source and drain regions of a MOS transistor. Similarly, spaced-apart p-type regions 213 are formed, as the transistor source and drain, in the neighboring layer 204 to be self-aligned with its overlying gate 211 associated therewith at step (c). Ion implantation may be employed for introducing of p-type impurity such that boron fluoride is introduced to $2\times10^{15}$ cm$^{-2}$ at 20 KeV. In this embodiment also, extra ion implantation for suppression of the short-channel effect is not specifically shown in the drawing for depiction complexity elimination purposes only. After formation of an interlayer dielectric film 214, a first metal chip-lead pattern 215 is formed thereon for electrical interconnection with respective transistor terminal pads. As necessary, second and third chip-lead patterns may be added insulatively overlying metal pattern 214. Note here that in the manufacture of this embodiment shown in FIG. 2, resultant IC structure may not offer the capability of completely eliminating the flow of tunnel current through oxide films; in this respect, it might be admitted that this embodiment remains less than the previous embodiment of FIG. 1 in reduction of power dissipation. Instead, a significant advantage unique to the FIG. 2 embodiment lies in the capability of reducing process complexity and manufacturing costs. This can be said because the tunnel-current flow differing between standard MOS transistors and power supply intercept MOS transistors is attained by merely adding ion doping or implantation process steps to the ordinary fabrication system procedure. Regarding after-manufacture reliability test procedure, the FIG. 1 embodiment is more advantageous than the FIG. 2 embodiment in that during test routines the former requires mere execution of measuring the gate insulation film thickness whereas the latter should require actual operations of resultant devices manufactured.

Figure 3A:
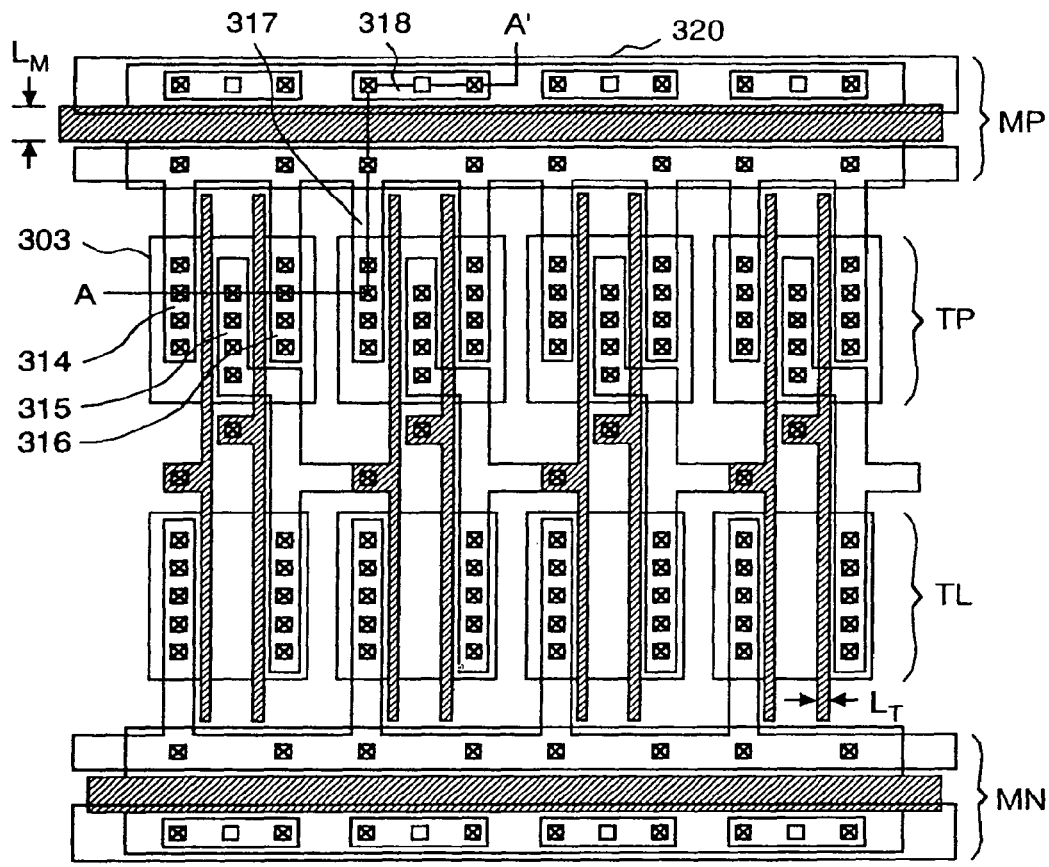
FIG. 3 is a plan view of a semiconductor integrated circuit device in accordance with another embodiment of the invention.
Figure 3B:
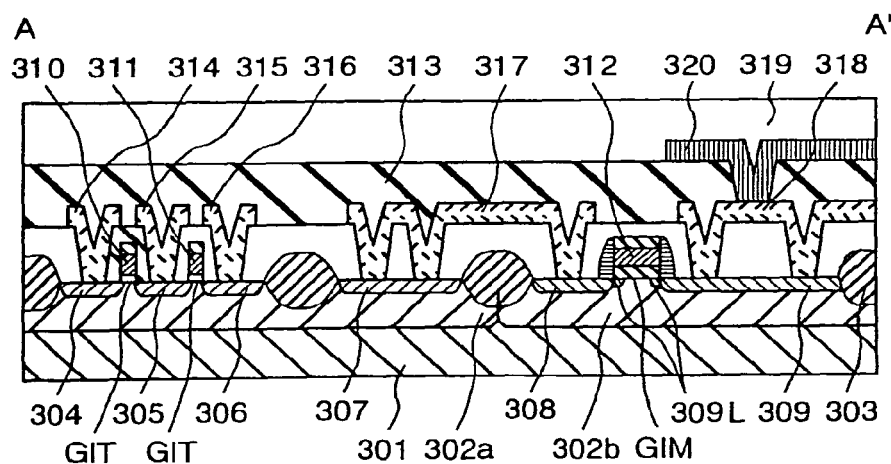
Figure 4:
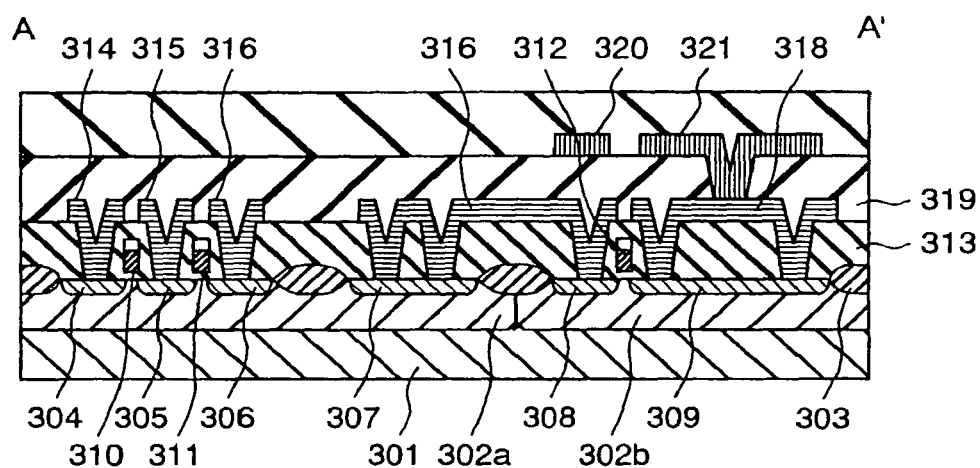
FIG. 4 depicts a cross-sectional view of the device as taken along line A-A' of FIG. 3.

A third embodiment will now be described with reference to FIGS. 3 and 4. FIGS. 3 and 4 are diagrams each showing one practical configuration of a semiconductor integrated circuit device embodying the invention, wherein FIG. 3 is a layout depiction of this embodiment whereas FIG. 4 is a cross-sectional view of the layout taken along line A-A' of FIG. 3. The IC device is an example having a series combination of two NAND gate circuits.

In FIG. 3, MOS transistors MP and MN are those for power supply intercept (for use with a control circuit), and measure 10 nm in gate insulation film thickness although these remain operable with 5-nm gate insulation film thickness. MOS transistors TP and PN are for use with a logic circuit (main circuit), and are 3.5 nm in gate insulation film thickness. In this way, this embodiment employs two kinds of MOS transistors with different gate insulation film thickness values. Here, the gate length LM of gate insulation film thickness-increased MOS transistors is greater than that of gate insulation film thickness-decreased MOS transistors. This is based on the fact that the need is arisen to set an appropriate gate length suitable for the gate insulation film as mentioned previously; if the gate length remains short when such dielectric film is thick, then subthreshold leakage can occur between the source and drain disenabling complete turn-on/off operations.

The internal structure of the semiconductor integrated circuit device of this embodiment will be explained with reference to FIG. 4. While this embodiment basically employs thin-film MOS transistors to attain high-speed operations, it is further provided with certain switches for intercepting power supply during standby periods of such thin-film MOS transistors in order to minimize power dissipation during standby. And, the switches include thick-film MOS transistors inherently less in flow of tunnel leakage current.

An n-type substrate 301 has therein a p-type well 302 and also has an element-separation region 303 on substrate 301. Spaced-apart regions 304 to 307 are the sources and drains of logic-circuit MOS transistors TP whereas regions 308 and 309 are the source and drain of a power-supply intercept MOS transistor MP. MOS transistors TP have insulated gate electrodes 310, 311; MOS transistor MP has its gate electrode 312. Reference character "GIT" designates the gate insulation film of each transistor TP, and "GIM" indicates that of transistor MP.

A first interlayer, dielectric film 313 overlying the gates 310-312 on substrate 301 has openings as contact holes through which the sources and drains as well as gate electrodes of respective transistors are electrically coupled by first lead layers 314, 315, 316 and 317. Lead layers 314, 316 are connected to the source regions of logic-circuit MOS transistors pMOSL whereas lead layer 315 is to the "common" drain region thereof. Lead 317 connects the source of one logic-circuit MOS transistor pMOSL to the drain of power-supply intercept MOS transistor pMOSV. Lead 318 is interconnected to the source of power-supply intercept MOS transistor pMOSV.

A second interlayer dielectric film 319 formed on the first interlayer dielectric film 318 has a contact hole for use in electrically connecting second lead layers 320, 321 to the first lead layer at a desired location thereon. Lead 320 shunts the drain of power-supply intercept MOS transistor pMOSV. Lead 321 acts as a first power supply line for shunt of the source of power-supply intercept MOS transistor pMOSV. Lead 321 is interconnected to first lead 318 via the contact hole of second interlayer dielectric film 319. With the above layout, interconnection between a logic circuit formed of logic-circuit MOS transistors pMOSL and nMOSL and the first power supply is controllable by the power-supply intercept MOS transistor pMOSV. Note here that although only the p-type power-supply intercept MOS transistors pMOSV are shown, it also remains permissible to connect n-type power supply intercept MOS transistors nMOSV each having a thick gate insulation film between logic-circuit MOS transistors nMOSL and a second power supply line. This configuration will be shown in several circuit diagrams (see FIG. 5 and FIGS. 6 through 9) to be later presented.

A fourth embodiment of the present invention will be explained with reference to FIG. 5, which is drawn to an inverter circuit of simplest configuration.

Figure 5:
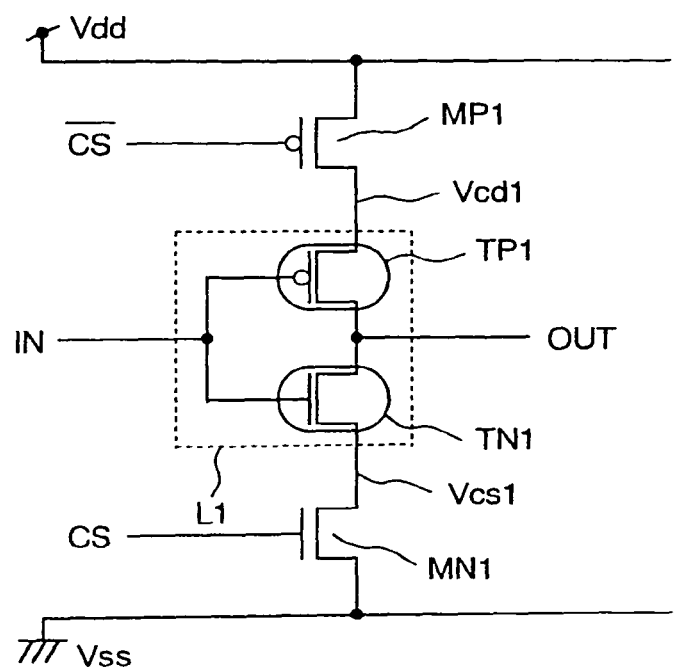
FIG. 5 is a circuit diagram showing an equivalent circuit of a semiconductor integrated circuit device embodying the invention.

In FIG. 5 the reference character "L1" indicates a CMOS inverter, "TP1" and "MP1" designate p-type MOS transistors, and "TN1" and "MN1" are n-type MOS transistors. (In this transistor circuit diagram and later presented ones of the present application, the small circle symbol "○" will be adhered to the gate terminal section of each p-type MOS transistor in the illustration.) MOS transistors TP1, TN1 correspond to those TP, TN of FIG. 1 respectively. The gate insulation films of MOS transistors TP1, TN1—are thinner than those of MOS transistors MP1, MN1. Hereinafter, certain transistors employing a thin gate insulation film like MOS transistors TP1, TN1 will be referred to as the "thin-film MOS transistors" or "thin-film transistors"; transistors using a thick gate insulation film like MOS transistors MP1, MN1 will be called the "thick-film MOS transistors" or "thick-film transistors." (In the transistor circuit diagrams of this application, the illustration of each thin-film MOS transistor comes with an ellipse surrounding it.) Attention should be taken to the fact that while most prior known thin-film transistors called the "TFTS" refer to those formed on a dielectric substrate by use of semiconductor thin-film fabrication techniques, the thin-film and thick-film transistors according to this invention are free from such limitative structure originated from the semiconductor-on-insulator (SOI) fabrication scheme; importantly, definition of these thin- and thick-film transistors of this invention is simply based on comparison of the gate insulation film thickness between them.

A thick-film MOS transistor MP1 is inserted between a first power supply Vdd and the CMOS inverter L1 whereas a thick-film MOS transistor MN1 is between a second power supply Vss and CMOS inverter L1. Where this circuitry is for use in processing signals (during normal operation periods), a control signal CS is at a logic High or "H" level. Upon receipt of this control signal, thick-film MOS transistors MP1, turn on causing first power supply Vdd and second power supply Vss to be coupled directly to CMOS inverter L1. Since this inverter L1 is formed of thick-film MOS transistors TP1, TN1, some leakage current (tunnel current) can flow between the gate and source as well as between the gate and drain thereof. This leakage current attempts to flow between the first and second power supplies Vdd, Vss via thick-film MOS transistors MP1, MN1 causing power dissipation to increase as a whole. When this circuitry is out of use, namely, during standby periods, the control signal CS potentially drops down at a logic Low or "L" level. When this is done, thick-film MOS transistors MP1, MN1 turn off forcing CMOS inverter L1 to be electrically disconnected or "wrapped" from first and second power supplies Vdd, Vss. The gate-to-source/gate-to-drain leakage current will no longer flow between first and second power supplies Vdd, Vss because thick-film MOS transistors MP1, MNl are rendered nonconductive. In this situation none of first and second power supply voltages Vdd, Vss are supplied to CMOS inverter L1 rendering it inoperative (its output OUT is in the high impedance state when signal CS is at "L" level) while eliminating an increase in power dissipation because of the fact that thick-film MOS transistors MP1, EN1 disenable flow of any leakage current. In this embodiment the thick-film MOS transistors measure 3.5 nm in gate insulation film whereas thin-film ones are 6.0 nm in gate insulation film; however, this invention should not be exclusively limited thereto since the "standby current leakage reduction" effect may be attainable insofar as some difference presents between them in gate insulation film thickness (in other words, whenever the tunnel leakage current of thick-film transistors remains less than that of thin-film ones). Additionally, circuitry generally called' the "clocked-inverter" is typically designed to operate in response to the control signal CS being fed as a clock input, its intended circuit operation will not be disturbed when transistors MP1, TP1 and transistors MN1, TN1 are interchanged in connection order as long as these are in a series connection. The embodiment circuitry is distinguishable in nature from prior known inverters in that the effectiveness is lost upon modification of the connection order of paired transistors corresponding to those MP1, TP1 as well as alteration of the connection order of transistors corresponding to those MNI, TNI of the embodiment.

Next, a fifth embodiment of the present invention will be explained with reference to FIGS. 6 and 7. This embodiment is three-stage CMOS inverter circuitry employing a series combination of three pairs of thin-film p-type MOS (PMOS) transistors TP1 to TP3 and thin-film n-type MOS (NMOS) transistors TN1-TN3.

In the drawings PMOS transistors MP1-MP3 and NMOS transistors KN1-MN3 are thick-film transistors.

Figure 6:
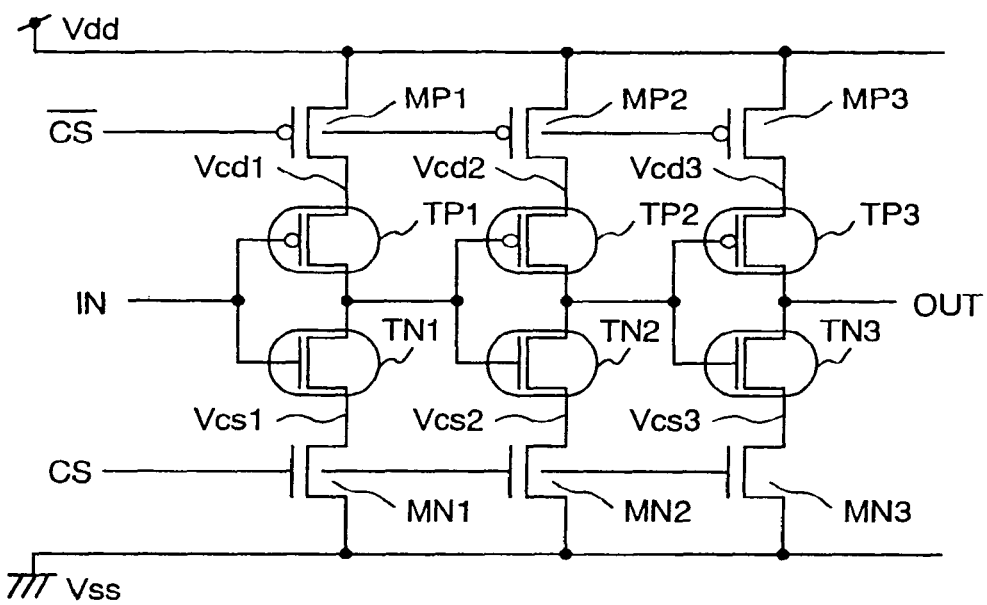
FIG. 6 shows a circuit configuration of another embodiment.

In FIG. 6 this circuitry includes thick-film MOS transistors which are inserted between the first power supply Vdd and respective power supply electrodes Vcd1-Vcd3 of three CMOS inverters and also between the second power supply Vss and power supply electrodes Vcs1-Vcs3 thereof. Causing the control signal CS applied upon the thick-film MOS transistors to potentially drop down at "L" level may decrease in magnitude the flow of gate-to-source/gate-to-drain currents of thin-film MOS transistors TP1-TP3 and TN1-TN3 reducing power dissipation.

Figure 7:
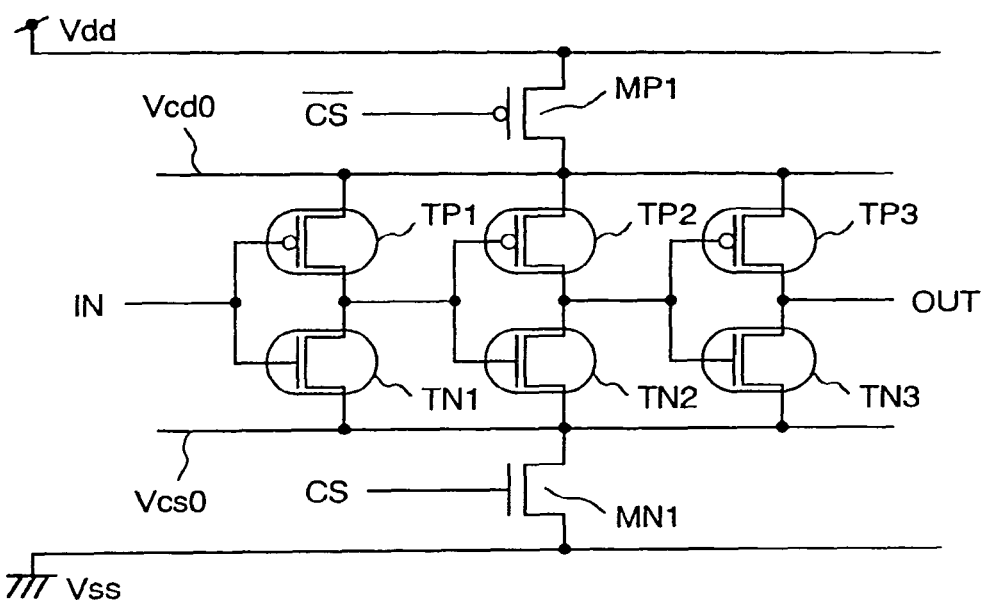
FIG. 7 shows a circuit configuration of a further embodiment.

In the embodiment shown in FIG. 7, the sources of thin-film MOS transistors constituting the three stages of inverters are coupled to "virtual" power supply lines VcdO, VcsO with thick-film MOS transistors connected between virtual power supply lines VcdO, VcsO and first and second power supply lines Vdd, Vss. With such an arrangement, similar advantages to those in the case of FIG. 6 may be also attained.

Comparing the circuit configurations of FIGS. 6 and 7 with each other, the FIG. 7 configuration will result in a decrease in occupation area on a chip substrate in most cases. It is required that the gate width of transistors MP1-MP3, MN1-MN3 be carefully determined to eliminate occurrence of a delay in time during operation of each inverter due to insertion of transistors MP1-MP3, MN1-MN3. In the case of FIG. 6, the gate width of transistors PM1, MN1 is determined to be identical or equivalent to that of transistors TP1, TN1, by way of example. In the case of FIG. 7, however, the gate width of transistors MP1, MN1 may be determined in view of the activation ratio of each inverter. More specifically, the gate width is determined by taking into account the maximum activation ratio of logic circuits (three stages of inverters in FIG. 7) connected to transistors MP1, MN1. In the example of FIG. 7, a single one of three inverters is rendered operative at a time; accordingly, the gate width of. transistors MP1, MN1 is designed at appropriate value insuring sufficient current supply to such single inverter. This would result in the gate width being the same as those of transistors MP1-MP3, MN1-MN3 of FIG. 6, rendering the circuitry of FIG. 7 smaller in area than the FIG. 6 circuitry.

A sixth embodiment of the invention will be described in connection with FIG. 8. This embodiment is similar to the fifth embodiment shown in FIG. 7 with a level holder circuit LH1 being added thereto enabling retainment of the potential level of an output OUT when the control signal CS potentially goes low rendering the inverter inoperative so that it is in the high impedance state. When control signal CS changes in potential from the "H" to "L" level, the last logic level is maintained. While this embodiment employs two latch circuits to make up the level holder LH1, any other configurations may alternatively be used insofar as a level holdable circuit employed is capable of holding the potential level of output OUT when control signal CS is at "L" without affecting its succeeding circuitry of the next stage responsive to receipt of output OUT.

This embodiment is under an assumption that the level holder LH1 is not required to exhibit high-speed operations; thus, thick-film MOS transistors are employed therefor to suppress current leakage. If high-speed requirement is applied then level holder LH1 may be constituted by thin-film MOS transistors; in such case; care should be paid to the circuit design in order to ensure that possible current leakage therein is not greater than that in the main inverter section.

Figure 8:
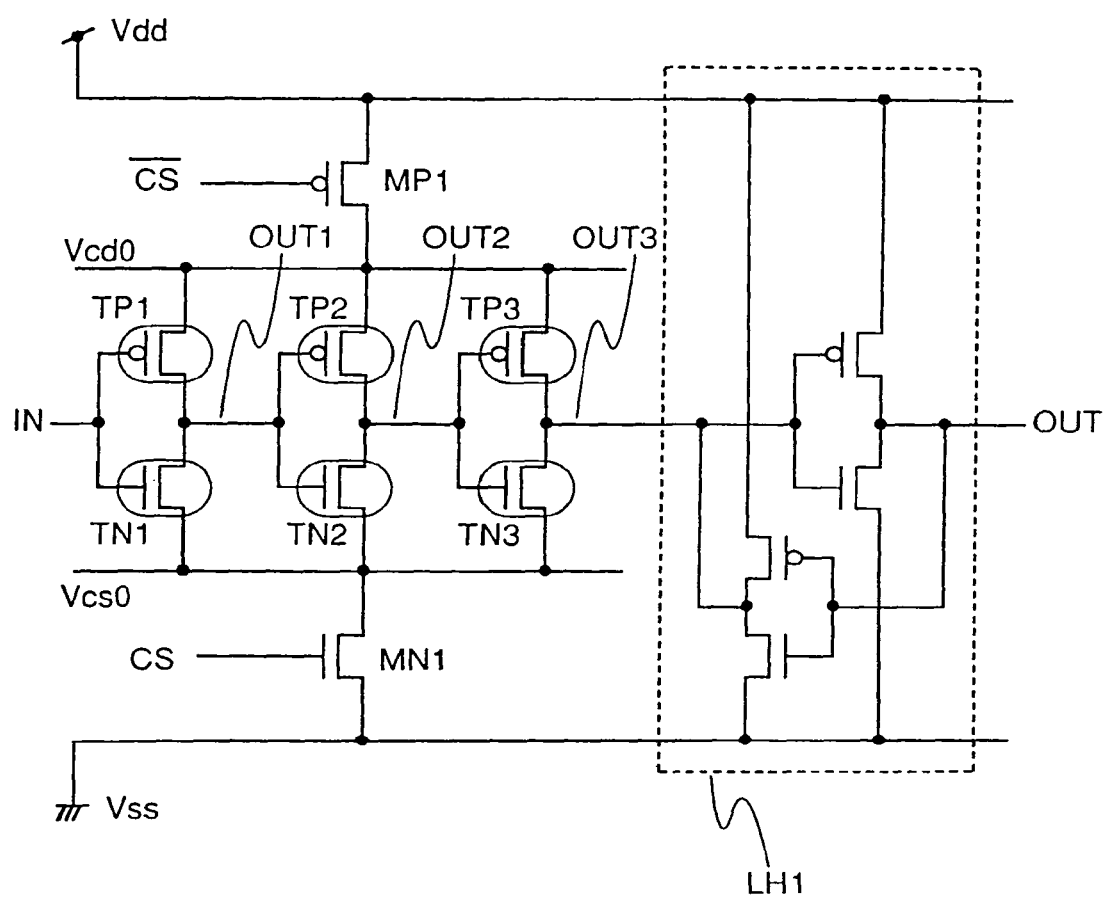
FIG. 8 shows a circuit configuration of a still further embodiment.

It should be noted that it is impermissible for the level holder to be unconditionally located anywhere in the circuitry; by way of example, any intended function would not be attainable if it were inserted at a "midway" inverter output OUT1 or OUT2 of the multi-stage CMOS inverter circuitry of FIG. 8 Thus, it is a must for level holder LH1 to be inserted at a selected position associated with a specific signal transmission line required to hold the logic level even when control signal CS is at "L" level—that is, at an output node OUT3 in FIG. 8.

Figure 9:
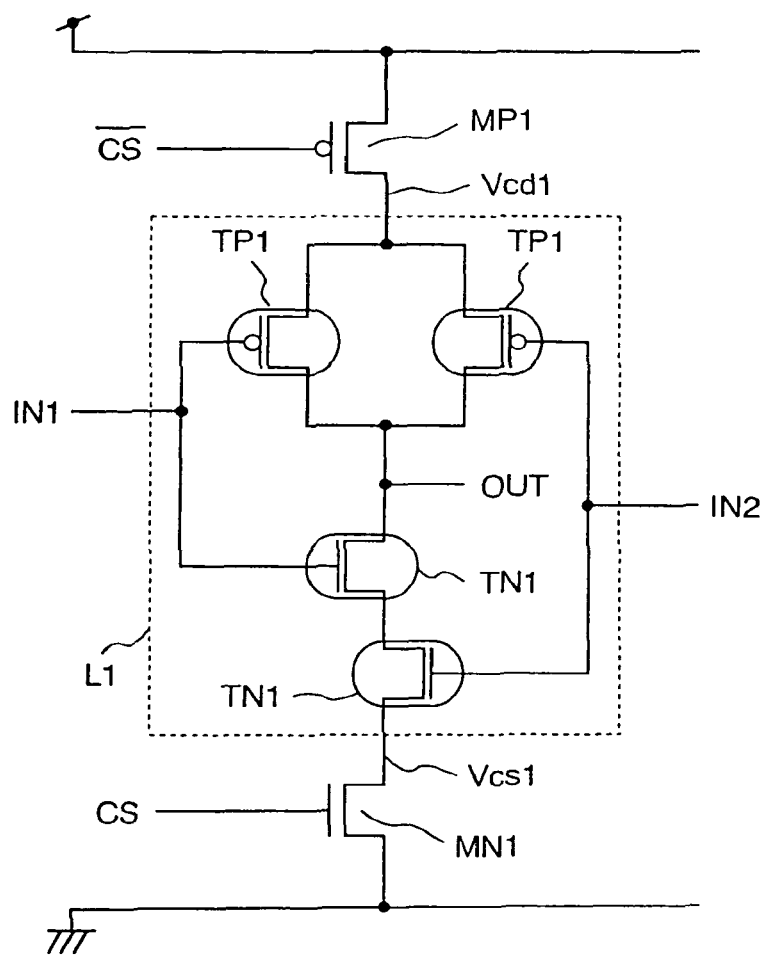
FIG. 9 shows a circuit configuration of yet another embodiment.
Figure 10A:
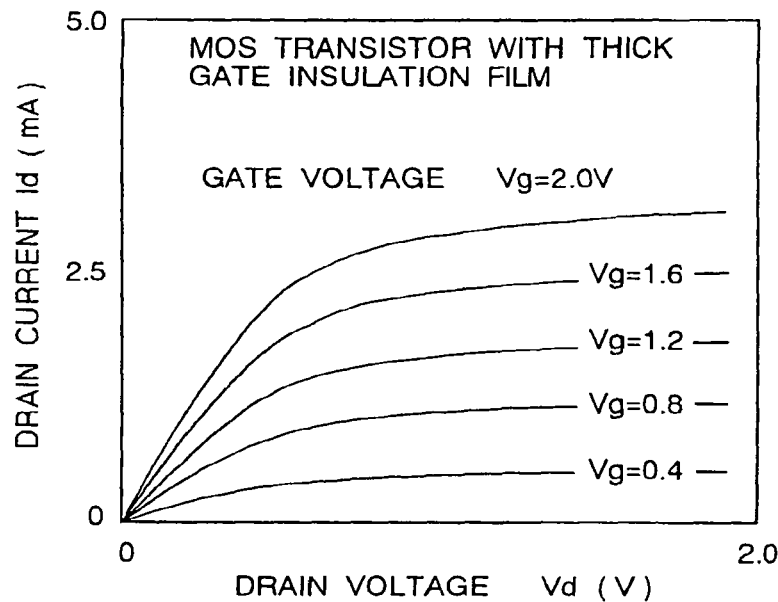
FIG. 10 presents graphs representative of typical current characteristics of one standard MOS transistor and of a tunneling MOS transistor permitting flow of tunnel current through its gate insulation film.
Figure 10B:
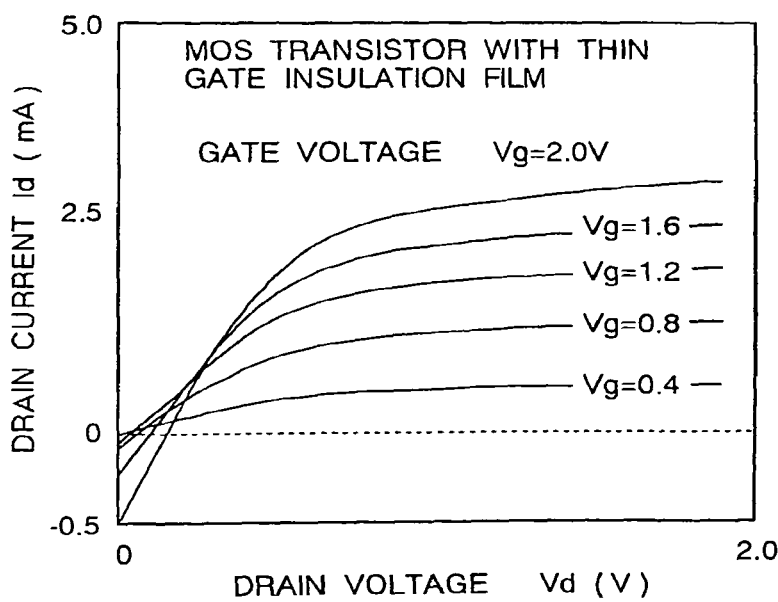
Figure 11:
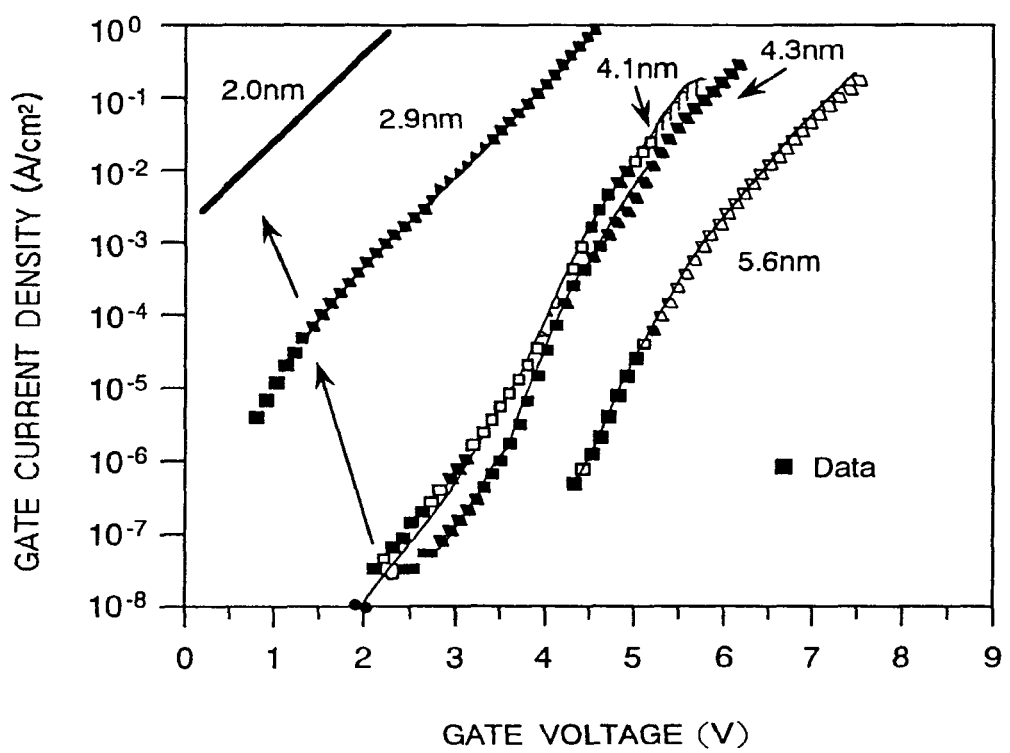
FIG. 11 is a graph representative of the relation of gate insulation film thickness and gate current density.

A seventh embodiment of the invention will now be explained by use of FIG. 9. While in FIG. 5 (fourth embodiment) and FIG. 8 (sixth embodiment) there are shown certain embodiments employing thin-film MOS transistors to form the "inverter," the principles of the invention may also be applied to other types of circuits with any functions insofar as these are constituted from thin-film MOS transistor's. One of such examples is shown in FIG. 9. FIG. 9 shows an integrated circuit with the inverter of FIG. 5 being replaced by a NAND gate having two inputs (IN1, IN2). With such an arrangement also, it is possible to prevent an increase in power dissipation in a manner similar to that of FIG. 5.

In the embodiments shown in FIGS. 5 to 9, the control circuit coupled to the control signal CS employs thick-film MOS transistors having thick-film oxide films; however, the present invention should not exclusively be limited thereto and may also employ other devices capable of controlling an amount of gate-to-source/gate-to-drain leakage current of thin-film MOS transistors in response to control signal CS. Use of MOS transistors greater in gate-electrode depletion ratio than those of the main circuit is one example. Using MOS transistors with a specific thin-film gate insulation film of decreased gate leakage is another example.

Further, as per the embodiments shown in FIGS. 5-9, the description is not specifically directed to how the substrate electrodes of MOS transistors are to be arranged; this is based on the fact that this invention is completed regardless of whether such connections are configured in practical use. For instance, it may be arranged so that the substrate electrodes of p-type MOS transistors are coupled to the first power supply Vdd whereas those of n-type MOS transistors are to the second power supply Vss. Alternatively, in the embodiment of FIG. 5, the substrate electrode of the thin-film MOS transistor TP1 may be coupled to the voltage Vcd1 whereas that of thin-film transistor TN1 is to Vcs1. In this case and ordinary or standard cell(s) of CMOS inverter with the substrate electrode being coupled to the power supply may be used without the need of any extra modifications.

The semiconductor integrated circuit device as manufactured by the fabrication schemes described in conjunction with FIGS. 1 and 2 is adaptable for use with any one of all the circuit configurations of FIGS. 5 through 9. Further, the embodiments of FIGS. 5-9 will offer more successful results if they employ circuitry inherently less in operation frequency. The term "frequency" as used herein refers to the ratio of operative or "active" periods to inoperative or "inactive" periods throughout operations thereof. One example is a word-decoder/driver circuit of memory circuitry. Typically, single-port memory circuitry comes with multiple word-decoder/driver circuits corresponding in number to word lines, only one of which is rendered active at a time while rendering inactive the remaining, increased number of word-decoder/driver circuits, which in turn results in an increase in power dissipation due to constant current flow if gate leakage is available. Even if this is the case, use of the aforesaid embodiment may enable power dissipation to decrease in such multiple inactive word-decoder/driver circuits.

FIGS. 12 to 19 show other examples of the thick-film MOS transistor insertion method for reducing current leakage during standby periods in circuitry including therein thin-film MOS transistors TP1-TP4 and TN1-TN4.

Figure 12:
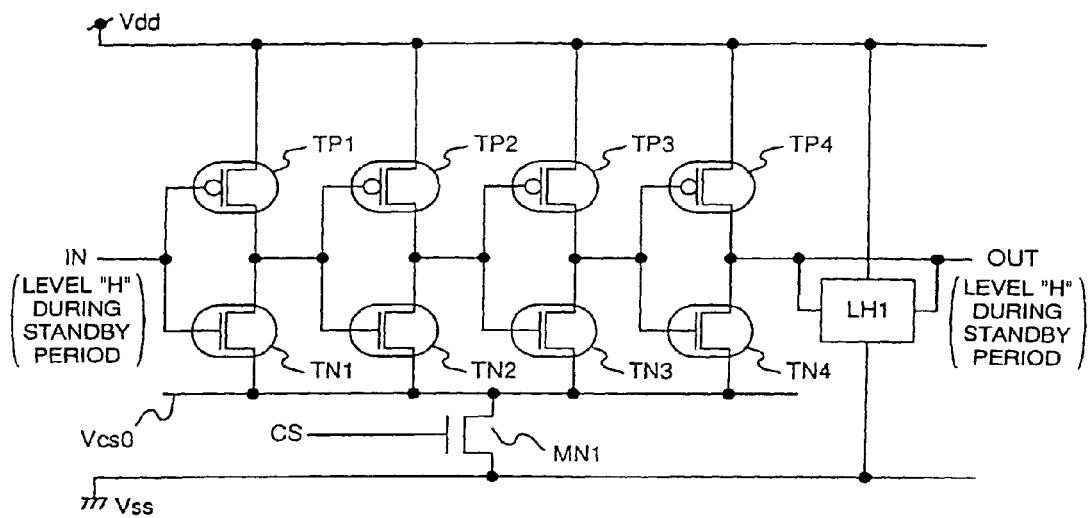
FIG. 12 is a circuit diagram showing a configuration of a further embodiment of the invention.
Figure 13:
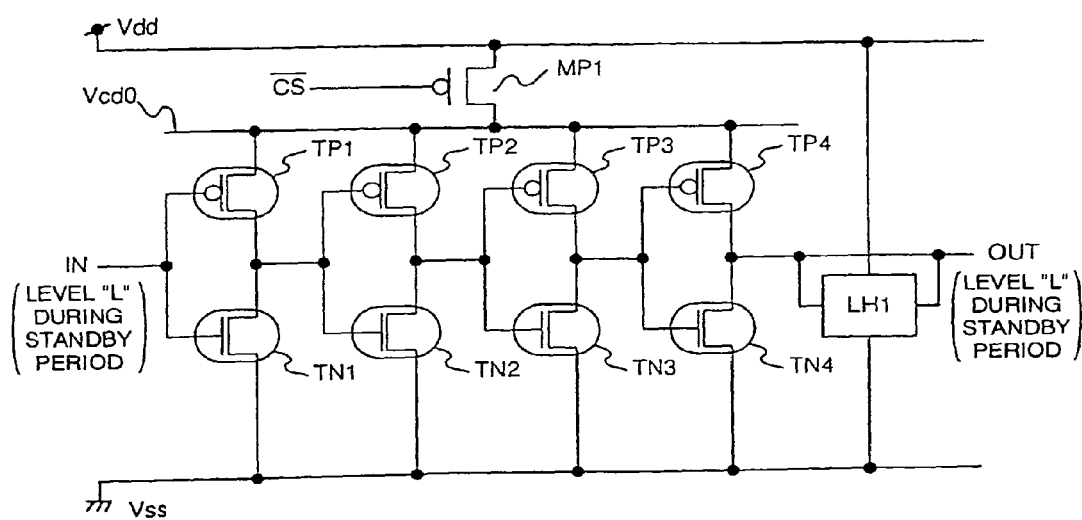
FIG. 13 shows a circuit configuration of a further Embodiment of the invention.

FIGS. 12 and 13 are examples in the case where an input IN and output OUT are identical in logic level to each other during standby periods.

As shown in FIG. 12, if it is known that IN=OUT="H" during standby periods then one switch MN1 may be inserted at a node on the Vss side only, with no switch used on the Vdd side.

As shown in FIG. 13, if it is true that IN=OUT="L" during standby then one switch MP1 may be inserted only at a node on the Vdd side with no switch used on the Vss side. Here, the level hold circuit LH1 is provided for holding the potential level of an output during standby.

FIGS. 14-17 are examples of the case where the input IN and output OUT are different in logic level from each other during standby periods.

Figure 14:
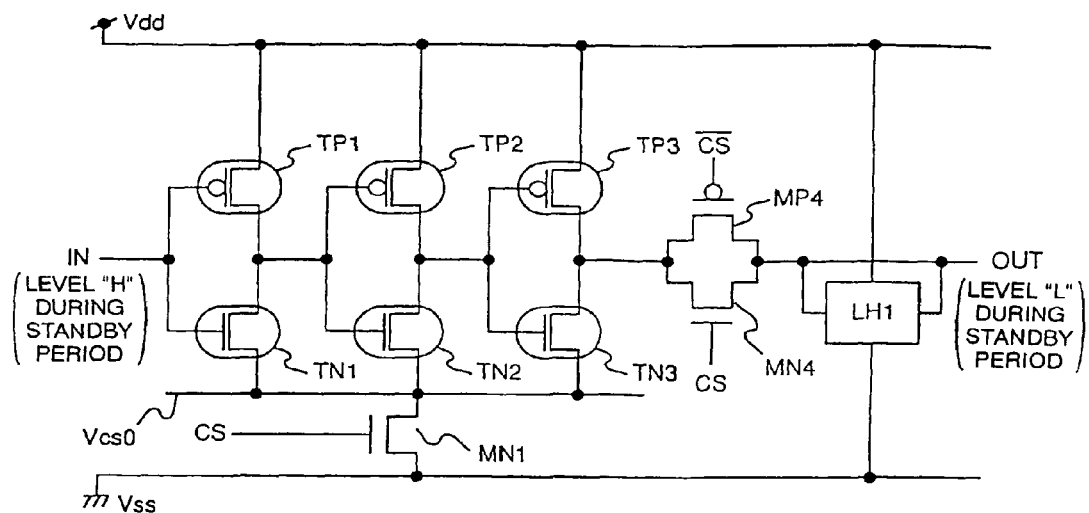
FIG. 14 is a circuit configuration of a further embodiment of the invention.

As shown in FIG. 14, where IN and OUT differ in logic level from each other during standby periods, a switch is inserted at either IN or OUT in order to eliminate occurrence of leakage between IN and OUT. If IN="H" and OUT="L" then insert it at Vss and OUT, or at Vdd and IN. In FIG. 14 a switch MN1 is at Vss while switches MP4, MN4 are at OUT.

Figure 15:
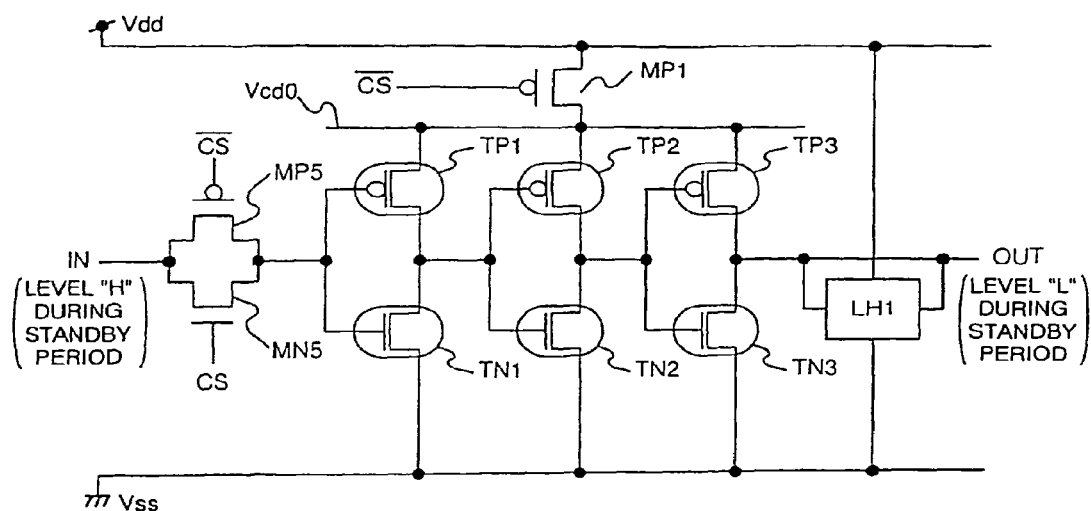
FIG. 15 is a circuit configuration of a further embodiment of the invention.

In FIG. 15 the switches are inserted not at Vss and OUT but at Vdd and IN (as shown by MP1, MPS, MN5). In cases where a switch(es) is/are inserted at an output node OUT required to offer increased load driving ability or "drivability," the example of FIG. 15 will be more preferable in practical use because of the necessity of constituting such switch(es) by use of a MOS transistor(s) of increased gate width, which is generally considered undesirable.

Figure 16:
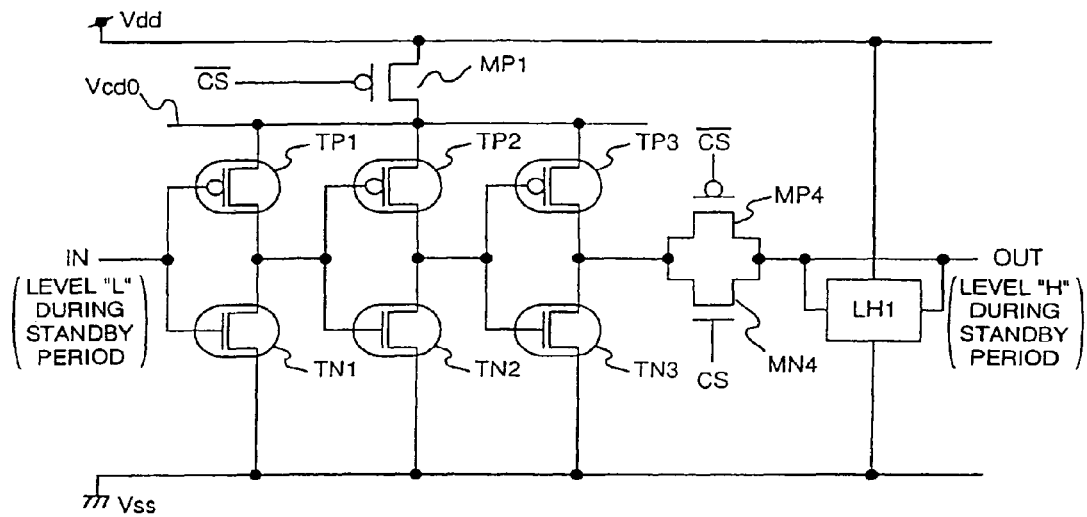
FIG. 16 is a circuit configuration of a further embodiment of the invention.

As shown in FIG. 16, where IN and OUT differ in logic level from each other during standby periods, a switch(es) is/are inserted at IN or at OUT in order to prevent current leakage therebetween. Where IN="L" and OUT="H," insert a switch MP1 at Vdd and switches MP4, MN4 at OUT.

Figure 17:
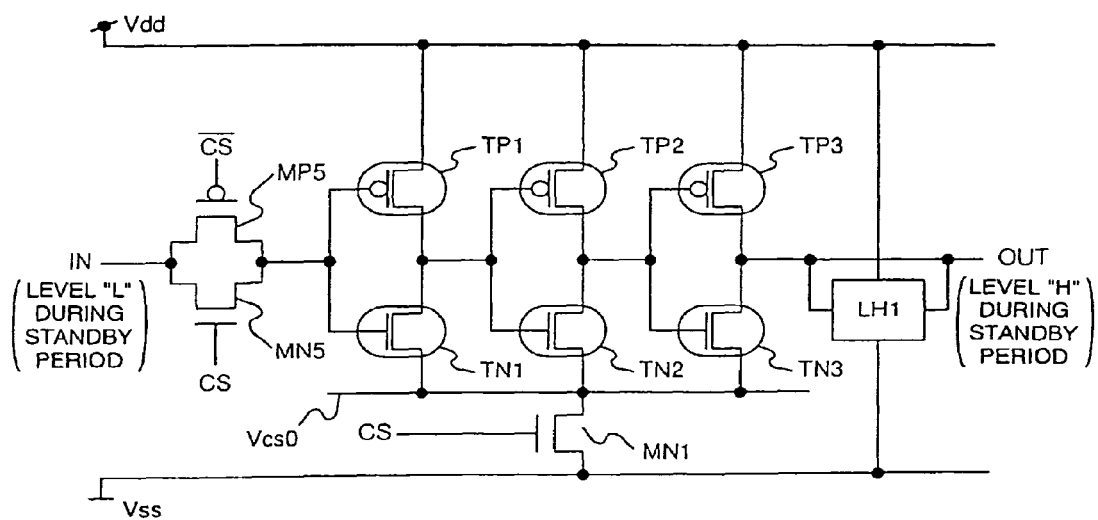
FIG. 17 is a circuit configuration of a further embodiment of the invention.

In FIG. 17, switches are inserted not at Vdd and OUT but at Vss and IN (as shown by MN1, MPS, MN5). Practically, the example of FIG. 17 will be more preferable because it is generally undesirable to insert switches at the output node OUT required to offer increased load drivability.

Figure 18:
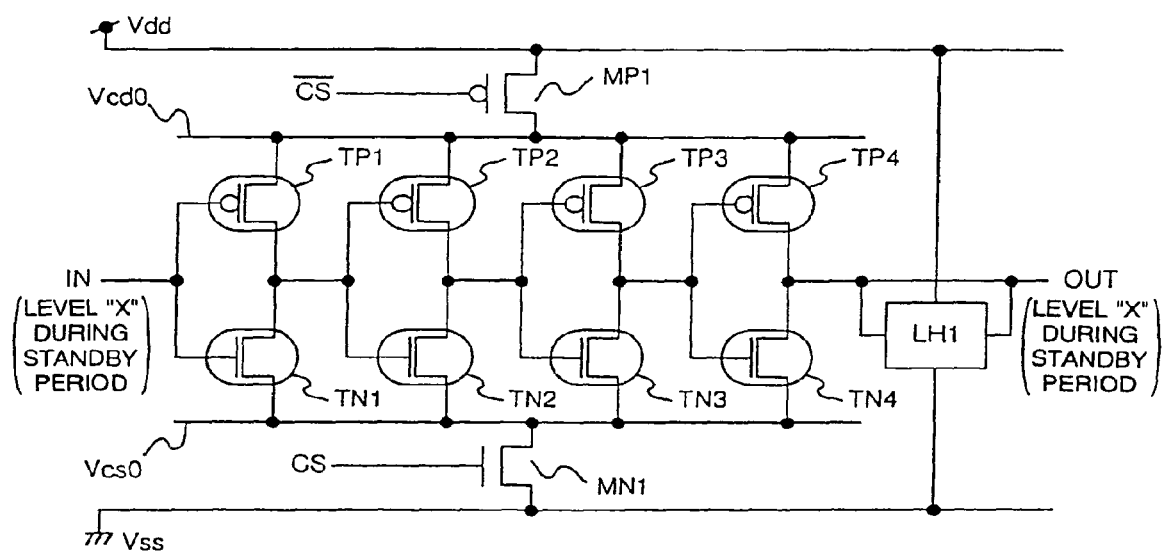
FIG. 18 is a circuit configuration of a further embodiment of the invention.

FIG. 18 is an example adaptable where the logic level of nodes IN, OUT is kept unknown during standby periods while IN=OUT is true; in this case, switches MP1, MN1 are inserted at Vdd and Vss respectively. No switches are required at IN and OUT.

Figure 19:
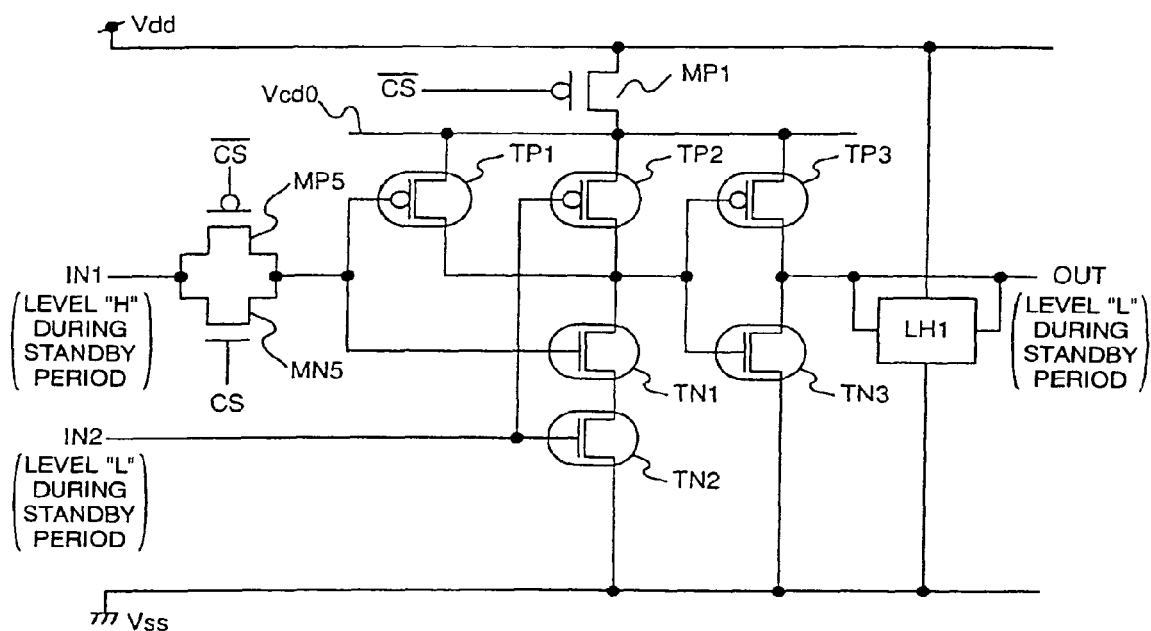
FIG. 19 is a circuit configuration of a further embodiment of the invention.

FIG. 19 shows a further example adaptable for use in receiving a plurality of input signals (IN1, IN2). During standby, IN1="1-1" and IN2=OUT="L"; hence, a switch MP1 is at Vdd whereas switches MPS, MN5 are at IN1.

As apparent from the examples of FIGS. 12-19, the insertion location of thick-film MOS transistors for reduction of gate leakage current is changeable among practical circuits employed. Consequently, it is not necessary to limit to exactly the same insertion method throughout the entire circuitry; such switches are insertable at appropriate locations in a case-by-case manner among various function circuit blocks.

Figure 20:
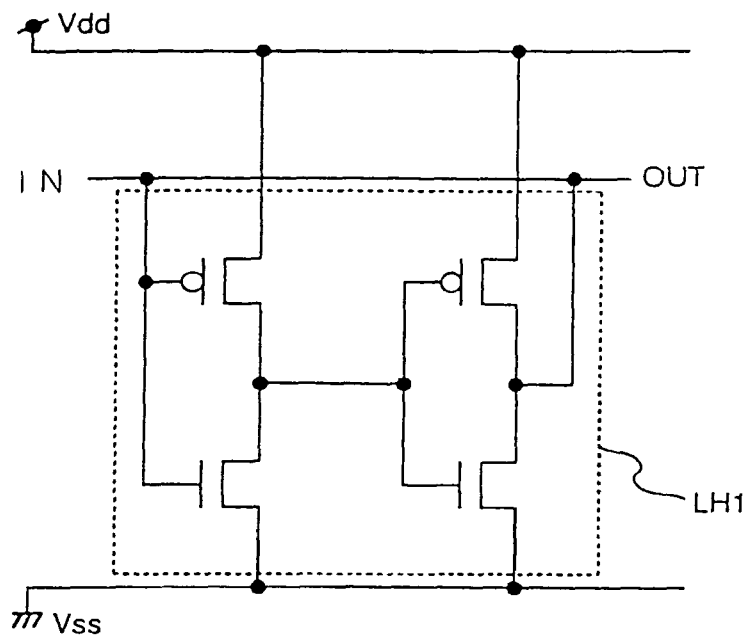
FIG. 20 is a circuit configuration of a further embodiment of the invention.
Figure 21:
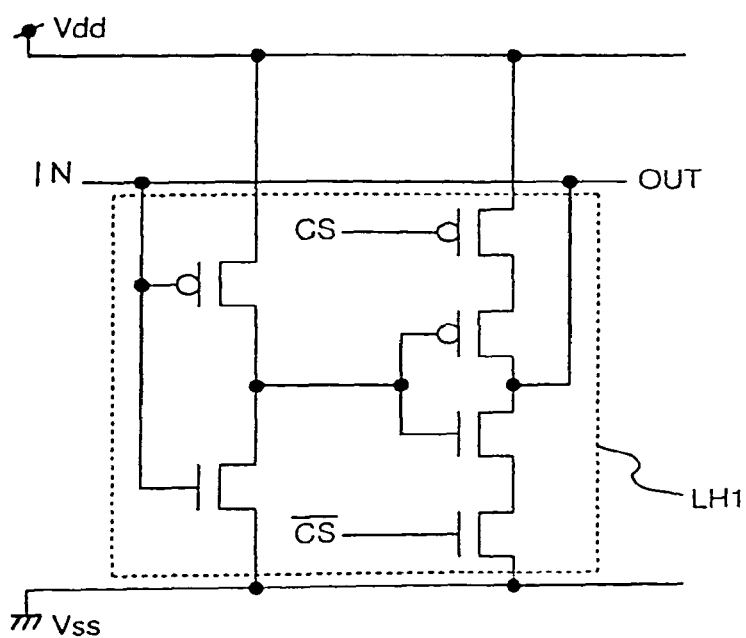
FIG. 21 is a circuit configuration of a further embodiment of the invention.

FIGS. 20 and 21 show other examples of the level hold circuit LH1.

Circuitry of FIG. 20 employs a series combination of two inverter stages, wherein transistors of the latter stage are sufficiently less in drivability than those of a logic gate as coupled to an input IN, and yet are significantly greater in tunnel leakage current than the same.

FIG. 21 shows an example with the latter stage of FIG. 20 being modified to use a clocked inverter. This may improve the design flexibility as to the transistor current drivability.

It should be noted that in the above description of the embodiments, no particular limitations are given with regard to the transistor threshold value; however, it will be recommendable that the thin-film MOS transistors are of low threshold value whereas the thick-film ones are higher in threshold value than the former. When low threshold-value transistors are employed, what is called the "subthreshold" leakage current can flow between the source and drain; even if this is the case, such source-to-drain subthreshold leakage current may be interrupted or cut off by use of high threshold value thick-film MOS transistors as inserted between the power supplies. Several embodiments as will be shown in FIG. 22 and its following figures of the drawing are drawn to the circuit configuration basically employing therein a combination of thick-film MOS transistors of high threshold value—such as 0.5 volts, which may render subthreshold current leakage negligible—and thin-film MOS transistors of low threshold value such as 0.1 volt, or more or less, by way of example.

It should also be noted that in the above description of the embodiments, although no specific discussions are given in regard to the relation of voltages as input to the gate nodes of thin-film MOS transistors versus input voltages at the gates of thick-film MOS transistors, it will be more effective to design so that the input voltages at the thick-film MOS transistor gates are higher than the input voltages at the thin-film transistor gates. The thick-film MOS transistors are increased in gate insulation film thickness permitting application of higher voltages thereto as compared with thin-film MOS transistors whereby current drivability of thick-film MOS transistors may increase accordingly. In the embodiments of FIGS. 5 through 21, this can be attained by increasing the amplitude of signals CS and /CS. In such case the thick-film MOS transistors are to be greater in gate length than the thin-film MOS transistors. This serves to increase the threshold value of thick-film MOS transistors while simultaneously enhancing device reliability of high-voltage operable thick-film MOS transistors. In some embodiments of FIG. 22 and its succeeding figures of the drawing, there will be shown circuit configurations basically arranged to apply a high voltage of 3.3 volts to thick-film MOS transistors while applying a low voltage of 1.5 volts to thin-film MOS transistors, by way of example.

Several types of exemplary semiconductor integrated circuit devices employing the principles of the present invention will be described hereafter.

Figure 22:
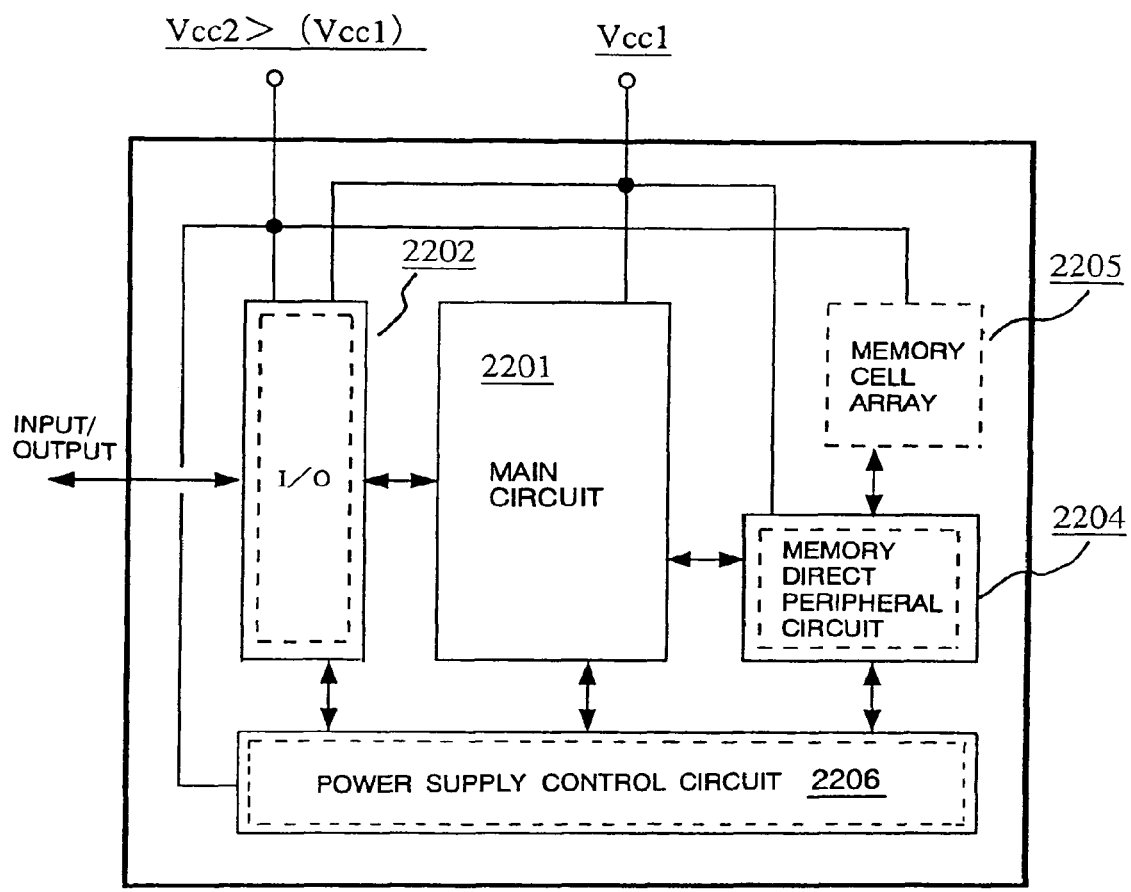
FIG. 22 is a plan view of an integrated circuit chip embodying the invention.
Figure 22:
Figure 22:
Figure 22:

See FIG. 22, which is a block diagram of a semiconductor integrated circuit device embodying the invention. In the following figures of the drawing, different kinds of lines are used for clarity purposes: Solid lines are used to indicate circuit blocks mostly including thin-film MOS transistors in light of the area ratio; broken or dotted lines are to circuit blocks mainly employing thick-film MOS transistors; and, solid-and-dotted line pairs are to circuit blocks each using both thin-film and thick-film transistors therein.

A main circuit 2201 including a CPU core receives input signal's and issues output signals via an input/output (I/O) circuit 2202. The main circuit 2201 also accesses a memory cell array 2205 (DRAM, for example) via a memory-direct peripheral circuit 2204 to receive from and transmit signals to it. A standby control circuit (power-supply control circuit) 2206 is provided for control of selective feed of a power supply voltage(s) to thin-film MOS transistors within respective modules mentioned above. Typically, internal signals of semiconductor integrated circuit devices are different in amplitude from those outside them. To compensate for such signal amplitude difference, a level converter circuit to be later described is provided for conversion of potential level therebetween.

In FIG. 22 the memory cell array 2205 is configured using selected kind of MOS transistors negligible in amount of tunnel leakage current (thick-film MOS transistors). The gate insulation film of such transistors may be an oxide film which is as thick as 5 to 10 nm, by way of example.

The main circuit 2201, I/O circuit 2202, memory-direct peripheral circuit 2204 and standby controller 2206 employ as their main elements thin-film MOS transistors. Particularly, the main circuit containing therein logic elements is increased in ratio of thin-film MOS transistors used.

As has been fully discussed in connection with FIGS. 5-21, the thin-film MOS transistors in these circuits are arranged such that they are capable of interrupting or "intercept" the power supply by switches in order to reduce current leakage during standby periods. Thick-film MOS transistors are used for such power-supply intercept switches disenabling flow of leakage current-through these switches per se. These power supply switch MOS transistors turn on and off selectively under control of the standby controller 2206.

This semiconductor integrated circuit device is arranged to employ thick-film MOS transistors also for certain transistors (such as those in I/O circuit) which directly receive an input of relatively large signal amplitude from the exterior of the IC chip, other than the thick-film MOS transistors for use with the power supply switches. This is because of the fact that higher gate-withstanding voltage MOS transistors are required for the I/O circuit to which significant amplitude of signals are input, and that thick-film MOS transistors are typically greater in gate voltage breakdown level. The thick-film MOS transistors for gate leakage reduction in the thin-film MOS transistors as discussed previously with reference to FIGS. 5-21 may be employed as the high voltage MOS transistors for use with the I/O circuit. It is possible to reduce process complexity by using the thick-film MOS transistors for the both MOS transistors.

The memory cell array 2205 includes rows and columns of memory cells as required to continue storing data during standby periods, which are formed of thick-film MOS transistors negligible in tunnel leakage current. Employing thick-film MOS transistors for these memory cells might cause the operation speed to decrease; on the other hand, this enables resultant circuit to be free from the power dissipation increase problem due to gate current leakage, making it possible to continuously transfer power supply voltages to the memory cells even during standby.

Conversely, thin-film MOS transistors are used for certain memory cells that are not required to retain information therein during standby periods. During standby, information stored in memory cells will disappear; however, it is possible by interrupting transfer of the power supply voltage to the memory to eliminate an increase in power dissipation due to gate leakage. Also, in cases where the memory is less in data storage capacity so that continuous power feed results in a mere negligible increase in gate-leakage power dissipation, the memory cell may similarly be formed of thin-film MOS transistors. For example, register files are inherently small in capacity rendering resultant leakage current negligible in the practical sense; rather, these are more important in operation speed. Desirably, such memory is formed of thin-film MOS transistors. In the semiconductor integrated circuit device of this embodiment, it is preferable that certain memory circuits such as latches, flipflops, and the like employ thin-film MOS transistors. On the other hand, high-voltage/low-speed circuits which are driven with high voltages and are not required to attain rapid responsibility, such as the power supply control switches stated supra, for example, are preferably formed of thick-film MOS transistors.

In the example of FIG. 22, the IC chip is driven using at least two kinds of power supply voltages Vcc1, Vcc2, where Vcc2 is higher than Vcc1. The thick-film MOS transistors are to be driven by power supply voltage Vcc2 of increased current supplying ability whereas the thin-film MOS transistors are by Vcc1. It can be readily seen by those skilled in the semiconductor art that while the following embodiments assumes use of Vcc1 of 1.5 volts and Vcc2 of 3.3 volts, such potential values may freely be modified insofar as they satisfy the relation of Vcc2>Vcc1.

With the semiconductor integrated circuit device of FIG. 22, high speed operation is expectable since thin-film MOS transistors are used for most of the major units therein.

Figure 23:
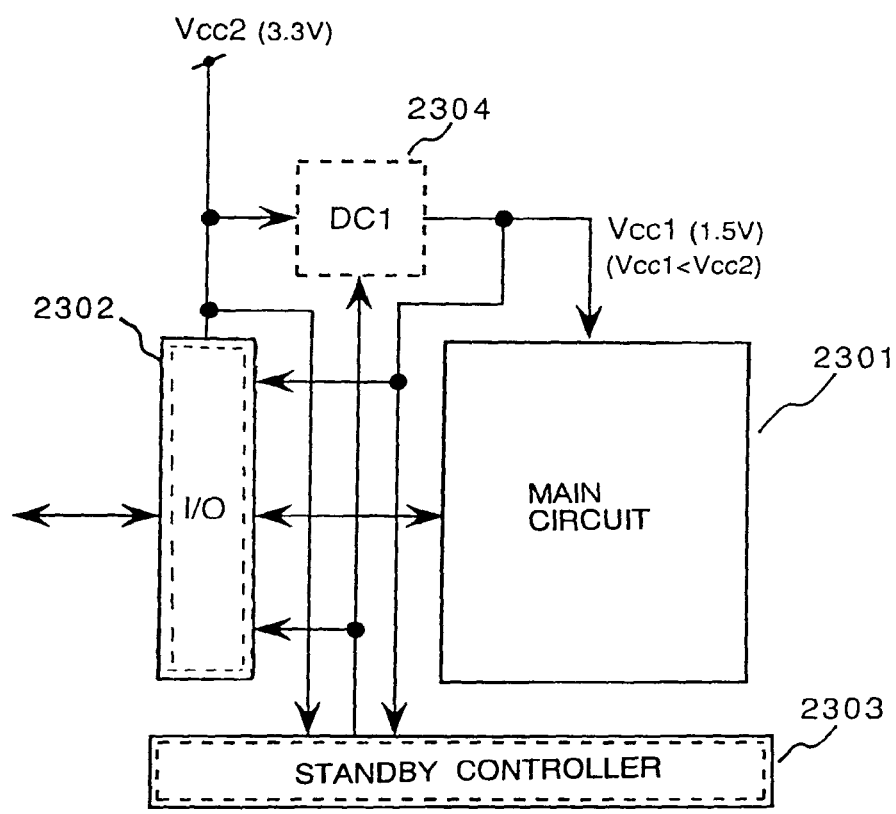
FIG. 23 is a plan view of an integrated circuit chip also embodying the invention.

A semiconductor integrated circuit device also embodying the invention is shown in FIG. 23. This device is basically formed of a main circuit 2301 including logic circuits and the like, I/O circuit 2302, and standby control circuit 2303. In this example the voltage Vcc2 of 3.3 volts as externally supplied thereto is passed to a potential reduction circuit 2304, which causes voltage Vcc2 to drop down at 1.5 volts to provide internal power supply voltage Vcc1. Potential reduction circuit 2304 may be on the same chip substrate together with the main circuit and others; or alternatively, it may be formed on a separate chip. Main circuit 2301 is mostly constituted from thin-film MOS transistors to speed up its operation. Potential reduction circuit 2304 mainly consists of thick-film MOS transistors. I/O 2302 and standby controller 2303 include a combination or "hybrid" of thin-film and thick-film MOS transistors therein. In these circuits the thin-film MOS transistors are driven with Vcc1 whereas thick-film ones are with Vcc2. Standby controller 2303 operates to turn off an output of potential reduction circuit 2304 during standby periods in order to reduce power dissipation due to current leakage. Controller 2303 also causes an output from I/O 2302 toward main circuit 2301 to change at "L" level. When an input to main circuit 2301 is at "L" while the power supply voltage fed thereto is at zero volts, then most nodes within main circuit 2301 are at "L" reducing power dissipation due to tunnel-current leakage. As can be readily seen by those skilled in the art, where the thin-film MOS transistors are low in threshold value, resultant power dissipation due to flow of subthreshold leakage current will be reduced accordingly.

Figure 24:
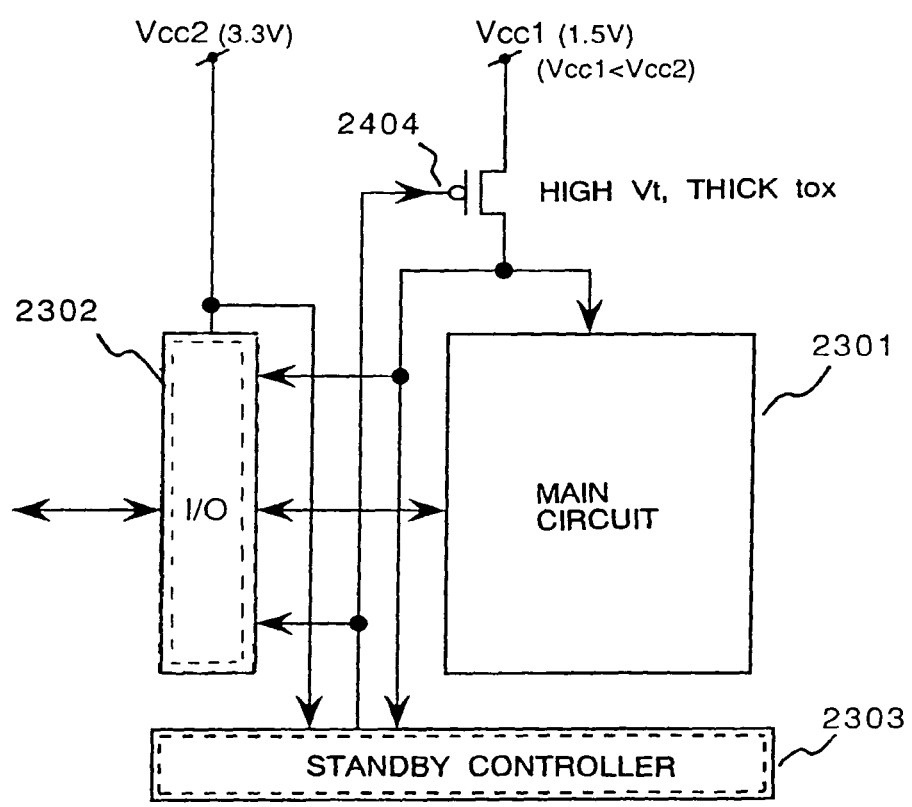
FIG. 24 is a plan view of an integrated circuit chip embodying the invention.

A further embodiment is shown in FIG. 24, wherein like reference numerals are used to designate like parts in the embodiment of FIG. 23. In this embodiment two kinds of power supplies Vcc1, Vcc2 are externally fed to the IC chip; Vcc1 is supplied to main circuit 2301 and others via a switch 2404 as formed of a thick-film PMOS transistor. During standby periods, standby controller 2303 causes switch 2404 to turn off interrupting feed of power supply Vcc1. Like the embodiment of FIG. 23, the output of I/O 2302 to main circuit 2301 is forced to change at "L" level. Switch 2404 may be on the same chip along with main circuits 2301 and others, or alternatively may be discrete power MOS transistor externally wired to the chip. Here, switch 2404 is a thick-film MOS transistor. In a similar way to that of the FIG. 23 embodiment, when an input to main circuit 2301 potentially changes at "L" while the power supply fed thereto is at 0 volts, internal major nodes of main circuit 2301 are at "L" reducing power dissipation due to tunnel-current leakage.

Figure 25:
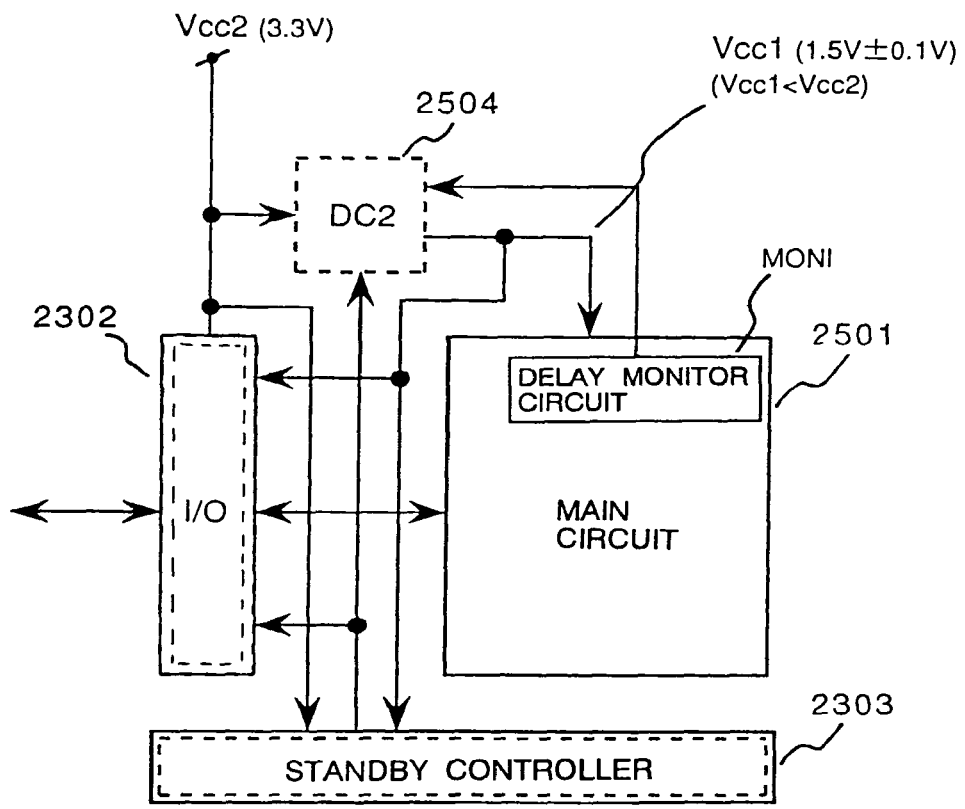
FIG. 25 is a plan view of an integrated circuit chip embodying the invention.

A semiconductor integrated circuit device embodying the invention is shown in FIG. 25, which is similar to that of FIG. 23 with a specific circuit being built therein for compensating for any possible variation in operation speed of the main circuit. In this drawing also, like parts have the same reference numerals. In this embodiment the main circuit 2501 comes with a delay monitor circuit MON1. Delay monitor circuit MON1 is for monitoring in principle a delay time of logic circuits within main circuit 2501. Accordingly, delay monitor circuit MON1 is formed using thin-film MOS transistors which are the same as those of main circuit 2501. Delay monitor circuit MON1 may be a ring oscillator, by way of example. A potential reduction circuit 2504 is provided for receiving voltage Vcc2 to issue a potentially decreased voltage Vcc1, and is responsive to receipt of a signal from delay monitor circuit MON1 in main circuit 2501, for controlling the value of voltage Vcc1 in such a way as to compensate for deviations of delay time of logic circuits which constitute main circuit 2501 due to environmental variations such as a variation in process parameter during the manufacture of main-circuit transistors and/or in-ambient temperature. This may be attainable by use of phase-locked loop (PLL) schemes one of which will be later described in connection with FIG. 28. By way of example, suppose that the temperature rises increasing the delay time of logic circuits constituting main circuit 2501. If this is the case, potential reduction circuit 2504 attempts to potentially increase its output voltage Vcc1. Conversely, if temperature drops decreasing the delay time of the logic circuits of main circuit 2501, then potential reduction circuit 2504 forces output Vcc1 to decrease in potential. Whereby, the logic circuits forming main circuit 2501 may be kept constant in delay time throughout operation.

Figure 26:
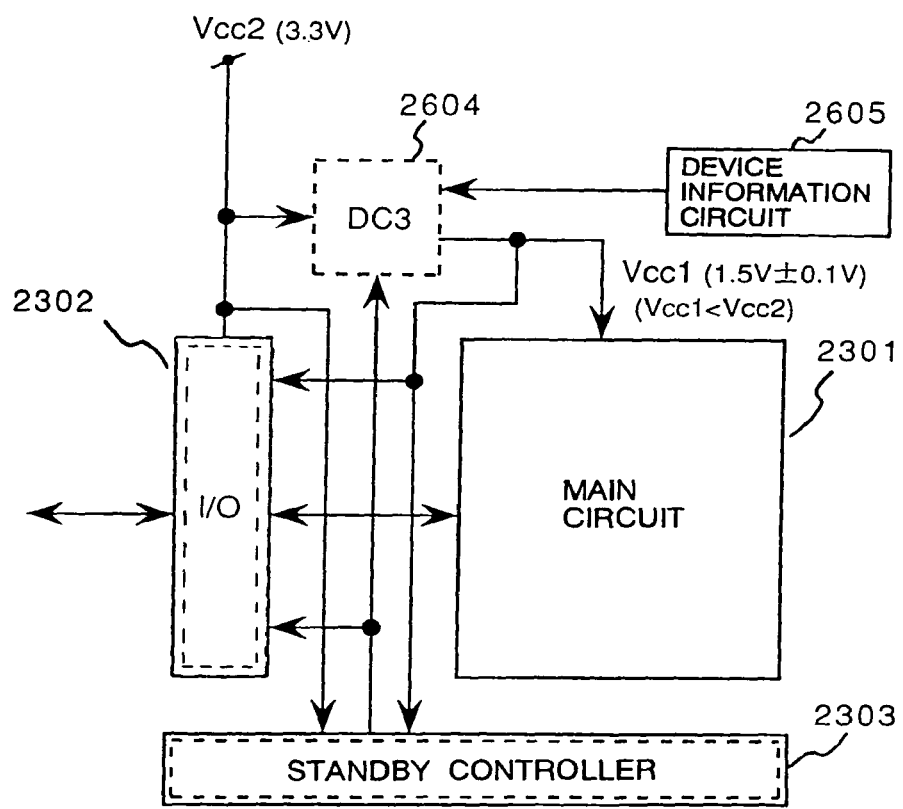
FIG. 26 is a plan view of an integrated circuit chip embodying the invention.

A semiconductor integrated circuit device further embodying the invention is shown in FIG. 26. While in FIG. 25 the monitor circuit MON1 is provided to monitor delay time of the logic circuits constituting the main circuit, this embodiment is arranged so that the characteristics of MOS transistors or logic circuits which constitute the main circuit are measured during the reliability test procedure in the manufacture of IC chips while allowing resultant device information to be stored in a memory unit 2605. Upon receipt of a control signal issued from this "device info" memory 2605, a potential reduction circuit 2604 operates to determine an exact value of voltage Vcc1. By way of example, imagine that the transistors constituting main circuit 2301 under manufacture are greater in threshold value than expected by circuit design. If this is the case, store such data in memory 2505 so as to cause potential reduction circuit 2604 to generate and issue a modified or "updated" value of voltage Vdcl which is greater than the initially designed value. Alternatively, where the chip reliability test result reveals the fact that the threshold value of the transistors forming the main circuit, store corresponding data in memory 2605 causing potential reduction circuit 2604 to generate and issue another updated value of voltage Vcc1 which is below the initial design value. With such a scheme employed, it is possible to compensate for fabrication deviations. Additionally, the device information to be stored in memory 2605 may be transistor threshold value, transistor saturation current value, or any other equivalent parameters thereof which reflect the delay time of the logic circuits constituting the main circuit. Also, as for the storage method thereof, any scheme may be employed. One recommendable simple storage scheme is as follows: a method of changing the value of a reference voltage Vref of a potential reduction circuit shown in FIG. 27 by physical methods using the FIB processing for cutting away a fuse (aluminum wiring lead) by an ion beam.

While the method of FIG. 25 may compensate for environmental variations such as the process parameters in the manufacture of main-circuit transistors, ambient temperatures and others, the method of FIG. 26 may offer capability of compensating for the process parameters in the manufacture of main-circuit transistors only. Instead, the latter is more advantageous than the former in that any area overheads can be suppressed or minimized with simple architecture used.

Other approaches other than those of FIGS. 25 and 26 may be still available for compensating for environmental variations such as the process parameters in the manufacture of main-circuit transistors, ambient temperatures and others, which approaches are also within the scope of the present invention.

Figure 27:
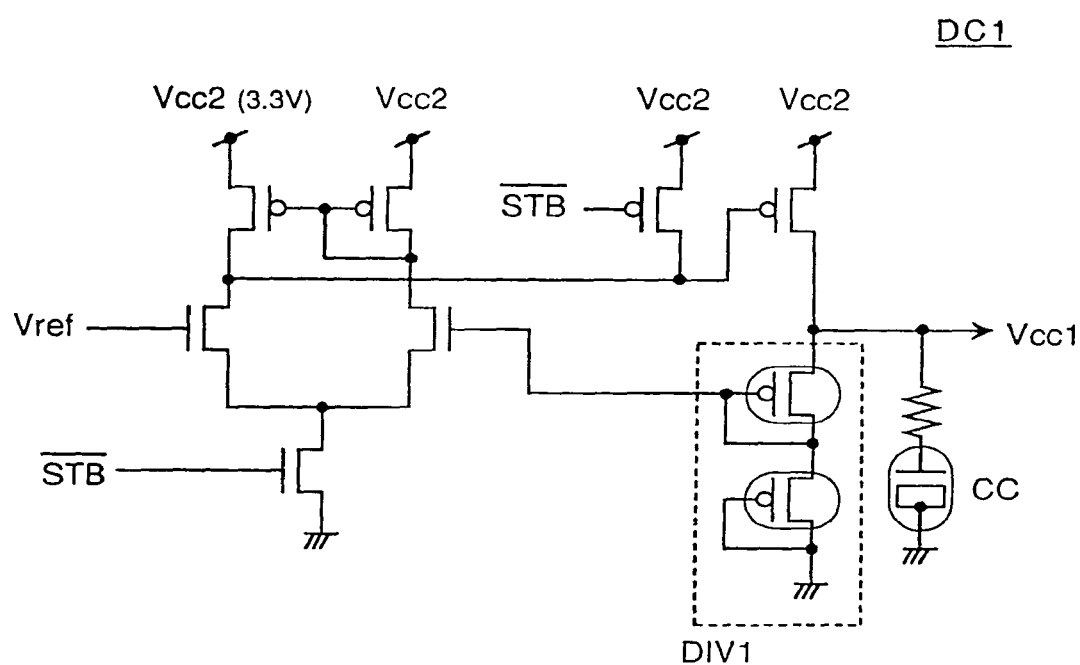
FIG. 27 is a circuit diagram of a potential reduction circuit in accordance with an embodiment of the invention.

One exemplary circuit configuration of the potential reduction circuit (voltage limiter) 2304 of FIG. 23 for conversion of high voltage Vcc2 to low voltage Vcc1 is shown in FIG. 27. This voltage limiter 2304 is controlled in responding to a control signal fed from the standby controller 2303, for turning on and off transfer of voltage Vcc1. This voltage limiter handles relatively high voltages, and therefore is principally formed of thick-film MOS transistors. Note however that it remains permissible for a phase compensation capacitor CC to exhibit current leakage which is as less as several microamperes ($\mu$A). Employing thin-film MOS transistors enables resultant circuitry to decrease in chip area. In particular, capacitor CC typically ranges from several hundreds to thousands of picofarads (pF) in capacitance, which in turn serves advantageously to reduce the chip area. Transistors forming a voltage divider circuit DIV1 are also allowed to exhibit flow of minute leakage current on the order of several $\mu$A; even when such leakage arises, MOS transistors each having a thick gate insulation film may be employed since this circuit will merely act as a voltage dividing resistor.

Figure 28:
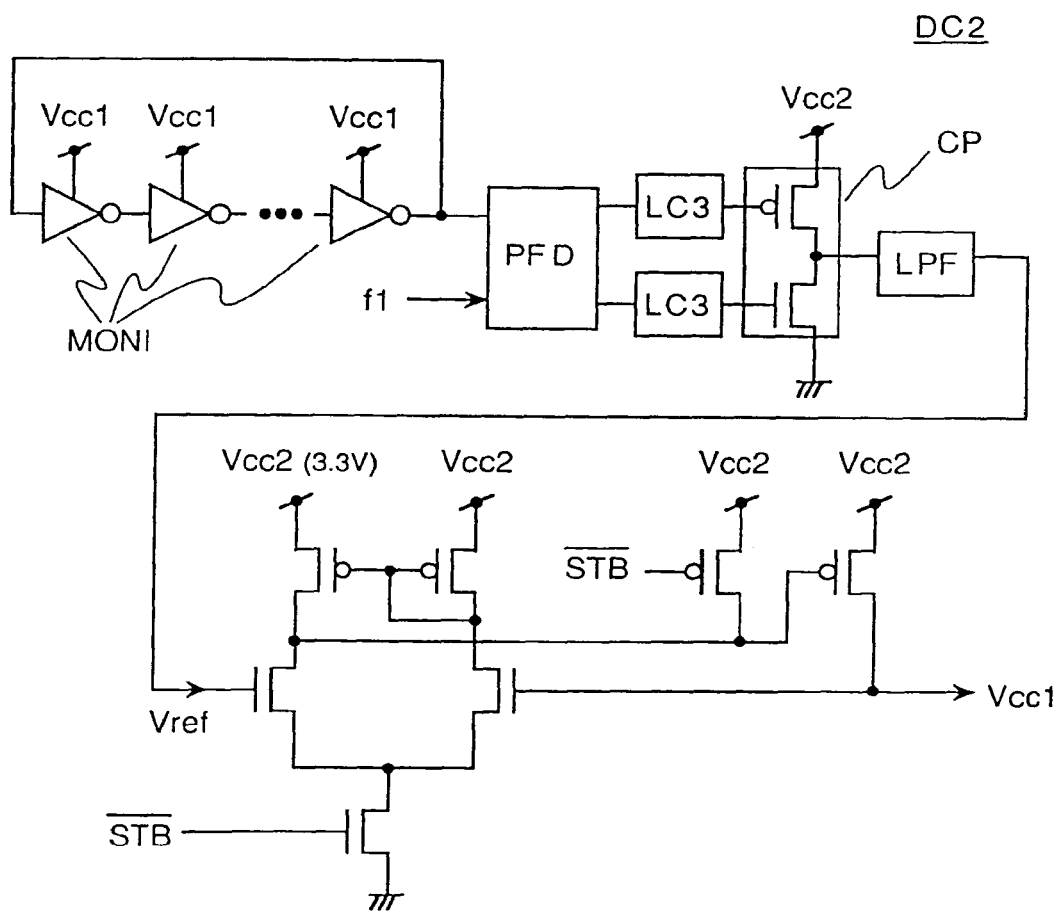
FIG. 28 is a circuit diagram of a potential reduction circuit in accordance with a further embodiment of the invention.

FIG. 28 depicts a detailed configuration of the delay monitor circuit MON1 and potential reduction circuit 2504 shown in FIG. 25. Delay monitor circuit MON1 employs a ring oscillator including a chain of CMOS inverters. This circuit defines PLL circuitry. A frequency-phase comparator PFD is connected for comparing the oscillation frequency of delay monitor circuit MON1 with a clock signal f1 fed to the main circuit, and for driving an associated charge-pump circuit CP through level converters LC3. An output of charge pump CP is sent forth through a low-pass filter LPF to be issued at an output as the reference voltage Vref, based on which the voltage Vcc1 will be produced in conformity with a clock signal f1. Here, ring oscillator MON1 and comparator PFD are formed of thin-film MOS transistors. Charge pump CP employs thick-film MOS transistors since it uses voltage Vcc2 as its power supply. Rendering the main circuit operative in synchronism with clock signal f1 may enable it to operate with an appropriate power supply voltage as maximally optimized to the clock frequency thereof.

Figure 29:
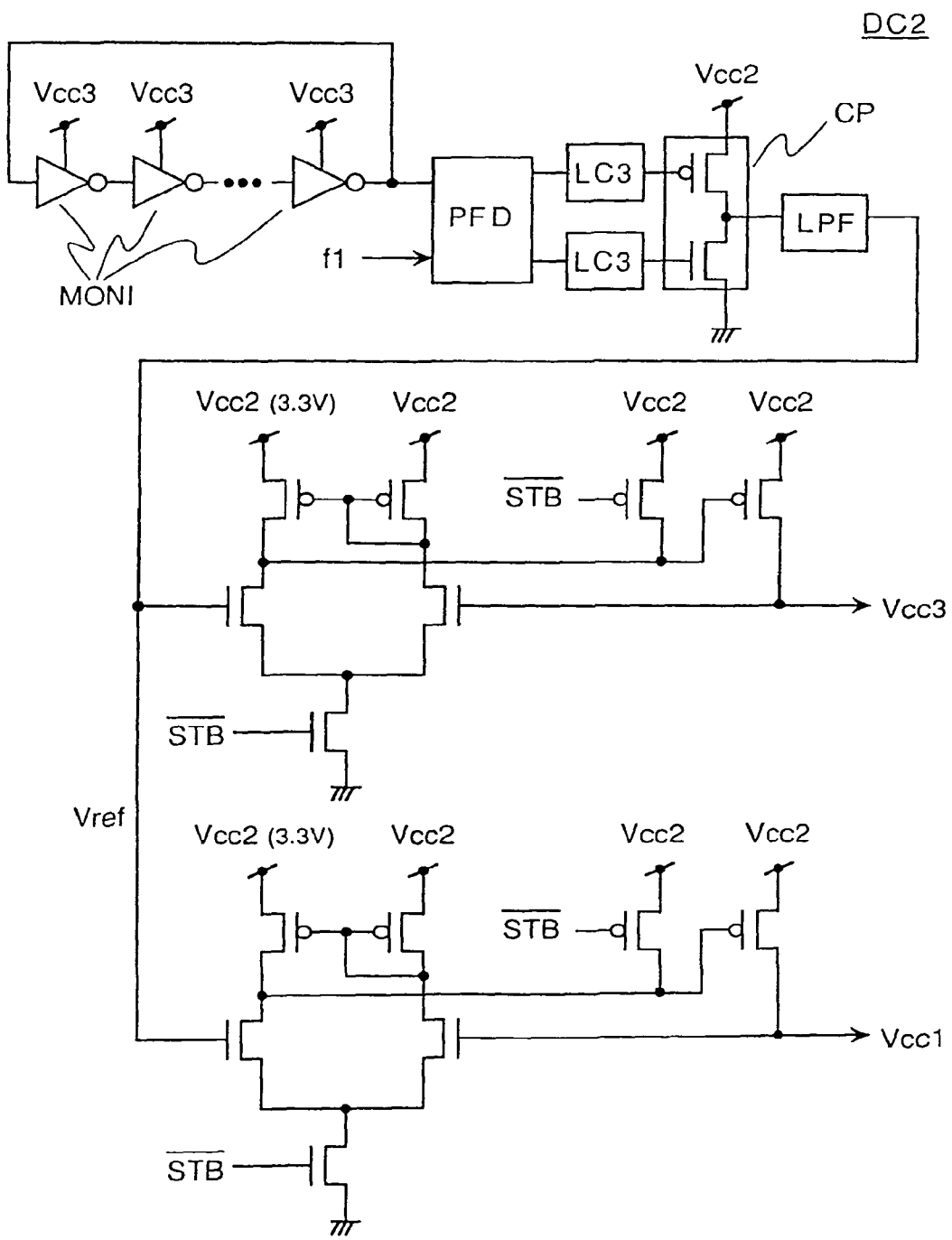
FIG. 29 is a circuit diagram of a potential reduction circuit also embodying the invention.

FIG. 29 shows another exemplary configuration of the delay monitor and Potential reduction circuits of FIG. 28. The circuitry of FIG. 29 is similar in basic configuration to that of FIG. 28 with the power supply Vcc1 fed to the main circuit being separated from a power supply Vcc3 as fed to the delay monitor circuit.

Voltages Vcc1, Vcc3 are inherently identical in potential to each other; however, Vcc1 can experience mixture of noises from the main circuit. In this respect, in order to suppress adverse influence of the Vcc1 noises upon the delay monitor circuit, the power supply Vcc3 for the delay monitor circuit is independent from Vcc1 thus improving the monitoring accuracy.

Figure 30:
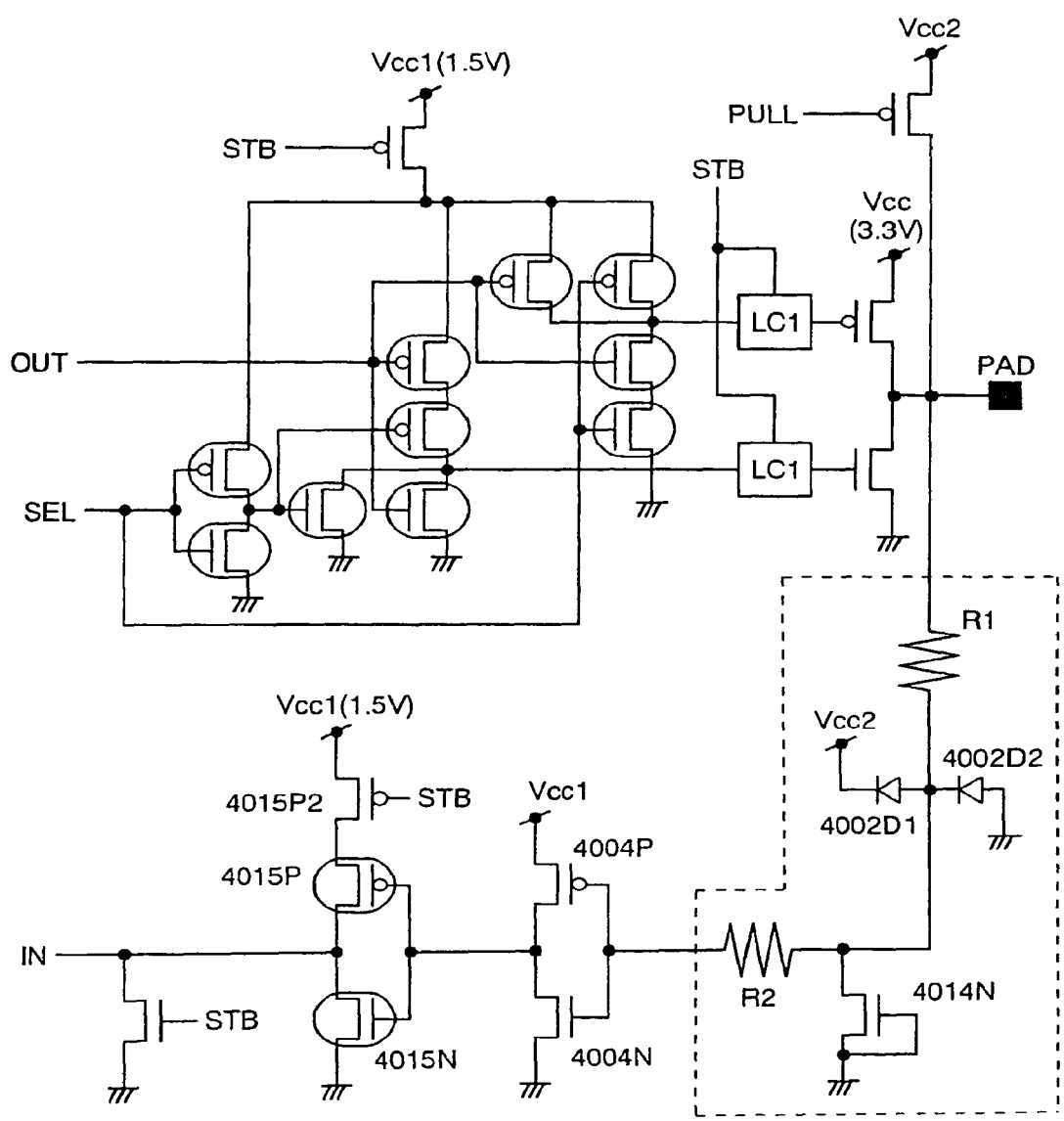
FIG. 30 is a circuit diagram of an input/output circuit.

FIG. 30 illustrates an exemplary configuration of the I/Os 2202, 2302 of FIGS. 22-26. This drawing shows one-bit part only. The I/O handles in-chip signals and external signals via an I/O terminal pad PAD. When SEL is at "L" level, PAD acts as an input terminal; when SEL is at "H," PAD acts as an output terminal. A level converter LC1 is responsive to receipt of a control signal STE issued from standby controllers 2206, 2303 (see FIGS. 22-26); when STE is at "L" then converter LC1 converts a signal with the amplitude of Vcc1 into a signal of an increased amplitude of Vcc2, which is sent forth from output terminal PAD. Accordingly, certain thick-film MOS transistors connected between level converter LC1 an I/O terminal PAD are formed of thick-film MOS transistors. Here, a signal PULL is input to the gate of a pull-up PMOS transistor in such a way that when pullup is required, the signal potentially falls at "L" level permitting execution of pullup operation by such PMOS transistor. This PMOS transistor is a thick-film transistor. During standby periods of the IC chip shown, the standby control signal STB potentially rises at "H" causing level converter LC1 to hold or retain the last potential level of an output since the on-chip thin-film MOS transistors are prevented from receiving any power supply voltages due to power supply interception.

On the input side, an inverter consisting of a pair of MOS transistors 4004P, 4004N receive an externally supplied input signal with amplitude of Vcc2 for conversion to a signal having the amplitude equivalent to Vcc1. Accordingly, these two transistors handling such level-converted signal are formed of thick-film MOS transistors. During standby periods any signal from I/O terminal PAD is cut off by a PMOS transistor 4015P2 forcing an input signal IN to be potentially fixed at "L."

Resistors R1-R2, diodes 4002D1-4002D2, transistor 4014N are connected forming an input protector circuit. Additionally, diodes 4002D1, 4002D2 may be formed of MOS transistors. Those MOS transistors included in this input protector are high-voltage thick-film MOS transistors.

Figure 31:
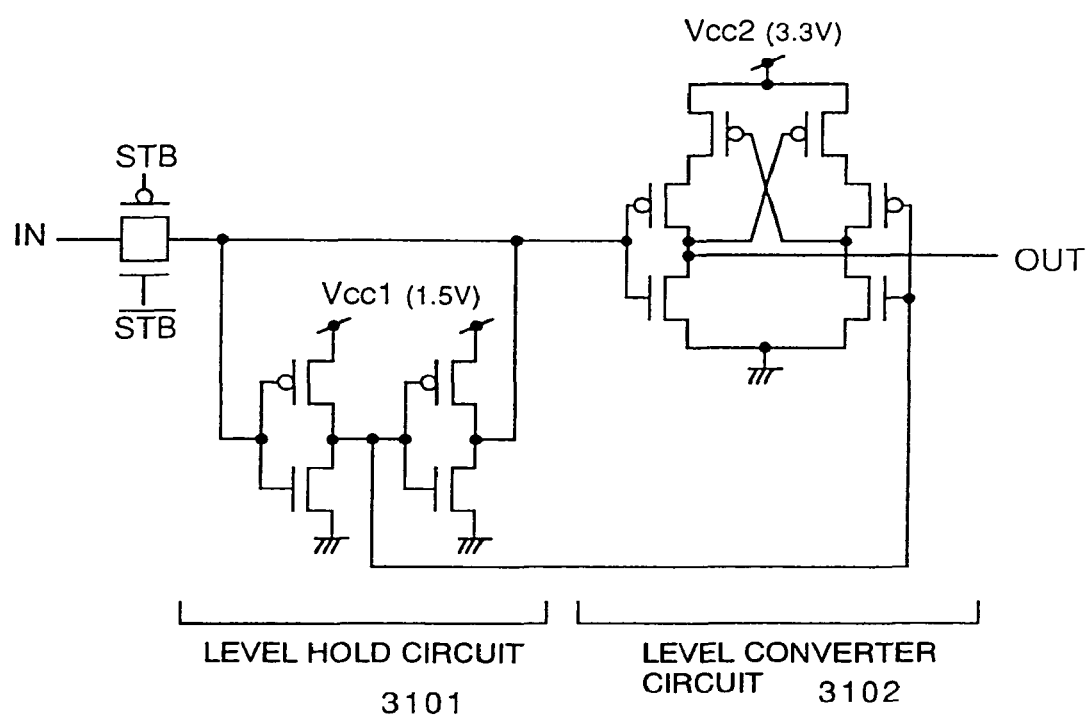
FIG. 31 is a circuit diagram of a level converter circuit with level hold functions.

FIG. 31 shows one practical configuration of the level hold and level converter circuit LC1 of FIG. 30. Level holder circuit 3101 is responsive to standby control signal STB for potentially holding a signal of Vcc1 amplitude; thereafter, the resulting signal is converted by level converter 3102 into a signal of Vcc2 amplitude which is then generated at output OUT.

Figure 32:
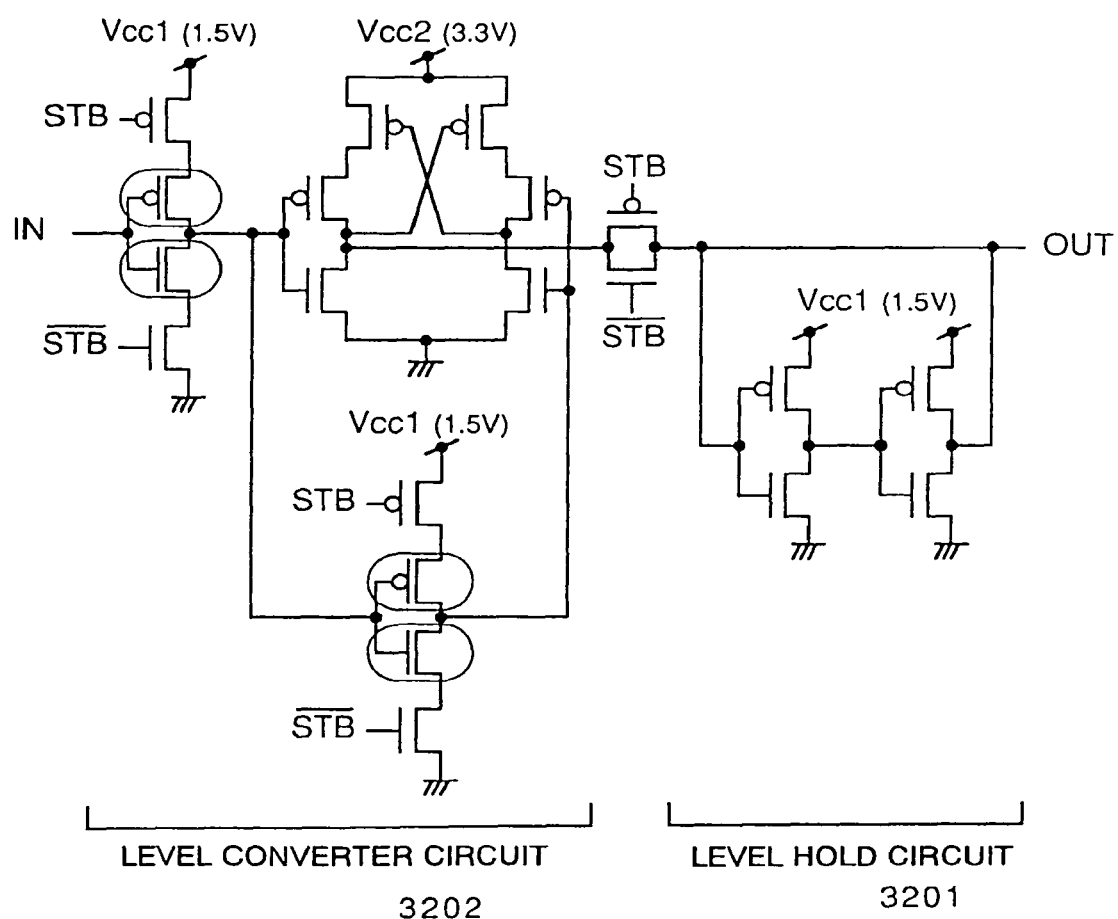
FIG. 32 is a circuit diagram of another level-holdable level converter.

FIG. 32 shows another practical configuration of the level hold and level converter circuit LC1 of FIG. 30. In this embodiment the standby control signal STB is supplied at a midway node between a level holder 3201 and level converter 3202. Level holder 3201 is placed at a location near the output side as looked at from converter 3202, for potentially holding a converted signal with the Vcc2 amplitude.

Upon comparing the embodiments of FIGS. 31 and 32, it may be appreciated by experts in the at that these are functionally identical to each other in performing level conversion of a small amplitude (Vcc1) signal into an increased amplitude (Vcc2) signal and in continuing output of the last potential value after signal STB changes at "H" level. Note here that the former is more advantageous then the latter in that necessary chip area remains less.

Figure 33:
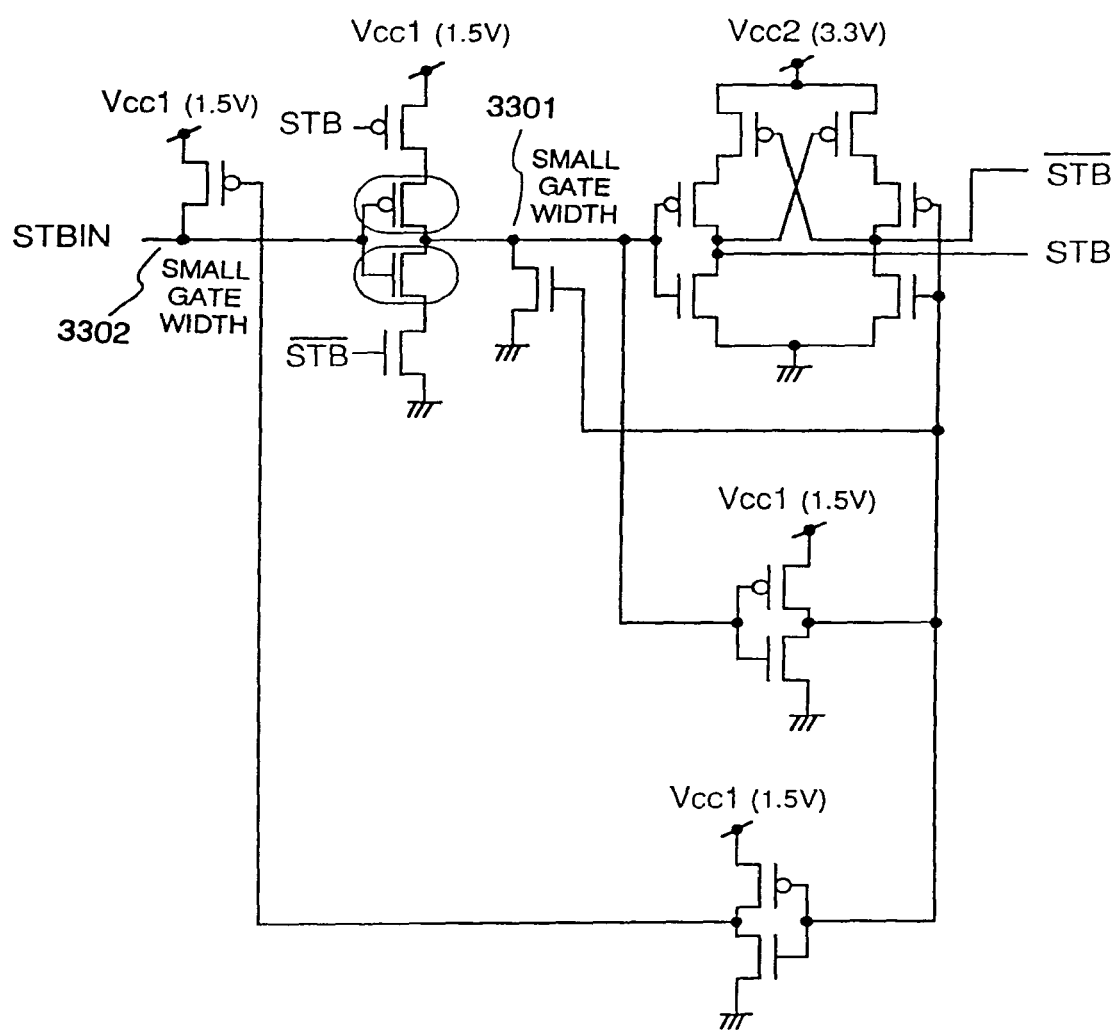
FIG. 33 is a circuit diagram of a standby controller circuit.

FIG. 33 shows one exemplary configuration of the standby controllers 2206, 2303 (see FIGS. 22-26). The circuitry shown receives an input signal STEIN (Vcc1 amplitude) from the main circuits 2202, 2301 or the like and generates by level conversion an inverted output signal /STB. This circuitry is not under strict high-speed requirements, and thus is mostly formed of thick-film MOS transistors in order to suppress flow of leakage current, except that certain portions of it handing signals of Vcc1 amplitude employ thin-film MOS transistors (as enclosed by ellipse templates to distinguish them from the others). In light of the fact that an associated circuit for issuing the STEIN signal can also be in the wait or standby state in response to the STB signal, the circuitry of FIG. 33 prevents the STEIN signal from becoming unstable during standby periods by causing transistors 3301, 3302 to latch the STB output for retainment of its potential level.

Figure 34:
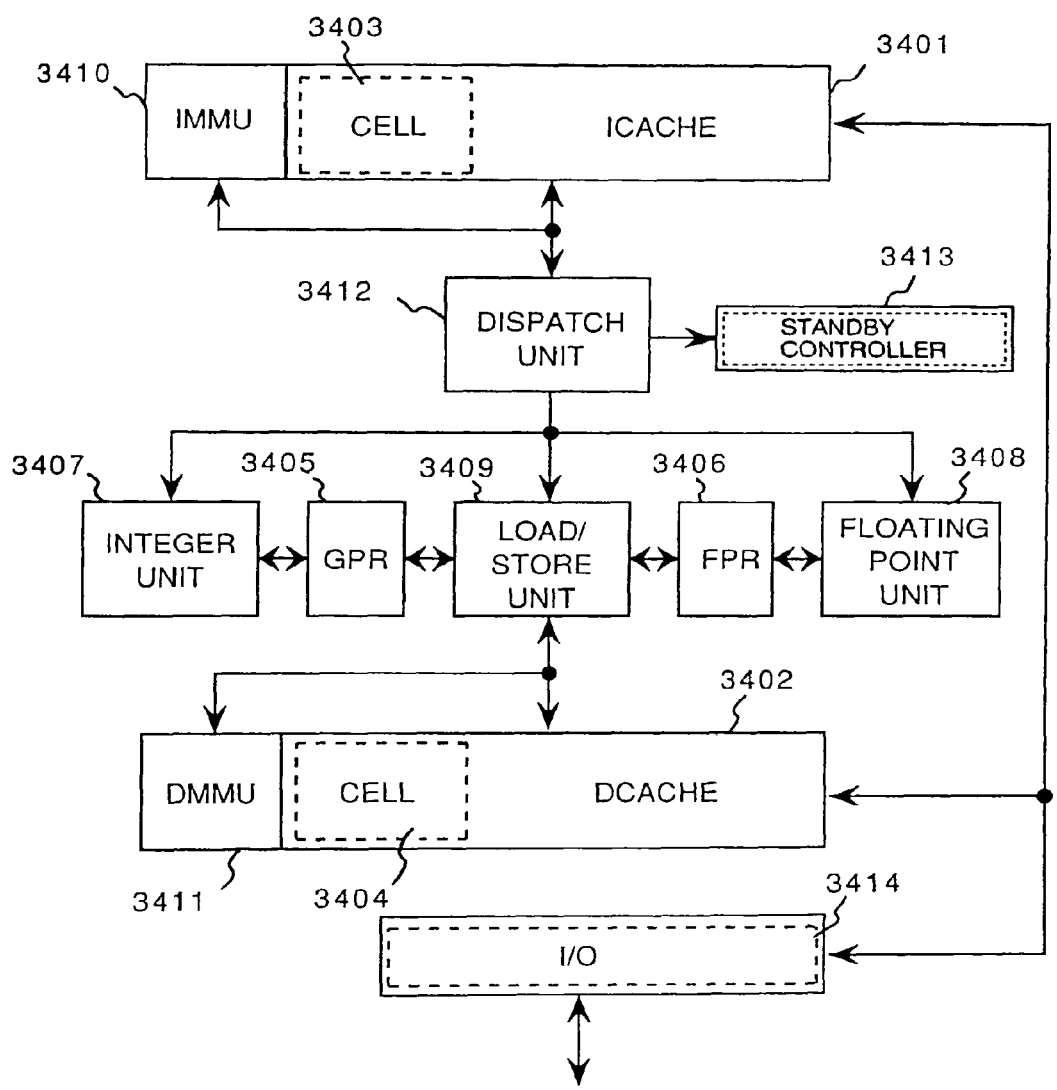
FIG. 34 is a block diagram of a microcomputer system embodying the invention.

A microcomputer system embodying the invention is shown in FIG. 34. Due to significance of data storage capacity that accompanies with the gate leakage problem, a command/ instruction cache register 3402 and memory cells 3403, 3404 employ thick-film MOS transistors. If attaining high-speed characteristics is more important than power dissipation reduction then certain elements under such high speed requirements are formed of thin-film MOS transistors providing a hierarchical memory structure. Likewise, TLEs (included in blocks 3410, 3411) and register files (in blocks 3405, 3406) are mostly comprised of thin-film MOS transistors reducing power dissipation therein.

The microprocessor of FIG. 34 also includes instruction issuance unit 3412, general-purpose register 3405, floating point register 3405, integer arithmetic unit 3407, floating point arithmetic unit 3408, and load/store unit 3409, which are formed of thin-film MOS transistors in view of the fact that they are under high-speed requirements but negligible in affection of power dissipation as long as capacity remains smaller. Standby controller 3413 and I/O 3414 may be similar to those discussed supra.

Figure 35:
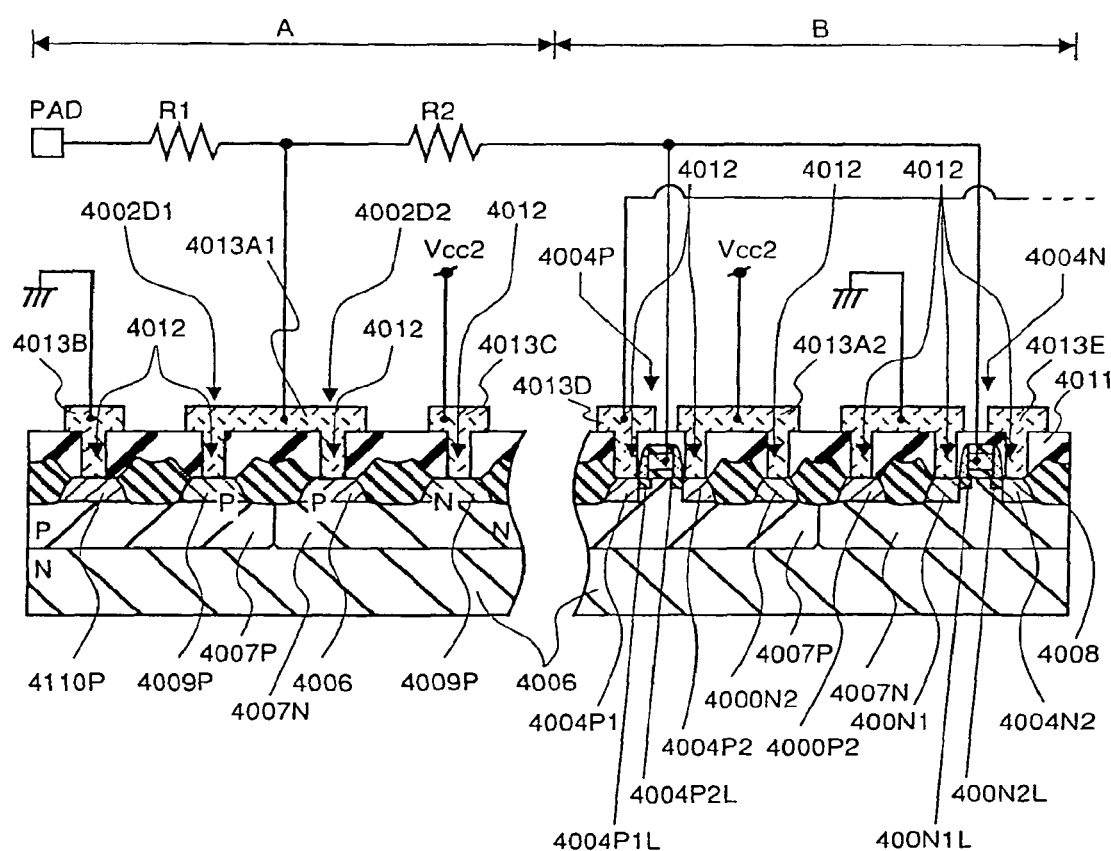
FIG. 35 is a cross-sectional view of an input/output 1 circuit.

FIG. 35 shows a cross-sectional device structure of the I/O unit shown in FIG. 30. In this drawing the part designated by reference character "A" is an input protector circuit whereas part "3" is an I/O circuit, which contains therein a level converter circuit.

An n-type silicon substrate 4006 has a p-type well 4007P and n-type well 4007N with an element separation region 4008 being provided thereon. Impurity-doped layers 4010P1, 4009P1, 4009P, 4010N1 are provided as the source and drain regions of an input protection MOS transistor pMOSL. R1 and R2 are resistive elements; 4004P1, 4004P2, 4000N2, 4000P2, 4004N1 and 4004N2 are the source and drain regions of level conversion MOS transistors. 4004N4, 4004P4 are the gate electrodes of MOS transistors 4004P, 4004N. 4004N3, 4004P3 are the gate insulation films of MOS transistors 4004P, 4004N. A wire lead 4013 is for supplying the power supply through contact hole 4012. Here, the level converter in the I/O circuit area employs thick-film MOS transistors 4004P3, 4004N3. The remaining arrangement is similar to that shown in FIG. 4.

FIGS. 36 through 42 show some exemplary configurations of a mask ROM. Typically, mask ROMs are designed to store binary data either by causing electrical charge as precharged on a bit line to discharge at ground potential or by forcing such precharged charge to be held thereon at a specified high potential.

Figure 36:
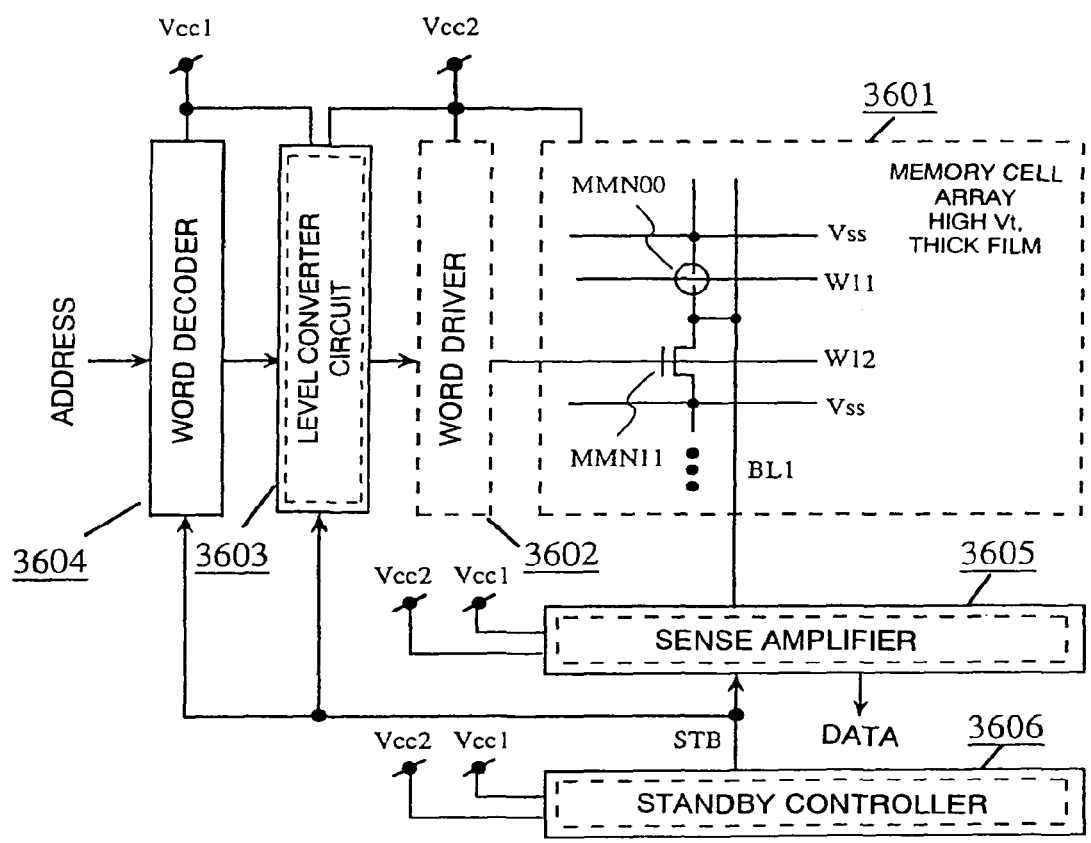
FIG. 36 is a circuit diagram of a mask ROM embodying the invention.

FIG. 36 is a functional block diagram of a NOR type mask ROM which employs the diffusion-layer programming scheme. A word decoder 3604 is connected to receive N sets of row addresses and M sets of column addresses (where N and M are predefined integers) for selection of a single address (with one memory cell as a unit). A word driver 3602 is responsive to an output of word decoder 3604 for driving the memory cell with selected address. Note that since memory cells here are formed of thick-film MOS transistors—as will be later described, the word line amplitude is set at a higher potential (Vcc2). Accordingly, word driver 3602 employs thick-film MOS transistors applied with the voltage of an increased amplitude while causing address signals of decreased potential amplitude (Vcc1) as normally fed from an associative CPU to be coupled to word driver 3602 after conversion of such Vcc1 signals into Vcc2 signals at the level converter. Word decoder 3604 handling small-amplitude signals employs thin-film MOS transistors. A memory cell array 3601 includes a predefined number of rows and columns of memory cells employing thick-film MOS transistors because of the fact that if otherwise these cells were formed of thin-film transistors then unwanted leakage current could flow via associated word lines, where a maximal amount of such leakage current may be defined by the number of cells operatively associated with one bit line multiplied by gate leakage current per cell. Use of thick-film transistors for cells allows the memory cells associated with on bit line to increase in number, which in turn permits enhancement of advantages of the invention with an increase in data storage capacity of memory array 3601. If memory array 3601 were arranged using thin-film transistors then non-selected cells could cause flow of leakage current adversely behaving to impose noise mixture on bit lines, which results in a decrease in signal-to-noise (S/N) ratio while increasing the risk of occurrence of malfunction. A level converter 3603, sense amplifier 3605 and standby controller 3606 may contain both thin-film and thick-film MOS transistors.

In the mask ROM of FIG. 36, certain memory cell MMN00 for storage of a logic "1" data bit comes with no transistors. In other words, the "1" storage cell does not have any diffusion layer. When one word line W12 goes high ("H") in potential, its associated cell MMN11 turns on causing bit line BL1 to drop down at "L" level. In this situation the data "0" storage cell MMN11 constitutes a transistor which will not go low even when word line W11 goes high.

Figure 37:
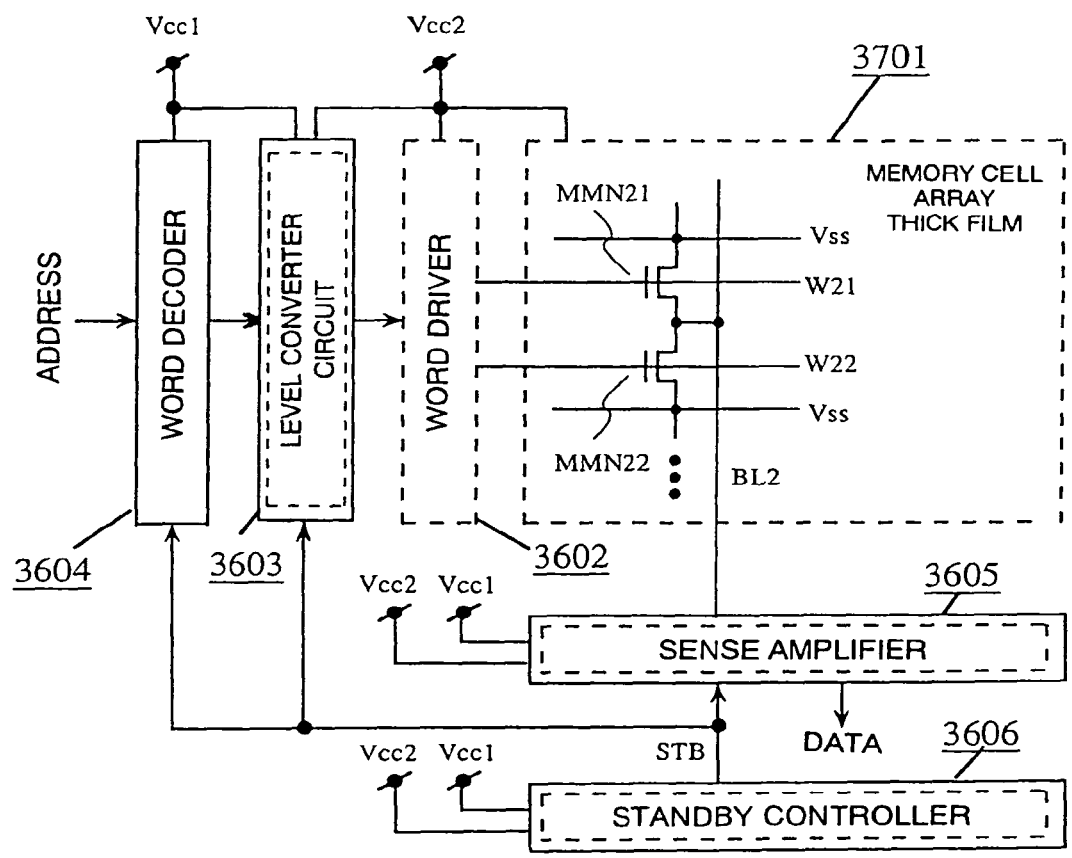
FIG. 37 shows another configuration of a mask ROM also embodying the invention.

FIG. 37 shows a NOR mask-ROM employing the ion implantation programming scheme. This mask-ROM is similar to that of FIG. 36 with the memory cell array being slightly modified in configuration. On occasions where word lines W21, W22 potentially go high, the turn-on/off control of cell transistors is controlled based on the threshold value Vth of each MOS transistor.

Figure 38:
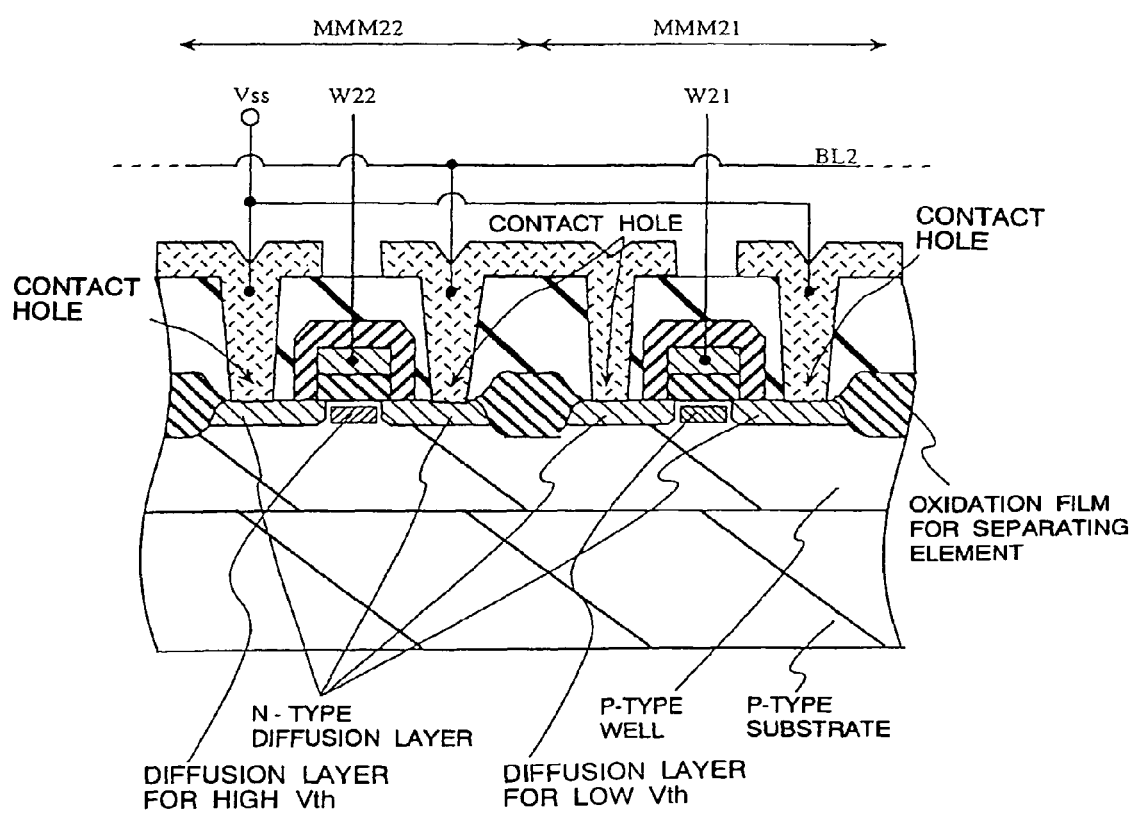
FIG. 38 is a partial cross-sectional view of the mask ROM shown in FIG. 37.

FIG. 38 is a cross-sectional view of one memory cell of FIG. 37. The logic level of stored data is determined by verifying whether a corresponding MOS transistors turns on or off when its associated word line is selected. The word line is equivalent in potential to an output signal of word driver 3602; hence, it is Vcc2 (>Vcc1) in this case. Accordingly, the terminology "high threshold value Vth" refers to Vth>Vcc2. In the case of low Vth, the relation Vth<Vcc2 is established since it is sufficient for MOS transistor to turn on. In this embodiment a diffusion layer for reduction of Vth is provided beneath the gate insulation film of a MOS transistor coupled to word line W21.

Figure 39:
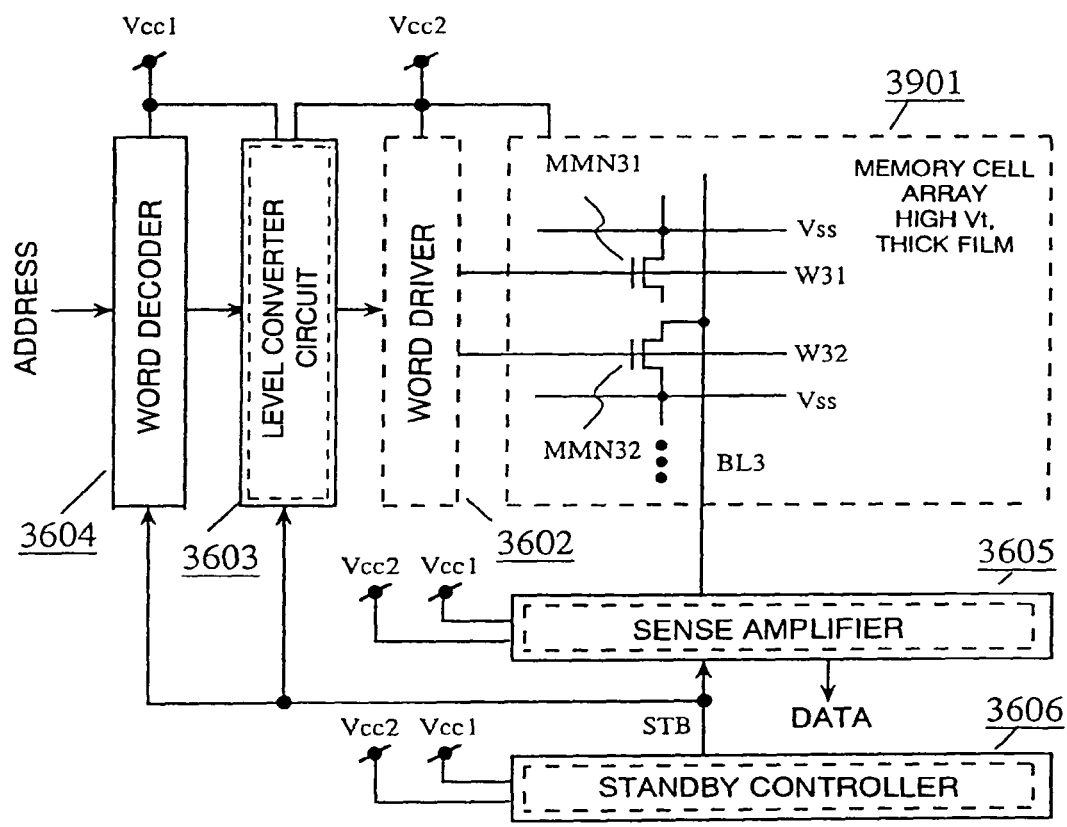
FIG. 39 is a circuit diagram of a further mask ROM.

FIG. 39 shows a NOR mask-ROM employing the contact-hole programming scheme. This ROM is similar to that of FIG. 36 with the memory cell array being slightly modified in configuration. MOS transistors MMN31, MMN32 are of similar arrangement but of different operation such that each controls the "H" and "L" of an output depending upon whether it is connected to bit line BL3.

Figure 40:
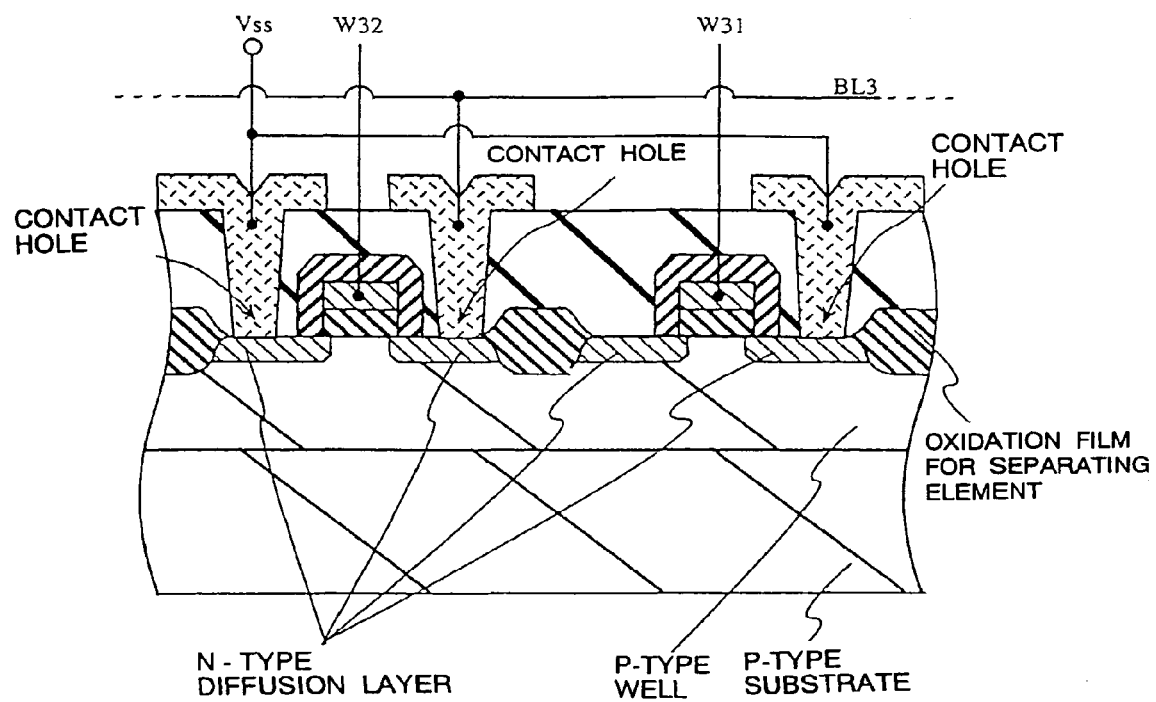
FIG. 40 illustrates a partial cross-section of the mask ROM of FIG. 39.

FIG. 40 shows a cross-section of major part of one memory cell of the array of FIG. 39. As shown, the right-hand side MOS transistor is not connected to bit line BL3.

Figure 41:
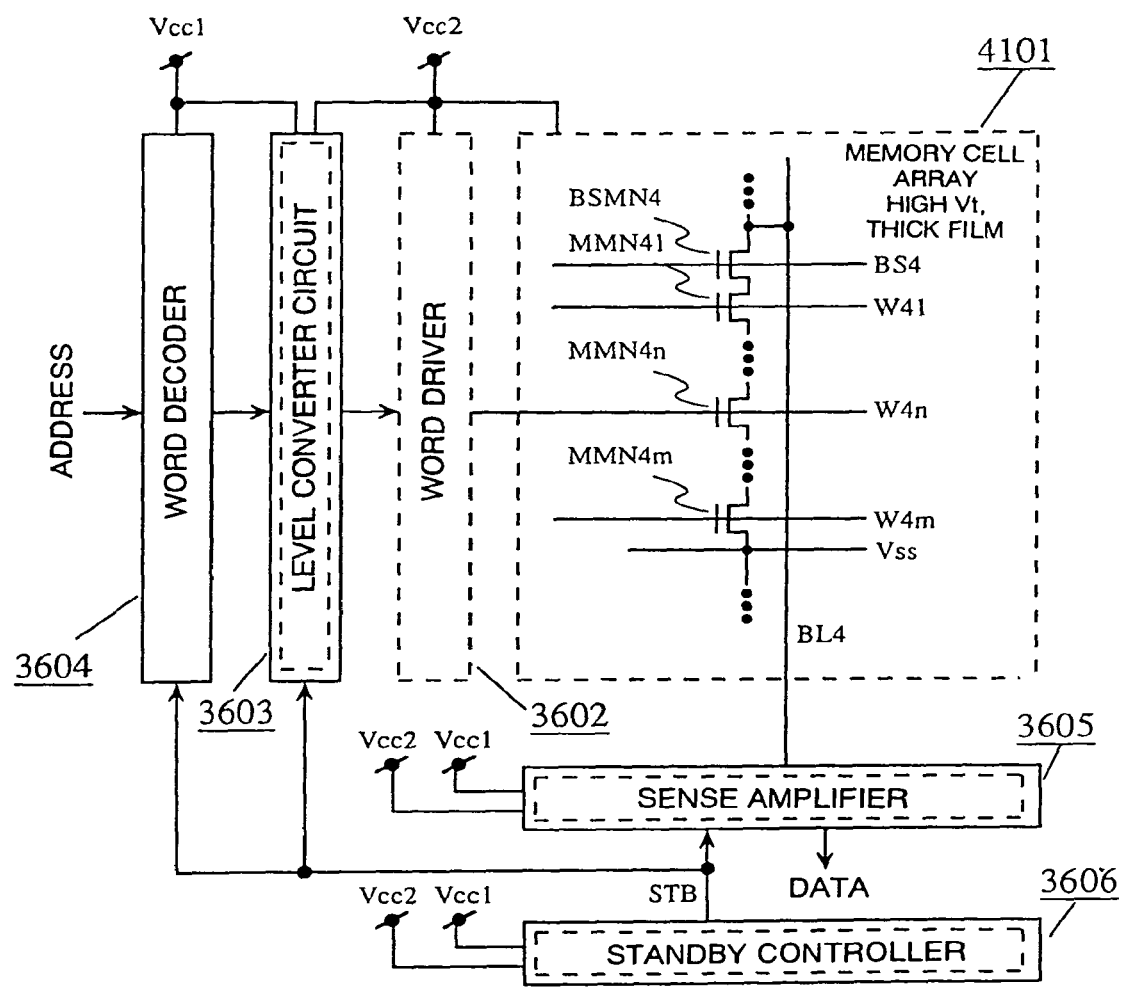
FIG. 41 is a circuit diagram of a further mask ROM.

FIG. 41 shows a NAND mask-ROM employing the ion implantation programming scheme. This ROM is similar to that of FIG. 36 with its memory cell array 4101 being slightly modified in configuration. MOS transistors constitute a cell block. A storage data bit is definable in logic value—"1" or "0"—depending upon whether these MOS transistors are of the positive polarity in threshold value (enhancement type) or of negative polarity (deletion type). In this embodiment a MOS transistor MNN4n is of the depletion type. When one selected word line BS4 potentially goes high; a block-select transistor BSMN4 turn on. Simultaneously, any one of the word lines associated with this block is selected to go low in potential. Suppose a word line W4n is selected. In this block cell a current rushes to flow allowing the "L" level signal to be output via block-select transistor BSMN4.

Figure 42:
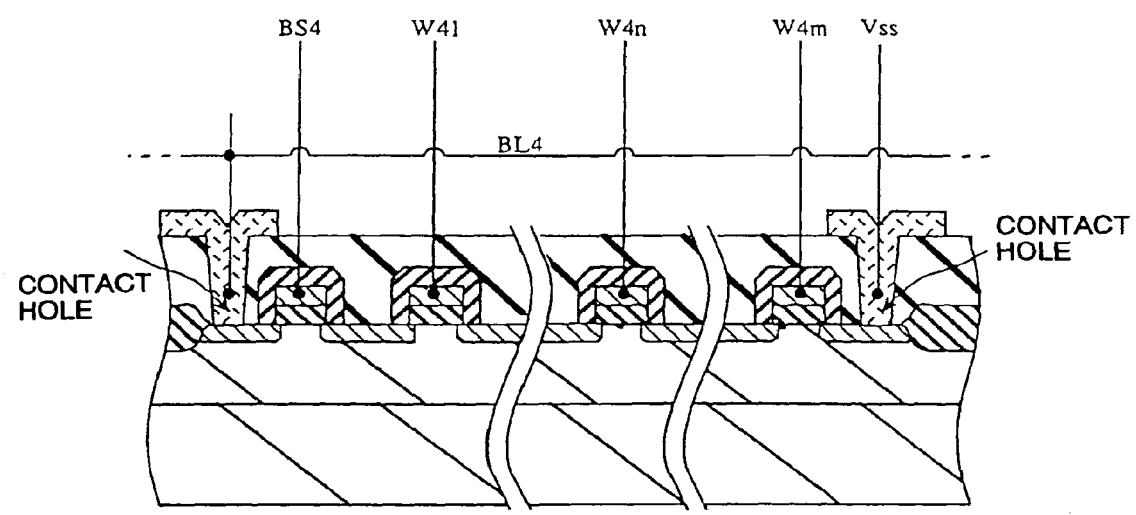
FIG. 42 illustrates a partial cross-section of the mask ROM of FIG. 40.

FIG. 42 illustrates a cross-section of main part of the memory cell of FIG. 41. Like elements have the same reference characters.

While the principles of the invention are applicable to several types of mask-ROMs as discussed above, it will be readily seen by experts that the current leakage reduction effect of the invention will be maximized when applied to NOR type memory devices which inherently tend to experience an increased amount of leakage current due to their structure in which input nodes are increased in number resulting from use of a great number of parallel arrays of MOS transistors therein.

Figure 43:
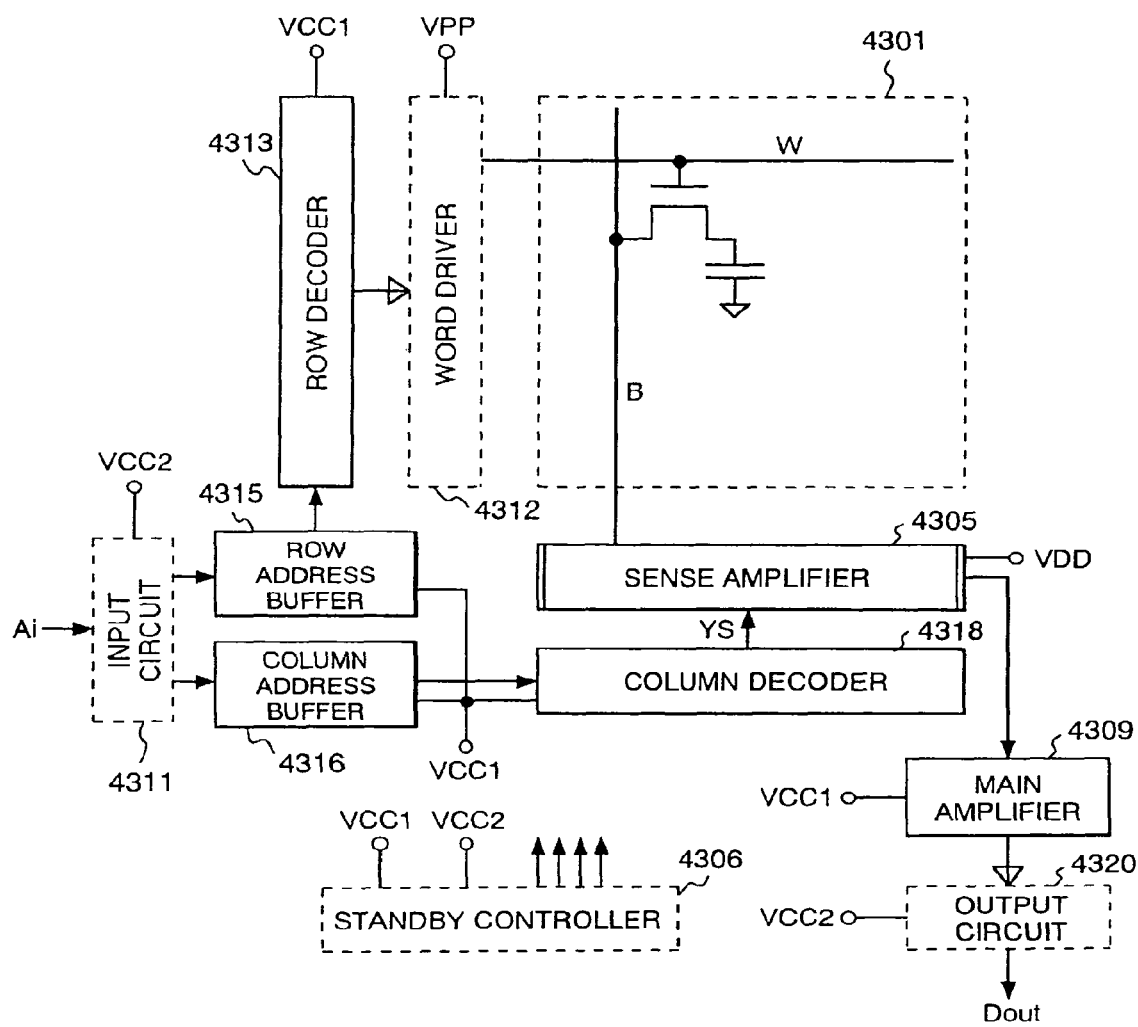
FIG. 43 depicts a circuit configuration of a DRAM embodying the invention.

A DRAM device also embodying the invention is shown in FIG. 43. This DRAM includes an I/O circuit 4311, standby controller 4306 and word driver 4312, most portions of which are formed of thick-film MOS transistors and which are designed to operate with power supply voltages. Vcc2, Vpp that are higher than Vcc1. A respective one of transistors within a memory array 4301 employs a thick-film MOS transistor in order to prevent electrical charge from leaking out of an associated data storage capacitor. For drive of memory-cell thick-film transistors, word lines W are arranged to carry and handle large amplitude voltage signals. In this case, for purposes of elimination of current leakage from capacitors otherwise occurrable in prior known DRAMs, it is recommendable that memory cell transistors be of high threshold voltage. Decoders 4313, 4318 and address buffers 4315-4316 handling small amplitude signals are formed of thin-film MOS transistors for drive by the low voltage Vcc1, supra. A sense amplifier 4305 consists of a combination of thick-film and thin-film MOS transistors.

Input circuit 4311 receives at its input an address signal Ai which is as great as Vcc2 in amplitude. This input signal is level-converted into a small Vcc1 amplitude signal, which is then passed to address buffers 4315-4316 and decoders 4313, 4318. In view of this, the input circuit preferably employs thick-film MOS transistors at its certain part in the prestage of such level conversion to Vcc1. For the same reason an output circuit 4320 employs thick-film MOS transistors. The DRAM shown is similar to the previous embodiments in that thick-film MOS transistors are for use in controlling the power supply(ies) as fed to the thin-film MOS transistors in address buffers 4315-4316 and decoders 4313, 4318. Although not visible in FIG. 43, row decoder 4313 contains therein a level converter for converting the Vcc1 amplitude signal into an amplitude-increased signal (Vpp) which is then supplied to word driver 4321.

In this embodiment the voltage Vcc2 is set at 3.3 volts; Vcc1 is 1.8 volts; Vpp is 3.6 volts; and, VDD is 1.5 volts. These voltages may be externally given or alternatively be internally prepared using an on-chip voltage converter.

Figure 44:
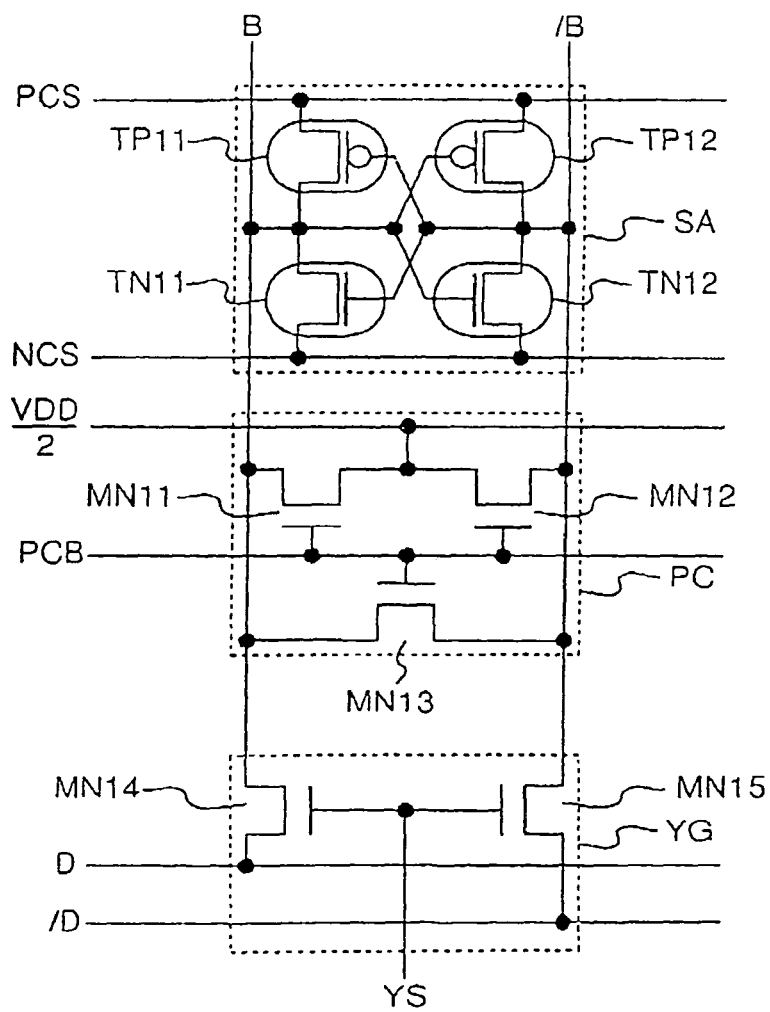
FIG. 44 is a circuit diagram of a sense amplifier as employed in the DRAM in FIG. 43.

FIG. 44 depicts an inside configuration of the sense amplifier 4305 of FIG. 43. This sense amplifier includes a pair of parallel bit lines B, /B, which are precharged at VDD1/2 by a precharge circuit PC during standby periods. Sense-amplifier drive lines NCS, PCS are at VDD1/2 level. Accordingly, the sources, drains and gates of transistors TP11, TP12, TN11 and TN12 constituting one sense amplifier unit SA are all at the same potential level so that neither subthreshold leakage current nor tunnel leakage current flows therein. Thus, these are formed of thin-film MOS transistors enabling sense operations to increase in speed.

A precharge signal PCB is at high potential (>VDD1/2) during standby. Hence, transistors MN11-MN13 constituting the precharge circuit are specific MOS transistors each having a thick gate insulation film eliminating tunnel current leakage. These are not required to be of the high threshold value since the source and drain of each transistor is kept identical in potential.

Transistors MN14-M15 forming an I/O gate YG are also thick-film MOS transistors. This is in view of the fact that these transistors receive at their gates an output YS of an associative column decoder and are set at ground potential during standby periods.

Figure 45:
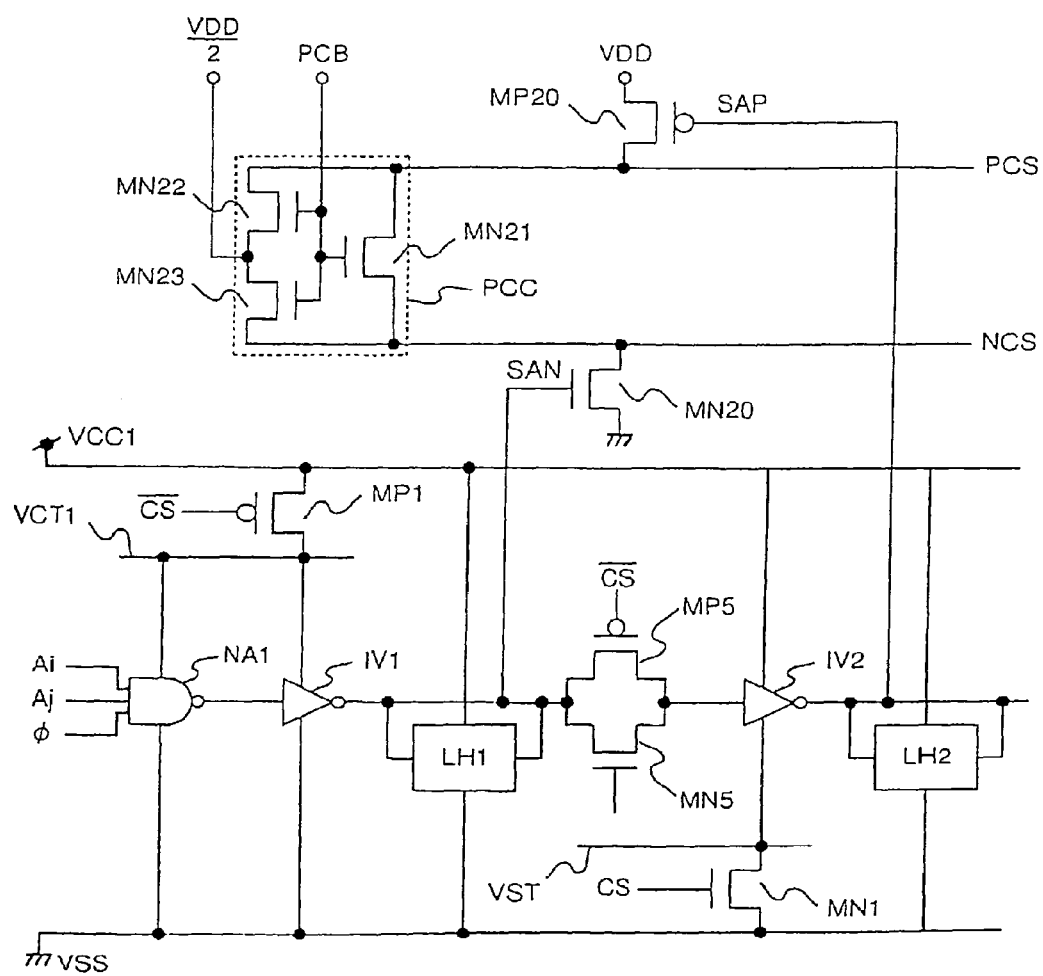
FIG. 45 shows a circuit configuration of a sense-amplifier drive signal generator circuit as used in the FIG. 43 DRAM.

FIG. 45 shows a detailed configuration of the sense amplifier circuit 4305. Input signals thereto involve address signals Ai, Aj and a timing signal o. In currently available standard memory devices, since the memory array is subdivided into portions called the "subarrays," certain address signal (normally, several upper bits of those of a row address signal used) is required to render operative only sense amplifier units associated with a selected subarray. NAND gate NA1 and inverters IV1-IV2 employ thin-film MOS transistors. During standby, the Ai, Aj, φ signals are at "L" level and signal SAN is also at "L" while SAP is at "H"; accordingly, switches are inserted between the Vcc1 line and the power supply nodes of NAND gate NA1 and inverter IV2 as well as between the ground node of inverter IV2 and ground, for selective interruption of power feed during standby in order to eliminate tunnel current leakage. Level hold circuits LH1, LH2 are provided for maintaining the potential levels of signals SAN, SAP.

Precharge circuits NCS, PCS employ thick-film MOS transistors. Drive transistors MN20, MP20 make use of thick-film MOS transistors. This is to prevent flow of leakage current between the sources, drains and gates of these transistors which are at different potential levels during standby.

Figure 46:
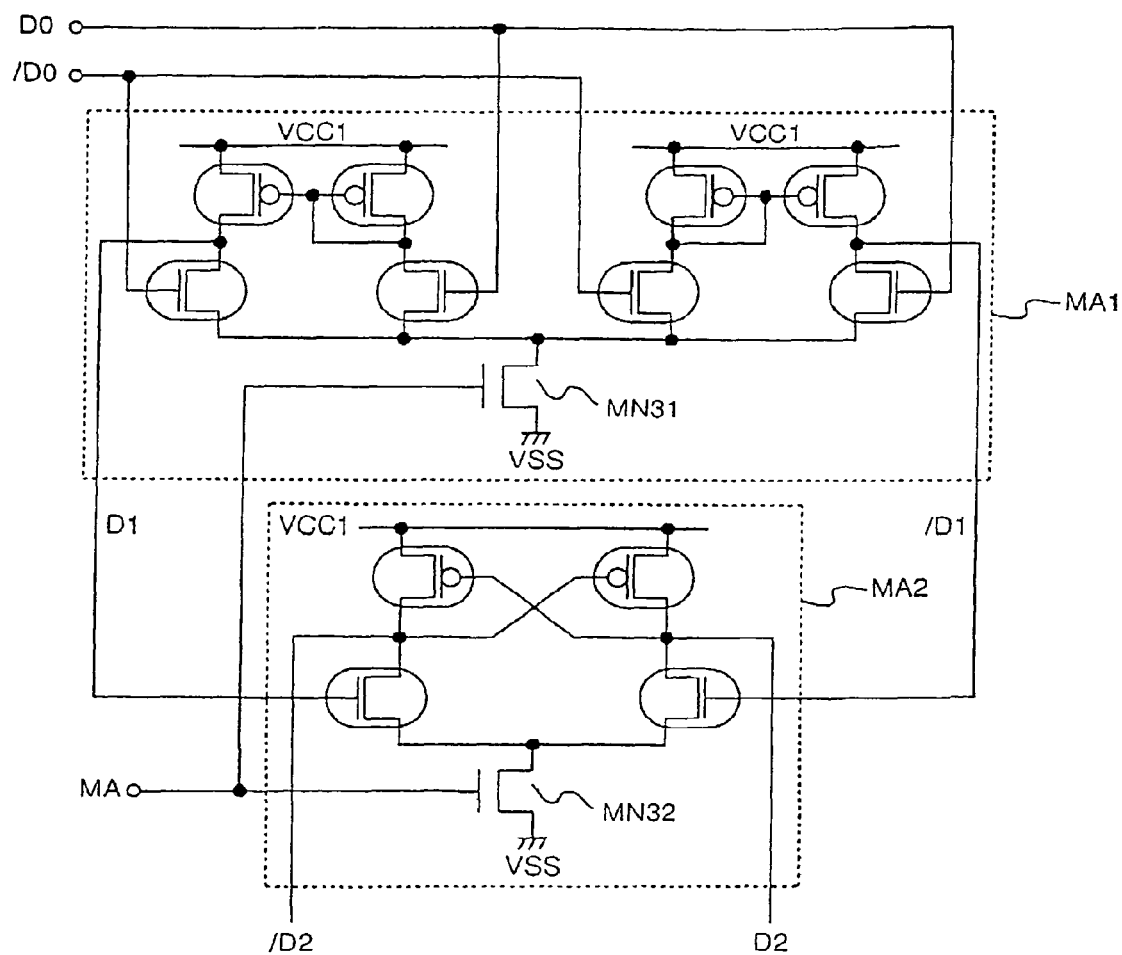
FIG. 46 shows a circuit configuration of a main amplifier used in the FIG. 43 DRAM

FIG. 46 shows one exemplary configuration of the main amplifier 4309 of FIG. 43. As shown, this main amplifier consists of a combination of two differential amplifier stages MA1, MA2, which employ thin-film MOS transistors to weed up amplification operation. This is in light of the fact that no current leakage can occur because a precharge circuit (not shown) forces amplifier input signals D0, /D0 and first stage output signals D1, /D1 moreover second stage output signals D2, /D2 to be kept at "H" level during standby periods.

On the contrary, activation transistors MN31-32 are formed of thick-film MOS transistors preventing current from leaking into a node coupled to voltage VSS.

Figure 47:
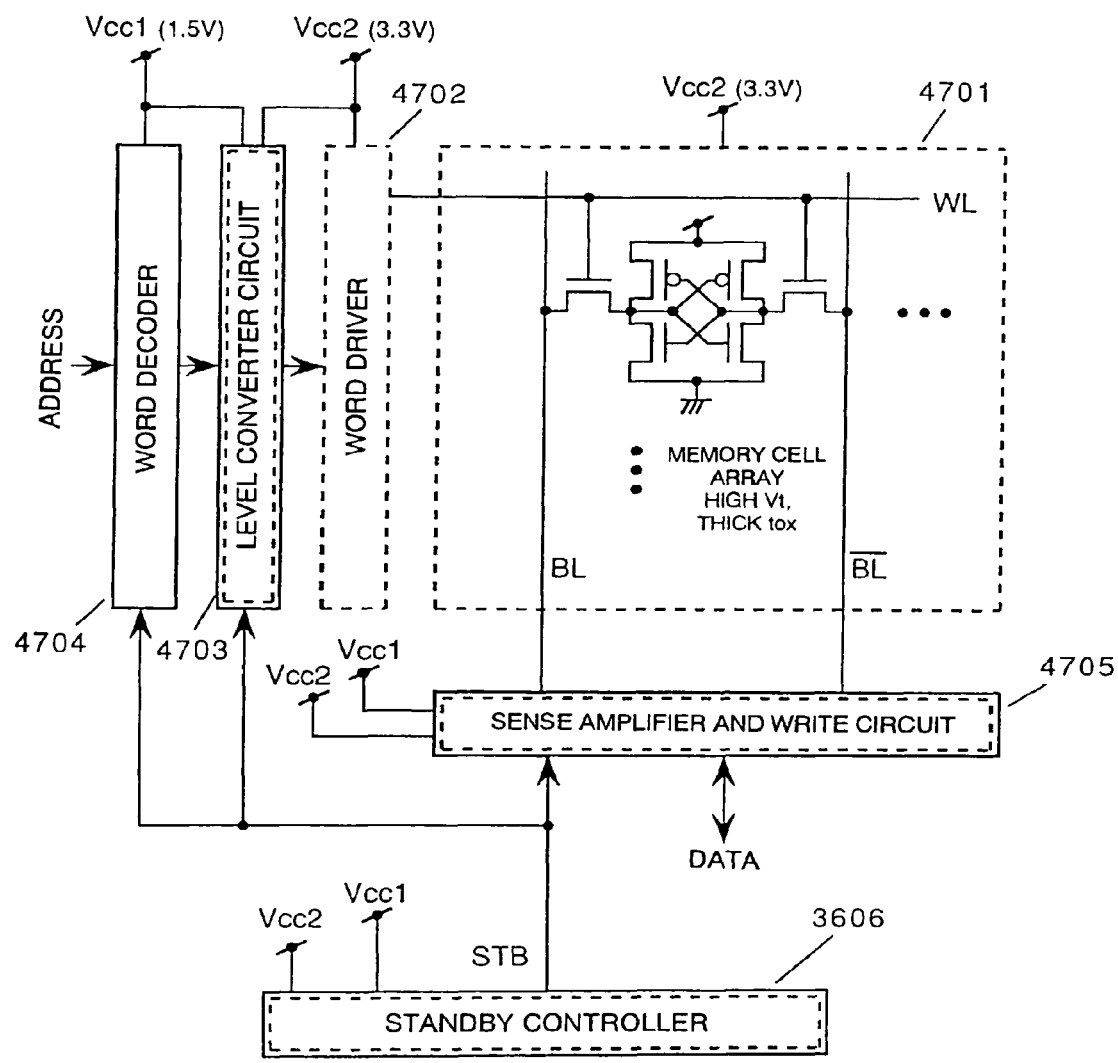
FIG. 47 is a circuit diagram of an SRAM embodying the invention.

A SRAM further embodying the invention is shown in FIG. 47. The SRAM shown is similar in circuit configuration to the ROM and DRAM devices as discussed previously except that the structure of its memory array 4701 is distinguishable thereover. Memory array 4701 basically employs therein flip-flop circuits which are formed of thick-film MOS transistors.

Of those transistors constituting memory array 4701, at least data transfer transistors (also called the "access transistors") are to be formed of thick-film transistors because of the fact that if otherwise these were formed of thin-film transistors then unwanted leakage current could flow via associated word lines into bit lines, where a maximal amount of such leakage current may be defined by the number of cells coupled to one bit line multiplied by gate leakage current per cell, thereby causing flow of leakage currents adversely behaving to induce noise mixture on bit lines resulting in a decrease in S/N ratio. Gate leakage current of the remaining transistors other than such transfer transistors is devoted to an increase in power dissipation only; therefore, unless power dissipation is so important, these may be thin-film MOS transistors. The greater the number of memory cells connected to one bit line, i.e. the data storage capacity of memory, the greater the significance of the advantages of this invention.

The same goes with the transfer-transistor threshold value also. If the transfer transistors were less in threshold magnitude then undesired leakage current could flow into bit lines, where a maximal amount of such leakage current may be given by the number of cells coupled to one bit line multiplied by source-to-drain subthreshold leakage current of transfer transistor per cell. This adversely serves to induce noises on bit lines causing S/N ratio to decrease. To eliminate this, the transfer transistors are increased in threshold value. This is attainable by adequate adjustment of an amount of impurity as implanted into the channels of such transfer transistors; or alternatively, the same may be attained by designing them so that the gate length is somewhat increased.

Figure 48:
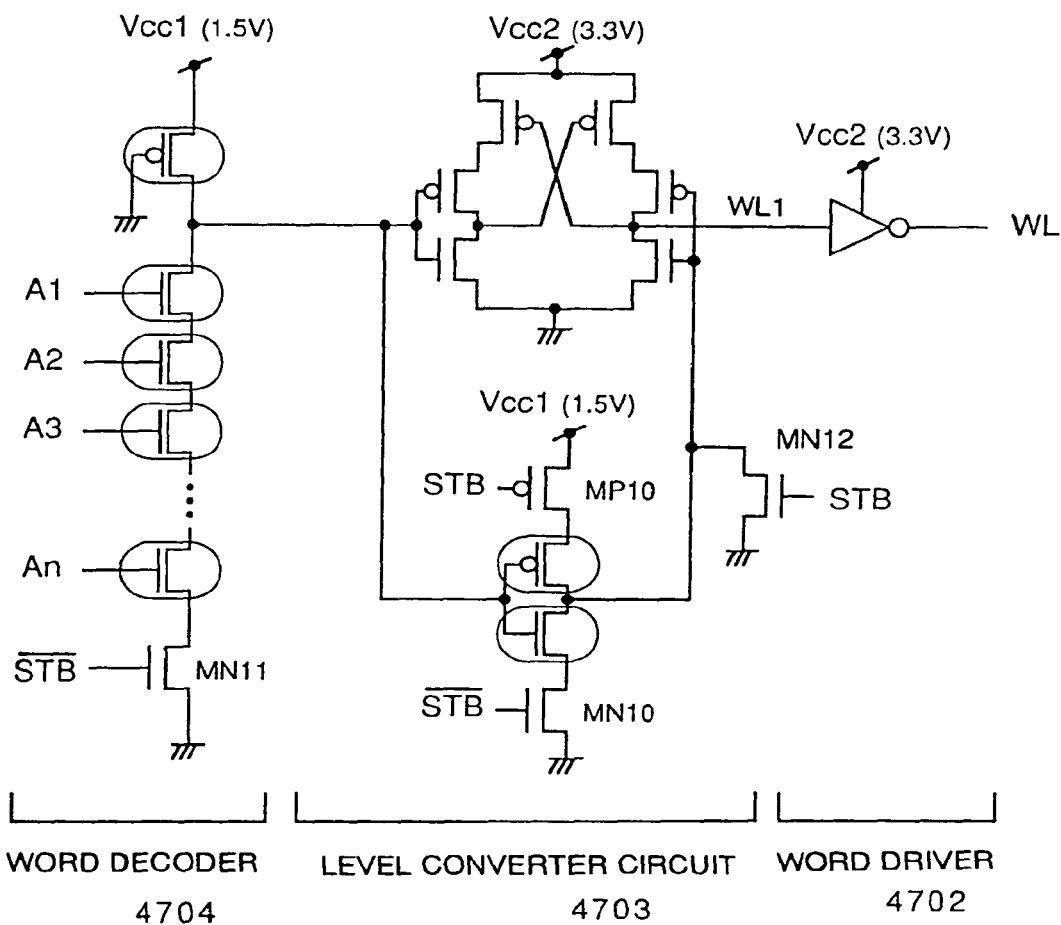
FIG. 48 is a circuit diagram showing a word decoder, word driver, and level converter as employed in the device of FIG. 47.

FIG. 48 shows an exemplary configuration of the word decoder 4704, word driver 4702 and level converter 4703. Word decoder 4704 receives at its input small-amplitude signals, and thus is formed of thick-film MOS transistors while further including a thick-film MOS transistor MN11 for interruption of gate leakage current during standby. Word lines including one WL of FIG. 48 are driven with large amplitude signals so that word driver 4702 is designed to operate with the power supply voltage Vcc2 with a level converter 4703 being inserted between word decoder 4704 and driver 4702. Level converter 4703 is for potential level conversion from a small-amplitude to a large-amplitude signal, and thus employs thick-film transistors at its main part. This is generally similar to that discussed previously in connection with FIG. 33.

The standby control signal STB goes high during standby periods rendering power supply Vcc1 off. Thick-film MOS transistor MN12 forces an output WL2 of level converter 4703 to go high (at 3.3 volts) causing word line WL to be potentially held at "L" level (zero volts). This may prevent current from leaking into a bit line(s) out of a memory cell(s) during standby.

The word decoder 4704, word driver 4702 and level converter 4703 may be basically similar in configuration to those used in the SRAM and DRAM devices stated supra.

Figure 49:
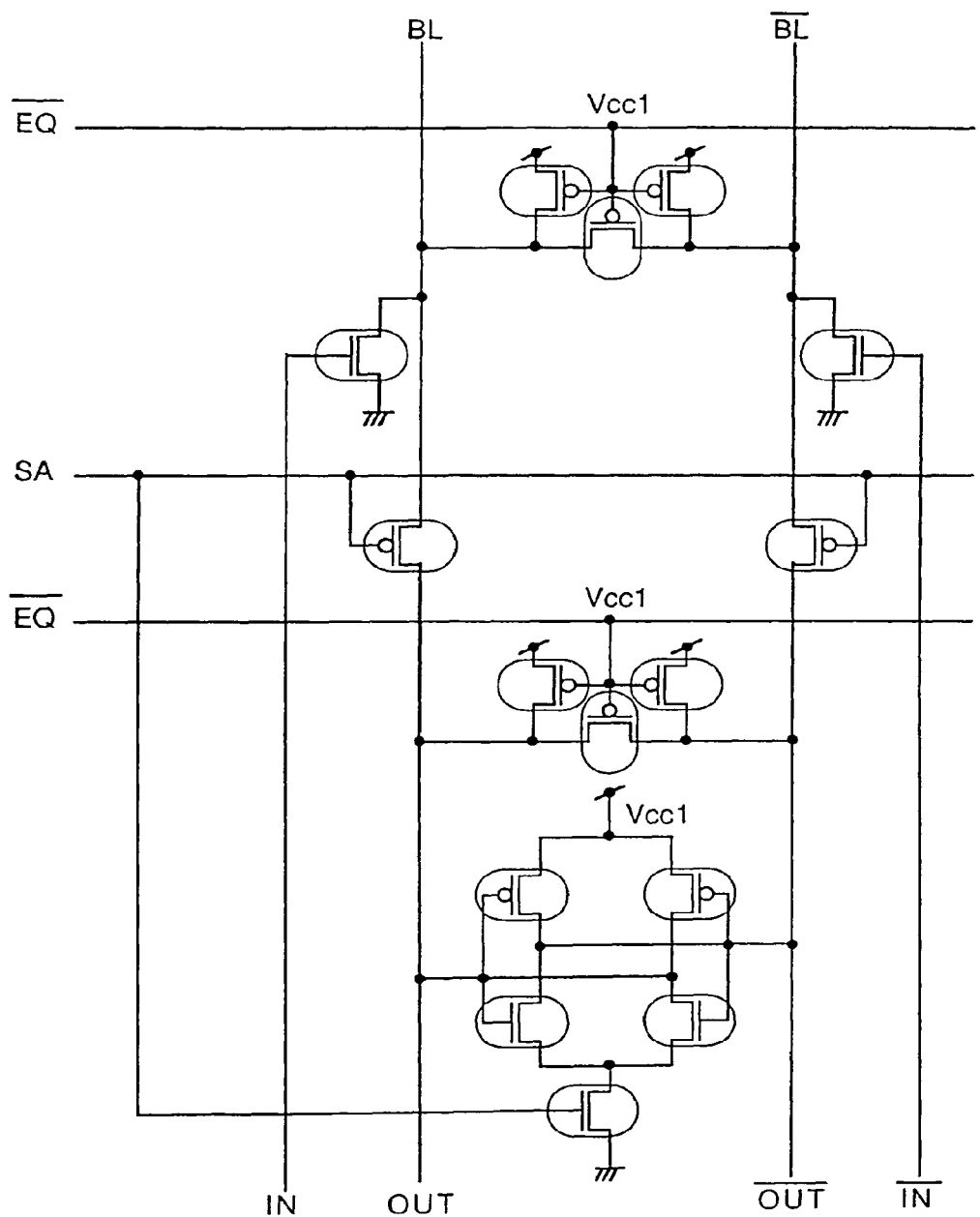
FIG. 49 is a circuit diagram showing a sense amplifier and its associative write circuit used in the FIG. 47 device.
Figure 50A:
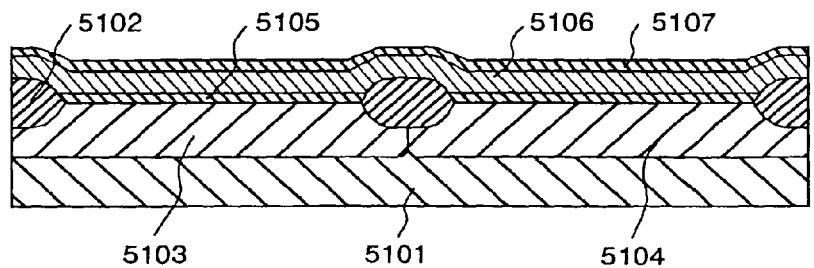
FIG. 50 illustrates, in enlarged cross-section, major steps of the fabrication of an n-type MOS transistor structure embodying the invention.
Figure 50B:
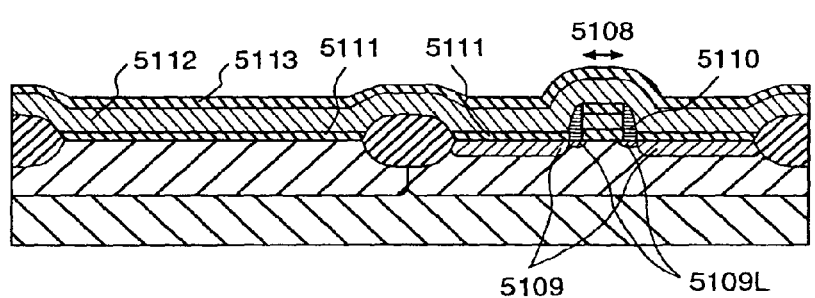
Figure 50C:
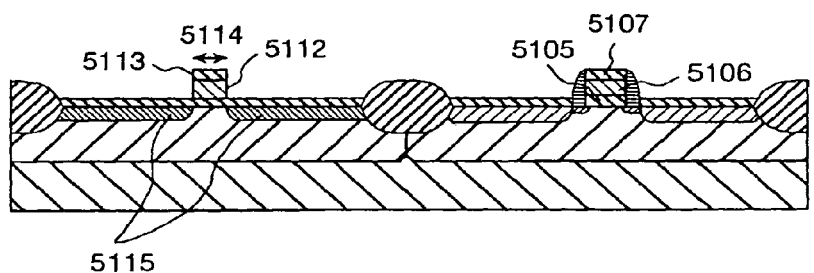
Figure 50D:
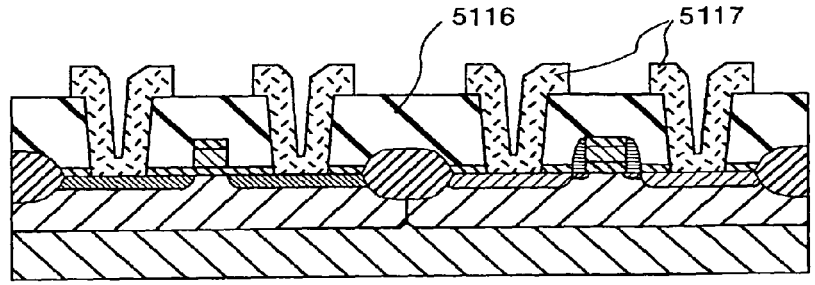

FIG. 49 shows a detailed configuration for practical use of a sense amplifier/write circuit 4705 of FIG. 43. The bit-line potential does not affect data storage so that power supply Vcc1 may be off during standby. This sense amplifier/write circuit employs thin-film MOS transistors.

INDUSTRIAL USEABILITY

With the foregoing semiconductor integrated circuit devices in accordance with the present invention, significant practical advantages are attainable with regard to the fact that it is possible to reduce power dissipation during standby periods without having to slow the circuit operation.

The invention claimed is:

1. A semiconductor integrated circuit device comprising a first MOS transistor, and a second MOS transistor having a thickness of a gate insulative film is greater than a thickness of a gate insulation film of said first MOS transistor, wherein said first MOS transistor is for use with a logic circuit required to exhibit enhanced switching speed whereas said second transistor is for use with a circuit less in switching speed than said logic circuit while allowing a power supply of said first MOS transistor to be controlled independently of a power supply of said second MOS transistor.

2. A semiconductor integrated circuit device comprising a first MOS transistor having a first gate electrode, a first electrode and a second electrode, and a second MOS transistor with a second gate elect rode, a third electrode and a fourth electrode, wherein said first electrode is connected to a first potential, said second electrode is connected to said third electrode, and said fourth electrode is connected to a second potential, and wherein said first MOS transistor is less in gate insulation film thickness than said second MOS transistor.

3. The semiconductor integrated circuit device according to claim 1, wherein said first MOS transistor is less in gate length than said second MOS transistor.

4. The semiconductor integrated circuit device according to claim 1, wherein said first MOS transistor is less in gate voltage than said second MOS transistor.

5. A semiconductor integrated circuit device comprising,
a first MOS transistor;
a second MOS transistor having the same conductivity type with the first MOS transistor and providing a gate insulation film thickness being thicker than the first MOS transistor and a drain connected to the first MOS transistor; and
a power supply line connected to a source of the second MOS transistor,
wherein a control signal having a first state for allowing the second MOS transistor to be on-state and a second state for allowing the second MOS transistor to be off-state is applied to a gate of the second MOS transistor.

6. The semiconductor intergraded circuit device according to claim 5,
wherein a gate insulation film thickness of the first MOS transistor is 3.5 nm or less.

7. The semiconductor integrated circuit device according to claim 6,
wherein a gate insulation film thickness of the second MOS transistor is 5.0 nm or more.

8. The semiconductor integrated circuit device according to claim 7,
wherein a gate insulation film thickness of the second MOS transistor is 10.0 nm or more.

9. The semiconductor integrated circuit device according to claim 6,
wherein a gate length of the second MOS transistor is longer than that of the first MOS transistor.

10. The semiconductor integrated circuit device according to claims 6, further comprising:
a third MOS transistor having a drain connected to a drain of the first MOS transistor and a gate insulation film thickness being thinner that the second MOS transistor; and
another power supply line connected to a source of the third MOS transistor, wherein the first and the second MOS transistors provide N-channel type, respectively; and
the third MOS transistor has a different conductivity type with the first and the second MOS transistors.

11. The semiconductor integrated circuit device according to claim 10,
wherein gates of the first and the third MOS transistors are short-circuited.

12. The semiconductor integrated circuit device according to claim 6,
wherein a gate insulation film thickness of the first MOS transistor is 3.0 nm or less.

13. The semiconductor integrated circuit device according to claim 12,
wherein a gate insulation film thickness of the first MOS transistor is 2.0 nm or less.

14. The semiconductor integrated circuit device according to claim 5,
wherein a gate insulation film thickness of the second MOS transistor is 5.0 nm or more.

15. The semiconductor integrated circuit device according to claim 14,
wherein a gate insulation film thickness of the second MOS transistor is 10.0 nm or more.

16. The semiconductor integrated circuit device according to claim 5,
wherein a length of the second MOS transistor is longer than that of the first MOS transistor.

17. The semiconductor integrated circuit device according to claim 5, further comprising:
a third MOS transistor having a drain connected to a drain of the first MOS transistor and a gate insulation film thickness being thinner than the second MOS transistor;
another power supply line connected to a source of the third MOS transistor, wherein the first and the second MOS transistor provide N-channel type, respectively; and
a third MOS transistor has a different conductivity type with the first and the second MOS transistors.

18. The semiconductor integrated circuit device according to claim 5,
wherein gates of the first and the third MOS transistor are short-circuited.

19. The semiconductor integrated circuit device according to claim 5,
wherein an amplitude of voltage applied to the gate of the first MOS transistor is smaller than that of voltage applied to the gate of the second MOS transistor.

20. A semiconductor integrated circuit device comprising:
a first MOS transistor;
a second MOS transistor having the same conductivity type with the first MOS transistor and a drain connected to a source of the first MOS transistor;
a power supply line connected to the source of the second MOS transistor, wherein a control signal having a first state for allowing the second MOS transistor to be on-state and a second state for allowing the second MOS transistor to be off-sate is applied to the gate of second MOS transistor; and
a tunnel current generated between the gate and the source of the first MOS transistor is smaller than a tunnel current generated between the gate and the source of the first MOS transistor when a voltage difference between the respective sources of the first and the second MOS transistors is identical.

* * * * *